(12) United States Patent
Kanzawa et al.

(10) Patent No.: US 8,338,816 B2
(45) Date of Patent: Dec. 25, 2012

(54) NONVOLATILE MEMORY ELEMENT, AND NONVOLATILE SEMICONDUCTOR DEVICE USING THE NONVOLATILE MEMORY ELEMENT

(75) Inventors: Yoshihiko Kanzawa, Osaka (JP); Shunsaku Muraoka, Osaka (JP); Satoru Mitani, Osaka (JP); Zhiqiang Wei, Osaka (JP); Takeshi Takagi, Kyoto (JP)

(73) Assignee: Panasonic Corporation, Osaka (JP)

( * ) Notice: Subject to any disclaimer, the term of this patent is extended or adjusted under 35 U.S.C. 154(b) by 326 days.

(21) Appl. No.: 12/682,676

(22) PCT Filed: Mar. 31, 2008

(86) PCT No.: PCT/JP2008/000827
§ 371 (c)(1),
(2), (4) Date: Apr. 12, 2010

(87) PCT Pub. No.: WO2009/050833
PCT Pub. Date: Apr. 23, 2009

(65) Prior Publication Data
US 2010/0207094 A1    Aug. 19, 2010

(30) Foreign Application Priority Data
Oct. 15, 2007    (JP) .................. 2007-267583

(51) Int. Cl.
*H01L 47/00* (2006.01)
*H01L 29/02* (2006.01)
*H01L 29/66* (2006.01)

(52) U.S. Cl. .............. 257/4; 257/2; 257/5; 257/529; 257/E27.002; 257/E29.002; 438/85; 438/104; 438/900; 365/148

(58) Field of Classification Search ............... 257/4, 5, 257/2, 529, E27.002, E29.002; 438/85, 104, 438/900; 365/148
See application file for complete search history.

(56) References Cited

U.S. PATENT DOCUMENTS

| 6,473,332 | B1 | 10/2002 | Ignatiev et al. |
| 6,815,744 | B1 | 11/2004 | Beck et al. |
| 2004/0114444 | A1* | 6/2004 | Matsuoka ............ 365/200 |
| 2004/0235247 | A1 | 11/2004 | Hsu et al. |
| 2004/0245557 | A1 | 12/2004 | Seo et al. |

(Continued)

FOREIGN PATENT DOCUMENTS
JP    2002-537627    11/2002
(Continued)

OTHER PUBLICATIONS

I. G. Baek., et al., "Highly Scalable Non-volatile Resistive Memory using Simple Binary Oxide Driven by Asymmetric Unipolar Voltage Pulses", Tech Digest IEDM, 2004, p. 587, IEEE.

(Continued)

*Primary Examiner* — Long Tran
(74) *Attorney, Agent, or Firm* — McDermott Will & Emery LLP

(57) ABSTRACT

A nonvolatile memory element of the present invention comprises a first electrode (503); a second electrode (505); and a resistance variable layer (504) which is disposed between the first electrode (503) and the second electrode (505), a resistance value of the resistance variable layer being changeable in response to electric signals which are applied between the first electrode (503) and the second electrode (505), wherein the first electrode and the second electrode comprise materials which are made of different elements.

33 Claims, 34 Drawing Sheets

U.S. PATENT DOCUMENTS

| | | |
|---|---|---|
| 2005/0247921 A1 | 11/2005 | Lee et al. |
| 2006/0097288 A1 | 5/2006 | Baek et al. |
| 2006/0126423 A1 | 6/2006 | Aratani et al. |
| 2006/0273429 A1 | 12/2006 | Sakamoto et al. |
| 2007/0200158 A1* | 8/2007 | Genrikh et al. ............... 257/306 |
| 2008/0083918 A1 | 4/2008 | Aratani et al. |
| 2008/0117664 A1 | 5/2008 | Kinoshita et al. |
| 2008/0212359 A1 | 9/2008 | Muraoka et al. |
| 2008/0239787 A1* | 10/2008 | Herner ........................ 365/148 |
| 2009/0067215 A1 | 3/2009 | Muraoka et al. |
| 2009/0097300 A1 | 4/2009 | Ishihara et al. |
| 2009/0224224 A1 | 9/2009 | Fujii et al. |
| 2010/0133501 A1 | 6/2010 | Sakamoto et al. |

FOREIGN PATENT DOCUMENTS

| | | |
|---|---|---|
| JP | 2004-349689 | 12/2004 |
| JP | 2004-353604 | 12/2004 |
| JP | 2005-317976 | 11/2005 |
| JP | 2006-40946 | 2/2006 |
| JP | 2006-140464 | 6/2006 |
| JP | 2006-324447 | 11/2006 |
| JP | 2007-88349 | 4/2007 |
| JP | 2007-180202 | 7/2007 |
| JP | 2007-193878 A | 8/2007 |
| WO | WO 2006/077747 A1 | 7/2006 |
| WO | WO 2006/115208 A1 | 11/2006 |
| WO | WO 2007/013174 A1 | 2/2007 |
| WO | WO 2007/114099 A1 | 10/2007 |
| WO | WO 2007/138646 A1 | 12/2007 |
| WO | WO 2008/059701 A1 | 5/2008 |

OTHER PUBLICATIONS

Masayuki Fujimoto., et al., "High-Speed Resistive Switching of TiO2 / TiN Nano-Crystalline Thin Film", Japanese Journal of Applied Physics, 2006, vol. 45, No. 11, pp. L310-L312, The Japan Society of Applied Physics.

An Chen., et al., "Non-Volatile Resistive Switching for Advanced Memory Applications", Tech. Digest IEDM, 2005, p. 746, IEEE.

Extended European Search Report issued in European Application No. 08720693.4 issued on May 31, 2012.

* cited by examiner (a)

(b)

(a)

(b)

NONVOLATILE MEMORY ELEMENT, AND NONVOLATILE SEMICONDUCTOR DEVICE USING THE NONVOLATILE MEMORY ELEMENT

RELATED APPLICATIONS

This application is the U.S. National Phase under 35 U.S.C. §371 of International Application No. PCT/JP2008/000827, filed on Mar. 31, 2008, which in turn claims the benefit of Japanese Application No. 2007-267583, filed on Oct. 15, 2007, the disclosures of which Applications are incorporated by reference herein.

TECHNICAL FIELD

The present invention relates to a nonvolatile memory element. Particularly, the present invention relates to a resistance variable nonvolatile memory element which changes a resistance value in response to electric signals applied thereto, and a nonvolatile semiconductor device using the nonvolatile memory element.

BACKGROUND ART

With recent advancement of digital technologies, electronic hardware such as portable information devices and home information appliances have been developed to provide higher functionality. For this reason, there have been increasing demands for an increase in a capacity of nonvolatile memory elements, reduction in a write electric power in the memory elements, reduction in write/read time in the memory elements, and longer life of the memory elements.

Under the circumstances in which there are such demands, it is said that there is a limitation on miniaturization of the existing flash memory using a floating gate. Accordingly, in recent years, a novel resistance variable nonvolatile memory element using a resistance variable layer as a material of a memory section has attracted an attention.

The resistance variable nonvolatile memory element basically has a very simple structure in which a resistance variable layer is sandwiched between a lower electrode and an upper electrode. Upon application of a predetermined electric pulse having a voltage of a magnitude which is not smaller than a threshold between the upper and lower electrodes, the nonvolatile memory element switches to a high-resistance state or to a low-resistance state. By corresponding these different resistance states to numeric values, respectively, data is stored. Because of such a simple structure and operation, it is expected that the resistance variable nonvolatile memory element has a potential to achieve further miniaturization and cost reduction. Furthermore, Since switching to the high-resistance state or to the low-resistance state sometimes occurs in an order of 100 ns or less, the resistance variable nonvolatile memory element has attracted an attention for achievement of a high-speed operation, and a variety of proposals have been proposed.

For example, Patent document 1 discloses a resistance variable nonvolatile memory element in which metal ions are caused to travel into and out of a resistance variable layer 3302 to produce a high-resistance state and a low-resistance state by applying voltages between an upper electrode and a lower electrode, thereby storing data. Also, as disclosed in Patent document 2, there is known a resistance variable memory in which crystalline states of a resistance variable layer are changed using electric pulses to switch its resistance states.

In addition to the above, there are numerous proposals for resistance variable nonvolatile memory elements using metal oxides for the resistance variable layer 3302.

The resistance variable nonvolatile memory elements using the metal oxides are classified into two major kinds depending on the material used for the resistance variable layer. Patent document 3 or the like disclose one kind of resistance variable nonvolatile memory element using perovskite materials (Pr$_{(1-x)}$ CaXMnO$_3$ (PCMO), LaSrMnO$_3$ (LSMO), GdBaCo$_x$O$_y$ (GBCO), etc.) as the resistance variable layer.

The other kind is resistance variable nonvolatile memory elements using binary transition metal oxides. Since the binary transition metal oxides have a very simple composition as compared to the above illustrated perovskite materials, composition control and layer deposition in manufacturing are relatively easy. In addition, the binary transition metal oxides have an advantage that they are relatively highly compatible with a semiconductor manufacturing process. For these reasons, the binary transition metal oxides have been recently vigorously developed. For example, Patent document 4 discloses NiO, V$_2$O$_5$, ZnO, Nb$_2$O$_5$, TiO$_2$, WO$_3$, and CoO as the resistance variable materials. Patent document 5 or Non-patent documents 1 to 3 disclose resistance variable memory elements using transition metal oxides such as Ni, Nb, Ti, Zr, Hf, Co, Fe, Cu, Cr, etc., especially resistance variable element using as resistance variable materials, oxides which are oxygen-deficient in stoichiometric composition (hereinafter referred to as oxygen-deficient oxides).

The oxygen-deficient oxide will be described in more detail. For example, in the case of Ni, NiO is known as an oxide having a stoichiometric composition. NiO contains O atoms and Ni atoms which are equal in number and is represented by 50 at % in terms of oxygen content. The oxide having lower oxygen content than the oxygen content 50 at % is called an oxygen-deficient oxide. In this example, the oxide is a Ni oxide and therefore may be expressed as an oxygen-deficient Ni oxide.

Patent document 6 or Non-patent document 2 disclose examples in which a structure formed by oxidating a surface of titanium nitride to form a crystalline titanium oxide (TiO$_2$) film of a nanometer order is used as the resistance variable layer.

Regarding how the resistance changing phenomenon occurs, the nonvolatile memory elements using the above metal oxides are categorized into two kinds. One kind is a unipolar nonvolatile memory element which changes its resistance in response to electric pulses which are the same in polarity and different in voltage magnitude (e.g., the resistance value is increased or decreased by applying voltages of +1V and +2V). The nonvolatile memory elements disclosed in patent document 4 or 5 are the unipolar nonvolatile elements. The other kind is a bipolar nonvolatile memory element which is controlled to change its resistance in response to electric pulses having voltages with different polarities (e.g., the resistance value is increased or decreased by applying voltages of +1V and −1V). The nonvolatile memory element which performs such resistance changing phenomenon is disclosed in patent document 3 or 6.

Patent document 5 discloses, as the materials of the upper and lower electrodes sandwiching the resistance variable layer, for example, iridium (Ir), platinum (Pt), ruthenium (Ru), tungsten (W), oxides of Ir and Ru, nitride of titanium (Ti), polysilicon, etc. Patent document 6 discloses nonvolatile memory elements using as electrode materials, Pt, Ir, osmium (Os), Ru, rhodium (Rh), palladium (Pd), Ti, cobalt (Co), W, etc.

Patent document 7 discloses nickel (Ni), silver (Ag), gold (Au), Pt. Patent document 8 discloses Pt, Ir, Ru, Ir oxide and Ru oxide.

Patent document 1: Japanese Laid-Open Patent Application Publication No. 2006-40946

Patent document 2: Japanese Laid-Open Patent Application Publication No. 2004-349689

Patent document 3: U.S. Pat. No. 6,473,332

Patent document 4: Japanese Laid-Open Patent Application Publication No. 2004-363604

Patent document 5: Japanese Laid-Open Patent Application Publication No. 2005-317976

Patent document 6: Japanese Laid-Open Patent Application Publication No. 2007-180202

Patent document 7: Japanese Laid-Open Patent Application Publication No. 2007-88349

Patent document 8: Japanese Laid-Open Patent Application Publication No. 2006-324447

Non-patent document 1: I. G. Beak et al., Tech. Digest IEDM 2004, page 587

Non-patent document 2: M, Fujimoto et al., Japanese Journal of Applied Physics Vol. 45 2006, L310-L312 page Non-patent document 3: A. Chen et al. Tech. Digest IEDM 2005, page 746

DISCLOSURE OF THE INVENTION

Problems to be Solved by the Invention

The present inventors paid an attention to a resistance variable element using an oxygen-deficient oxide as a resistance variable material because it is relatively easy to control a composition and form a film in manufacturing. However, a mechanism of a resistance changing phenomenon of such a resistance variable element is not made clear yet and its resistance changing phenomenon is unstable.

The present invention has been made to solve the above described problem, and an object of the present invention is to provide a nonvolatile memory element making use of a resistance changing phenomenon which has a reversible and stable rewrite characteristic.

Means for Solving the Problem

The present inventors studied intensively to solve the above described problems. In this study, the present inventors repeated trial and error because of unclarity of the mechanism of the resistance changing phenomenon. As a result, the present inventors discovered the findings explained below and conceived the present invention based on the findings.

Firstly, the present inventors manufactured nonvolatile memory elements without considering a suitable combination of materials used for upper and lower electrodes and researched their electric characteristics. Manufactured was an element having a basic structure as shown in FIG. 40. The nonvolatile memory element had a vertically symmetric structure in which a resistance variable layer 3302 made of an oxygen-deficient Ta oxide was sandwiched between a lower electrode 3301 made of Pt and an upper electrode 3303 made of Pt. Note that the oxygen-deficient Ta oxide of the resistance variable element 3302 is a novel resistance variable material. The oxygen content of the oxygen-deficient Ta oxide was set to 58 at % (x is 1.38 when the oxygen-deficient Ta oxide is expressed as $TaO_x$). Hereinafter, this nonvolatile memory element is referred to as an element A.

FIG. 1 shows resistance changing phenomenon occurring when the electric pulses were applied to the element A. In FIGS. 1(a) and 1(b), a horizontal axis indicates the number of electric pulses applied between the lower electrode 3301 and the upper electrode 3303 and a vertical axis indicates a resistance value.

FIG. 1(a) shows resistance measurement result obtained by applying electric pulses between the lower electrode 3301 and the upper electrode 3303 such that electric pulses having voltages of +3.0V and −1.5V and a pulse width of 100 ns were applied such that the voltage of +3.0V and the voltage of −1.5V are applied alternately to the upper electrode 3303 on the basis of the lower electrode 3301. In this case, the resistance value changed to about 800~1000Ω by applying the electric pulse of the voltage of +3.0V, while the resistance value changed to about 150Ω by applying the electric pulse of the voltage of −1.5V. That is, the element switched to the high-resistance state when the electric pulse was applied to the upper electrode 3303 such that the voltage of the upper electrode 3303 was higher than the voltage of the lower electrode 3301.

FIG. 1(b) shows measurement result obtained by changing the balance of the voltages applied such that a negative voltage is larger. In this case, the electric pulses of the voltages of −3.0V and +1.5V were applied to the upper electrode 3303 with respect to the lower electrode 3301. The element switched to the high-resistance state and the resistance value changed to about 600~800Ω by applying the electric pulse of the voltage of −3.0V, while the resistance variable element switched to the low-resistance state and the resistance value changed to about 150Ω by applying the electric pulse of the voltage of +1.5V. That is, the element switched to the low-resistance state when the electric pulse was applied to the upper electrode 3303 such that the voltage of the upper electrode 3303 was higher than the voltage of the lower electrode 3301. The element exhibited the reverse operation from the operation corresponding to the measurement shown in FIG. 1(a).

The above result implies that the operation of the element such as the element A is very inappropriate as the operation of the bipolar nonvolatile memory element. The bipolar nonvolatile memory element has a feature that resistance changing phenomenon is not controlled by the magnitude of the voltage of the electric pulse applied but resistance is controlled using the electric pulses having voltages with different polarities. In other words, the bipolar nonvolatile memory element has a feature that directionality of resistance changing phenomenon (directionality of switching from a high-resistance state to a low-resistance state or from the low-resistance state to the high-resistance state) does not vary even when the magnitude of the voltage applied to the element varies to a certain extent or the voltage of the threshold causing resistance changing phenomenon varies due to some factors such as a variation in manufacture, etc. However, in the case of the element A, the resistance value increased or decreased when the positive voltage was applied to the upper electrode. Thus, the element A had a problem that the resistance value was not determined uniquely according to the polarity of the voltage applied to the electrode. This was the first finding.

In order to seek a cause of two-mode resistance changing phenomenon of the nonvolatile memory element according to the polarity of the applied voltage, the present inventors researched which portion of the nonvolatile memory element caused resistance changing phenomenon. To this end, an element B was manufactured. FIG. 2 shows a schematic view of the cross-section of the element B. As shown in FIG. 2, two electrodes made of Pt were formed at each of the upper and lower sides of an oxygen-deficient Ta oxide layer 2005 of 100 nm, i.e., four electrodes 201~204 in total were formed. Then, the voltages of +2.0V and −1.5V were applied with a pulse width of 100 ns to the electrode 201 on the basis of the electrode 2002. The element B switched to a high-resistance state when an electric pulse of the voltage of +2.0V was applied to the element B and switched to a low-resistance state when an electric pulse of the voltage of −1.5V was applied to the element B. The resistance values were measured among the four electrodes under the condition in which the resistance between the electrode 2001 and the electrode 2002 was changed in this way. To be specific, +2.0V was applied between the electrode 2001 and the electrode 2002 to change resistance between the electrode 2001 and the electrode 2002 to a high-resistance state, and under this condition, the resistance value between the electrode 2001 and the electrode 2003, the resistance value between the electrode 2001 and the electrode 2004, the resistance value between the electrode 2002 and the electrode 2003, the resistance value between the electrode 2002 and the electrode 2004, and the resistance value between the electrode 2003 and the electrode 2004 were respectively measured. Then, −1.5V was applied between the electrode 2001 and the electrode 2002 to change resistance between the electrode 2001 and the electrode 2002 to a low-resistance state, and under this condition, the resistance values between the electrodes were measured similarly to the above described manner.

The above-mentioned measurement was repeated 10 times and the resulting resistance values between the electrodes are all illustrated in table 1.

TABLE 1

| | Resistance value($\Omega$) generated by applying +1.8 V between electrodes 201 and 202 | Resistance value($\Omega$) generated by applying −1.5 V between electrodes 201 and 202 |
|---|---|---|
| Between electrodes 201 and 202 | 546 | 262 |
| Between electrodes 201 and 203 | 1351 | 1276 |
| Between electrodes 201 and 204 | 1075 | 828 |
| Between electrodes 202 and 203 | 1153 | 1153 |
| Between electrodes 202 and 204 | 704 | 704 |
| Between electrodes 203 and 204 | 698 | 698 |

The result was such that changing of the resistance value of the portion associated with the electrode 2001 was observed and the resistance values of portions which were not associated with the electrode 2001 did not substantially change. From this fact, it is found that resistance changing phenomenon occurred in response to the voltage applied between the electrode 2001 and the electrode 2002 only in the region the vicinity of the electrode 2001.

From the above result, in the resistance variable element using the oxygen-deficient Ta oxide as the resistance variable layer, it may be judged that resistance changing phenomenon occurred only in a region of the oxygen-deficient Ta oxide layer which is located near the electrode. Also, it may be considered that resistance changing phenomenon occurred in the region in the vicinity of the electrode at a high potential side, when the element switched to the high-resistance state (in this case, a voltage with a higher potential was applied to the electrode 2001 with respect to the electrode 2002 when the element switched to the high-resistance state). This was second finding.

In light of the above results, it is presumed that resistance changing phenomenon occurred in the element A, in two modes, i.e., a mode (upper electrode mode) in which resistance changing phenomenon occurred in the vicinity of the interface between the upper electrode 3303 and the oxygen-deficient Ta oxide layer 3302 and a mode (lower electrode mode) in which resistance changing phenomenon occurred in the vicinity of the interface between the lower electrode 3301 and the oxygen-deficient Ta oxide layer 3302. Considering the polarity of the electric pulse applied and directionality of resistance changing phenomenon, FIG. 1(a) shows a resistance changing characteristic occurring when the element was operating in the upper electrode mode and FIG. 1(b) shows a resistance changing characteristic occurring when the element was operating in the lower electrode mode.

From the above results, a structure which causes resistance changing phenomenon in the regions in the vicinity of both of the upper and lower electrodes should not be formed in order to attain an ideal bipolar nonvolatile memory element which has a structure in which the resistance variable layer is sandwiched between metal electrodes and allows a resistance value to be determined uniquely according to the polarity of the voltage applied to the electrode.

In addition to the above-mentioned problem, there exists a problem that a phenomenon in which the upper electrode mode and the lower electrode mode seem to be mixed occurs less frequently when the element is caused to changing resistance repetitively. FIG. 3 shows a resistance changing characteristic of another element having a structure shown in FIG. 40, which is similar to that of the element A. To be specific, this nonvolatile memory element includes the lower electrode 3301 made of Pt and the upper electrode 3303 made of Pt, and the resistance variable layer 3302 made of an oxygen-deficient Ta oxide with oxygen content 58 at % (x is 1.38 when the oxygen-deficient Ta oxide is expressed as $TaO_x$). In measurement, the electric pulses of voltages of +2.0V and −1.5V and a pulse width 100 ns were applied to the upper electrode 3303 on the basis of the lower electrode 3301. As can be seen from FIG. 3, the resistance changing magnitude changed when the number of pulses applied exceeded about 20 times. That is, in an initial stage, the resistance value changed to about 4000$\Omega$ when the electric pulse of a voltage of +2.0V was applied and changed to about 1500$\Omega$ when the electric pulse of the voltage of −1.5V was applied. However, when the number of pulses applied exceeded 20 times, the resistance changing magnitude was broadened and the resistance changing phenomenon occurred between 2000~3000$\Omega$ and 300~400$\Omega$.

It is presumed that this phenomenon occurred due to the mixing between the upper electrode mode and the lower electrode mode as described above. To be specific, resistance changing phenomenon between the high-resistance state and the low-resistance state occurred at the upper electrode side in the state where the lower electrode side was in the high-resistance state until the number of electric pulses applied was about 20 times. But, it is pressured that, from when the number of electric pulses exceeded 20 times, switching to the low-resistance state occurred at the lower electrode side for some reasons, and resistance switching between the high-resistance state and the low-resistance state repeated at the upper electrode side. In other words, it is presumed that since the resistance at the interface between the lower electrode and the oxygen-deficient Ta oxide changed unintentionally, a fluctuation in the resistance changing magnitude occurred as shown in FIG. 3. This was third finding. The above mentioned fluctuation in the resistance changing magnitude is undesirable as the characteristic of the element for storing data based on the magnitude of resistance.

In addition to the above mentioned problem, the conventional resistance variable nonvolatile memory element using the transition metal oxide such as NiO has a problem that resistance changing phenomenon is difficult to occur just after forming the structure in which the resistance variable material is sandwiched between the upper and lower electrodes as disclosed in Non-Patent document 1. To be specific, it is said that to enable the element to exhibit the resistance changing phenomenon, "warming up" step (hereinafter referred to as "forming step") for applying a special electric stimulus between the upper and lower electrodes is required. In view of the mass production of the resistance variable memory, the forming step is far from being desirable. This is because the forming step may be regarded as one of the manufacturing steps and leads to a cost increase or a complicated manufacturing process. Within the scope of the present specification, the forming step is defined as a step for applying an electric pulse which is different in magnitude (voltage value) or width (time) from the electric pulse for enabling steady resistance state switching to switch the state of the resistance variable nonvolatile memory element just after manufacture. For example, in a case where to operate the nonvolatile memory element having a potential to switch the resistance state in response to an electric pulse having a magnitude of 2V and a width of 100 ns, it is necessary to apply to the same electric pulses of, for example, 3V and 1 μs 10 times just after manufacture, it is expressed that the forming step (step for applying electric pulses of, for example, 3V and 1 μs 10 times) is required.

The present inventors presumed that the electrode material is relevant to the resistance changing phenomenon and conceived the present invention based on the above explained findings. It should be noted that data relating to controllability or the like of the resistance changing phenomenon depending on the combination of the upper and lower electrode materials was not disclosed conventionally. As described above, patent document 5 to patent document 8 disclose the electrode materials which exhibit resistance changing phenomenon actually or the candidate of the electrode materials presumed as exhibiting resistance changing phenomenon, in the resistance variable nonvolatile memory element. However, any suitable combination of the upper and lower electrode materials for causing resistance changing phenomenon with high controllability in the case where a memory device is manufactured to incorporate the resistance variable nonvolatile memory elements has not been disclosed at all.

A nonvolatile memory element of the present invention comprise a first electrode; a second electrode; and a resistance variable layer which is disposed between the first electrode and the second electrode such that the resistance variable layer is in contact with the first electrode and the second electrode, the resistance variable layer having reversibly changeable resistances in response to electric signals with different polarities which are applied between the first electrode and the second electrode; wherein the resistance variable layer comprises an oxygen-deficient tantalum oxide layer, and the first electrode and the second electrode comprise materials which are made of different elements. As will be described later, the present inventors discovered that there are materials which easily cause resistance changing phenomenon and materials which do not easily cause resistance changing phenomenon, as electrode materials. By forming one of the first and second electrodes by the material which easily causes resistance changing phenomenon and by forming the other by the material which does not easily cause resistance changing phenomenon, a nonvolatile memory element having a reversible and stable rewrite characteristic is attainable.

It is preferable that $V_1-V_{Ta}$ which is a difference between a standard electrode potential $V_1$ of the first electrode and a standard electrode potential $V_{Ta}$ of tantalum and $V_2-V_{Ta}$ which is a difference between a standard electrode potential $V_2$ of the second electrode and the standard electrode potential $V_{Ta}$ of tantalum satisfy a relationship $0<V_1-V_{Ta}<V_2-V_{Ta}$.

It is preferable that $V_1-V_{Ta}$ which is a difference between a standard electrode potential $V_1$ of the first electrode and a standard electrode potential $V_{Ta}$ of tantalum and $V_2-V_{Ta}$ which is a difference between a standard electrode potential $V_2$ of the second electrode and the standard electrode potential $V_{Ta}$ of tantalum satisfy a relationship $V_1-V_{Ta} \leq 0 < V_2-V_{Ta}$.

It is preferable that the first electrode comprises a material selected from a group consisting of W, Ni, Ta, Ti, Al, and Ta nitride, and the second electrode comprises a material selected from a group consisting of Pt, Ir, Pd, Ag and Cu.

It is preferable that the first electrode comprises a material selected from a group consisting of Ta, Ti, and Al, and the second electrode comprises a material selected from a group consisting of Pt, Ir, Pd, Ag, Cu, W, Ni and Ta nitride.

When a resistance value occurring when a positive voltage is applied to the second electrode on the basis of the first electrode is expressed as R1 and a resistance value occurring when a negative voltage is applied to the second electrode on the basis of the first electrode is expressed as R2, the resistance value may change reversibly such that R1 and R2 satisfy R1>R2 in a first mode; when a resistance value occurring when a negative voltage is applied to the second electrode on the basis of the first electrode is expressed as R3 and a resistance value occurring when a positive voltage is applied to the second electrode on the basis of the first electrode is expressed as R4, the resistance value may change reversibly such that R3 and R4 satisfy R3≧R4 in a second mode; and R1/R2 which is a ratio of R1 to R2 and R3/R4 which is a ratio of R3 to R4 may satisfy R1/R2>R3/R4.

It is preferable that when the oxygen-deficient tantalum oxide layer is expressed as $TaO_x$, $0.8 \leq x \leq 1.9$ is satisfied.

The oxygen-deficient tantalum oxide layer may have, in a thickness direction thereof, a first region containing a first oxygen-deficient tantalum oxide and a second region containing a second oxygen-deficient tantalum oxide which is higher in oxygen content than the first oxygen-deficient tantalum oxide.

It is preferable that the second electrode comprises a material having a standard electrode potential higher than a standard electrode potential of tantalum and a standard electrode potential of a material forming the first electrode, and the second region is positioned between the first region and the second electrode.

The oxygen-deficient tantalum oxide layer may include at least a first oxygen-deficient tantalum oxide layer which is the first region and a second oxygen-deficient tantalum oxide layer which is the second region such that the first oxygen-deficient tantalum oxide layer and the second oxygen-deficient tantalum oxide layer are stacked together.

It is preferable that when the first oxygen-deficient tantalum oxide is expressed as $TaO_x$, $0.8 \leq x \leq 1.9$ is satisfied.

It is preferable that when the second oxygen-deficient tantalum oxide is expressed as $TaO_y$, $2.1 \leq y \leq 2.5$ is satisfied.

It is preferable that the second oxygen-deficient tantalum oxide layer have a layer thickness which is not less than 1 nm and not more than 8 nm.

A nonvolatile semiconductor device of the present invention comprises: a semiconductor substrate; and a memory array including plural first electrode wires provided on the semiconductor substrate to extend in parallel with each other;

plural second electrode wires provided above the plural first electrode wires to extend in parallel with each other within a plane parallel to a main surface of the semiconductor substrate and to three-dimensionally cross the plural first electrode wires; and nonvolatile memory elements which are provided to respectively correspond to three-dimensional cross points between the plural first electrode wires and the plural second electrode wires; wherein each of the nonvolatile memory elements includes a resistance variable layer disposed between a first electrode which is the first electrode wire and a second electrode which is the second electrode wire, a resistance value of the resistance variable layer being changeable reversibly in response to a voltage between the first electrode and the second electrode; and wherein the resistance variable layer comprises an oxygen-deficient tantalum oxide layer, and the first electrode and the second electrode comprise materials which are made of different elements.

A nonvolatile semiconductor device of the present invention comprises: a semiconductor substrate; and a memory array including plural first electrode wires provided on the semiconductor substrate to extend in parallel with each other; plural second electrode wires provided above the plural first electrode wires to extend in parallel with each other within a plane parallel to a main surface of the semiconductor substrate and to three-dimensionally cross the plural first electrode wires; and nonvolatile memory elements which are provided to respectively correspond to three-dimensional cross points between the plural first electrode wires and the plural second electrode wires; wherein each of the nonvolatile memory elements includes a first electrode connected to the first electrode wire, a second electrode connected to the second electrode wire, and a resistance variable layer disposed between the first electrode and the second electrode, a resistance value of the resistance variable layer being changeable reversibly in response to a voltage between the first electrode and the second electrode; and wherein the resistance variable layer comprises an oxygen-deficient tantalum oxide layer, and the first electrode and the second electrode comprise materials which are made of different elements.

Each of the nonvolatile memory elements may include a current controlling element between the first electrode and the second electrode, and the current controlling element may be electrically connected to the resistance variable layer.

The nonvolatile semiconductor device may comprise a multi-layer memory array in which plural layers of the memory array are stacked together.

A nonvolatile semiconductor device of the present invention comprises a semiconductor substrate; plural word lines and plural bit lines which are provided on the semiconductor substrate such that the plural word lines and the plural bit lines cross each other; plural transistors provided to respectively correspond to cross points between the plural word lines and the plural bit lines; and plural nonvolatile memory elements provided to respectively correspond to the plural transistors; wherein each of the nonvolatile memory elements includes a first electrode, a second electrode, and a resistance variable layer disposed between the first electrode and the second electrode, a resistance value of the resistance variable layer being changeable reversibly in response to electric signals applied between the first electrode and the second electrode via an associated transistor; wherein the resistance variable layer comprises an oxygen-deficient tantalum oxide layer, and the first electrode and the second electrode comprise materials which are made of different elements.

A nonvolatile semiconductor device of the present invention comprises a semiconductor substrate; logic circuits provided on the semiconductor substrate, for executing predetermined calculation; and nonvolatile memory elements provided on the semiconductor substrate and having a programming function; wherein each of the nonvolatile memory elements includes a first electrode, a second electrode, and a resistance variable layer disposed between the first electrode and the second electrode, a resistance value of the resistance variable layer being changeable reversibly in response to voltages between the first electrode and the second electrode; and wherein the resistance variable layer comprises an oxygen-deficient tantalum oxide layer, and the first electrode and the second electrode comprise materials which are made of different elements.

The above mentioned nonvolatile semiconductor device may comprise other specific nonvolatile semiconductor device mentioned above.

These objects as well as other objects, features and advantages of the invention will become more apparent to those skilled in the art from the following description with reference to the accompanying drawings.

Effects of the Invention

In accordance with the present invention, it is possible to attain a nonvolatile memory element which has a reversible and stable rewrite characteristic and a nonvolatile semiconductor device using the nonvolatile memory element. Furthermore, it is possible to attain a nonvolatile memory element which is operable stably without a forming step and a nonvolatile semiconductor device using the nonvolatile memory element.

Figure 1:
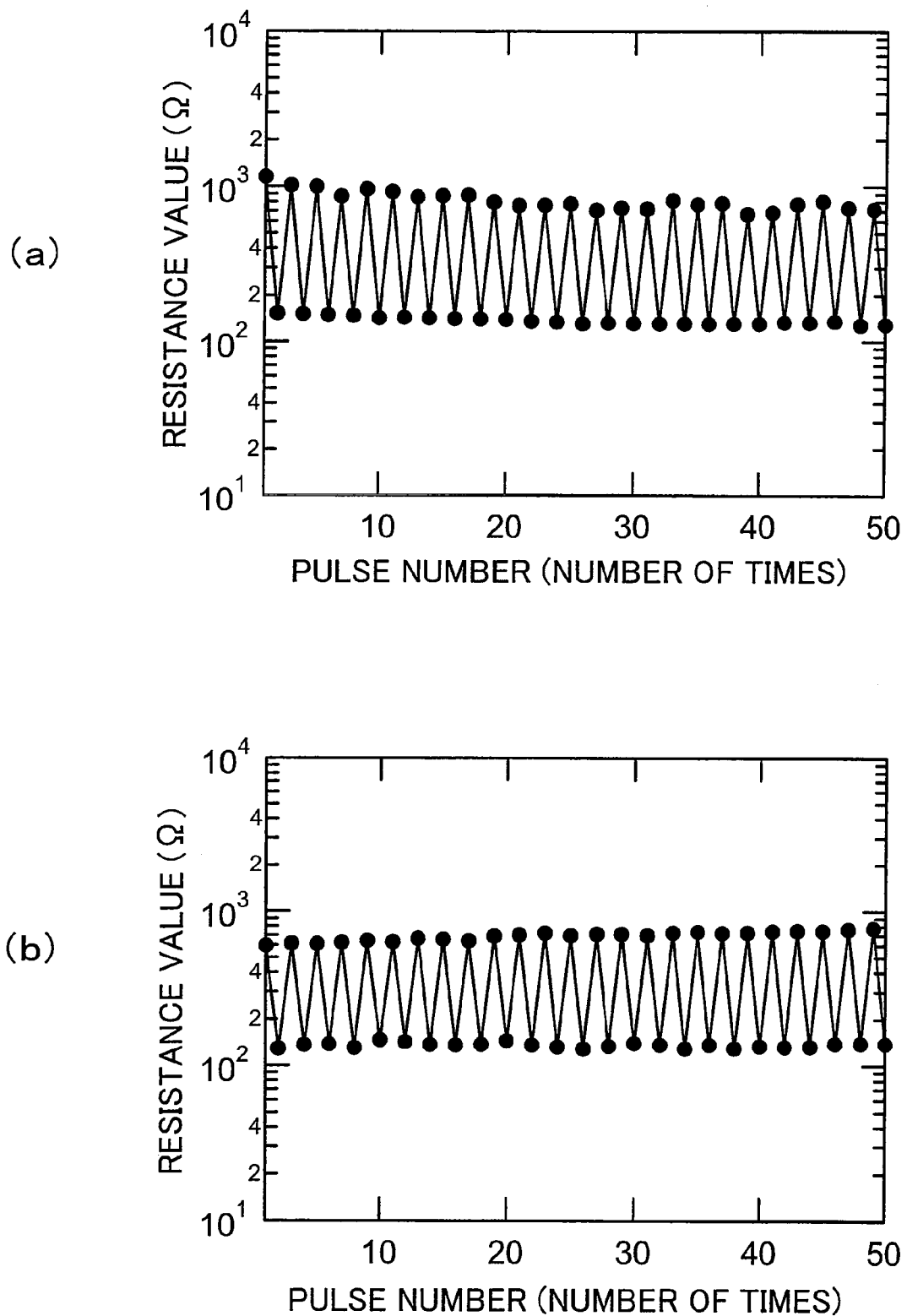
FIG. 1 is a view showing resistance changing phenomenon occurring when an electric pulse is applied to a nonvolatile memory element shown in FIG. 40.
Figure 2:
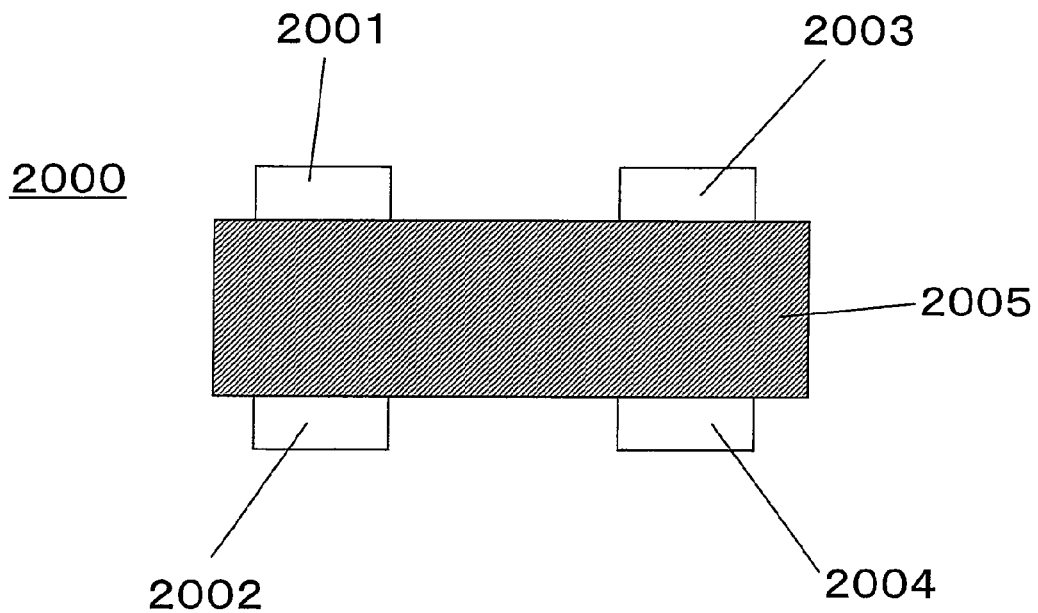
FIG. 2 is a schematic view of the cross-section of a nonvolatile memory element manufactured to research which portion of the nonvolatile memory element resistance changing phenomenon occurs.

EXPLANATION OF REFERENCE NUMERALS 200 nonvolatile semiconductor device
201 memory main section
202 memory array
203 row select circuit/driver
204 column select circuit/driver
205 write circuit
206 sense amplifier
207 data input/output circuit
208 address input circuit
209 control circuit
210 nonvolatile memory element
211 upper wire
212 lower wire
213 upper electrode
214 resistance variable layer
215 inner electrode
216 current controlling element
217 lower electrode
218 ohmic resistance layer
219 second resistance variable layer 300 nonvolatile semiconductor device
301 memory main section
302 memory array
303 row select circuit/driver
304 column select circuit
305 write circuit
306 sense amplifier
307 data input/output circuit
308 cell plate electric power supply
309 address input circuit
310 control circuit
313 nonvolatile memory element
314 upper electrode
315 resistance variable layer
316 lower electrode
400 nonvolatile semiconductor device
401 semiconductor substrate
402 CPU
403 input/output circuit
404 logic circuit
405 analog circuit
406 BIST circuit
407 SRAM
408 address storage register for redundancy
409 nonvolatile memory element
410 write circuit
411 read circuit
412 latch circuit
500 nonvolatile memory element
501 substrate
502 oxide layer
503 first (lower) electrode layer
504 resistance variable layer (oxygen-deficient tantalum oxide layer)
505 second (upper) electrode layer
1401 first (lower) electrode layer
1402 oxygen-deficient tantalum oxide layer
1403 second (upper) electrode layer
1404 oxygen atoms
1501 first (lower) electrode layer
1502 oxygen-deficient tantalum oxide layer
1503 second (upper) electrode layer
1504 oxygen atoms
1505 oxygen
1700 nonvolatile memory element
1701 substrate
1702 oxide layer
1703 first (lower) electrode layer
1704 first oxygen-deficient tantalum oxide layer
1705 second oxygen-deficient tantalum oxide layer
1706 resistance variable layer (oxygen-deficient tantalum oxide layer)
1707 second (upper) electrode layer
1708 element region
2000 nonvolatile memory element having four terminals
2001 first electrode
2002 second electrode
2003 third electrode
2004 fourth electrode
2005 oxygen-deficient tantalum oxide layer
BL0, BL1, . . . bit lines
M11, M12, . . . memory cells
T11, T12, . . . transistors
WL0, WL1, . . . word lines

BEST MODE FOR CARRYING OUT THE INVENTION

Hereinafter, preferred embodiments of the present invention will be described in detail with reference to the drawings. Throughout the drawings, the same reference numerals are assigned to the same or corresponding parts and description thereof will be omitted in some cases.

Embodiment 1

As described above, in the resistance variable nonvolatile memory element which uses the oxygen-deficient Ta oxide and performs a bipolar operation, an operation for easily causing resistance changing phenomenon only in the region in the vicinity of either one of the upper and lower electrodes is desirable. If resistance changing phenomenon depends on the electrode material, a structure in which an oxygen-deficient Ta oxide is sandwiched between electrode materials one of which easily causes resistance changing phenomenon and another of which does not easily cause resistance changing phenomenon, may be formed. In this embodiment, result of research of this will be described.

Prior to explaining the research result, a manufacturing method of the oxygen-deficient Ta oxide layer, and a suitable range of oxygen content of the oxygen-deficient Ta oxide layer will be described. Then, description will be given of research result of how resistance variable phenomenon occurs in response to electric pulses, in the structure formed by sandwiching the $TaO_x$ layer between the electrodes made of W, Ta, and Ta nitride (hereinafter expressed as TaN), in order to confirm whether or not easiness of resistance changing operation depends on the electrode material. Finally, description will be given of measurement result of resistance changing operation of the resistance variable element having a structure in which the oxygen-deficient Ta oxide is sandwiched between the electrode material which easily causes resistance changing phenomenon and the electrode material which does not easily cause resistance changing phenomenon.

[Relationship Between Oxygen Flow Ratio During Sputtering Process and Oxygen Content of Ta Oxide Layer]

Firstly, manufacturing conditions and analysis result of oxygen content of the oxygen-deficient Ta oxide layer in this Embodiment will be described. The oxygen-deficient Ta oxide layer was deposited by subjecting a Ta target to sputtering under gas atmosphere of argon (Ar) gas and $O_2$ gas, i.e., so-called reactive sputtering. The specific deposition method of the oxygen-deficient Ta oxide in this Embodiment is as follows.

Figure 4:
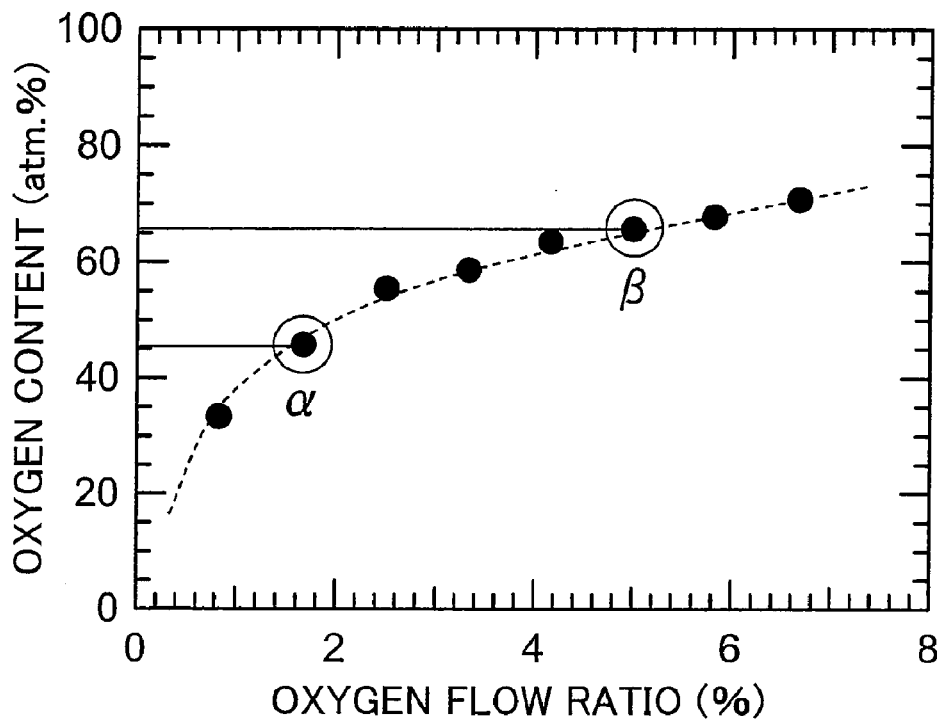
FIG. 4 is a view showing the relationship between oxygen flow ratio during sputtering and oxygen content of a Ta oxide layer.

Initially, a substrate was placed within a sputtering apparatus and the sputtering apparatus was evacuated to about $7 \times 10^{-4}$ Pa. Using Ta as a target, sputtering was conducted under the condition in which a power was set to 250 W and a total gas pressure of argon gas and oxygen gas was set to 3.3 Pa and a substrate temperature was set to 30 degrees C. In this case, the flow ratio of the $O_2$ gas to the Ar gas was changed from 0.8% to 6.7%. To research a composition as a primary object, a substrate formed by depositing 200 nm $SiO_2$ on Si layer was used and sputtering time was adjusted so that the layer thickness of the Ta oxide layer was about 100 nm. FIG. 4 shows Rutherford backscattering (RBS) analysis result and Auger electron spectroscopy (AES) analysis result of the composition of the Ta oxide layer deposited as described above. As can be seen from FIG. 4, the oxygen content of the Ta oxide layer was changed from about 35 at % ($TaO_{0.66}$) to about 70 at % ($TaO_{2.3}$) when the oxygen partial pressure ratio was changed from 0.8% to 6.7%. From the above result, it was revealed that the oxygen content of the Ta oxide layer was able to be controlled by the oxygen flow ratio, and an oxygen-deficient Ta oxide in which oxygen is deficient with respect to the oxygen content 71.4 at % of $Ta_2O_5$ ($TaO_{2.5}$) which is a stoichiometric oxide of Ta.

Although in this embodiment, the Rutherford backscattering (RBS) and Auger electron spectroscopy (AES) were employed for analysis of the Ta oxide layer, instrument analysis method such as X-ray photoelectron spectroscopy (XPS), or electron probe micro-analysis (EPMA) may be employed.

[Composition and Resistance Changing Characteristic of Oxygen-Deficient Ta Oxide Layer]

Research was made to confirm the oxygen content of the oxygen-deficient Ta oxide which could exhibit resistance changing characteristics, among the oxygen-deficient Ta oxides manufactured as described above. In this case, Pt was used as the material for the upper and lower electrodes sandwiching the oxygen-deficient Ta oxide layer. The nonvolatile element using Pt as the upper and lower electrodes is inappropriate as the bipolar resistance variable nonvolatile element as described above. However, Pt is an electrode material which exhibits resistance changing characteristics very easily and is an optimal material used to determine whether or not an oxygen-deficient Ta oxide having a certain oxygen content exhibits resistance changing characteristics, as described later.

Figure 5:
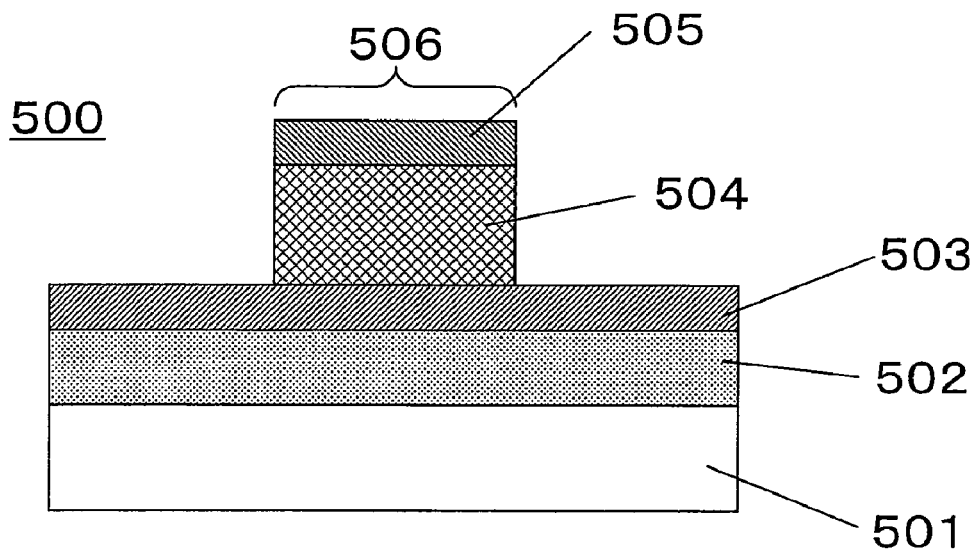
FIG. 5 is a cross-sectional view showing a configuration of a nonvolatile memory element according to Embodiment 1 and Embodiment 2 of the present invention.

For the above explained reasons, a nonvolatile memory element shown in FIG. 5 was manufactured. To be specific, over a monocrystalline silicon substrate 501, a 200 nm-thick oxide layer 502 was formed by a thermal oxidation process, and a 100 nm-thick Pt thin film was deposited over the oxide layer 502 as a lower electrode layer 503 by a sputtering process. Then, using Ta as a target, an oxygen-deficient Ta oxide layer 504 was deposited by a reactive sputtering process. The nonvolatile memory element was manufactured by changing the flow ratio of the oxygen gas from 0.8% to 6.7% which is the range researched in this Embodiment, as in the case of the above samples for analysis. The layer thickness of the oxygen-deficient Ta oxide layer 504 was set to 30 nm.

Then, a 150 nm-thick Pt thin film was deposited over the oxygen-deficient Ta oxide layer 504 as an upper electrode layer 505, by the sputtering process. Finally, by a photolithography step and a dry etching step, an element region 506 was formed. The element region 506 had a circular shape of a 3 μm-diameter and is provided like an island.

Figure 6:
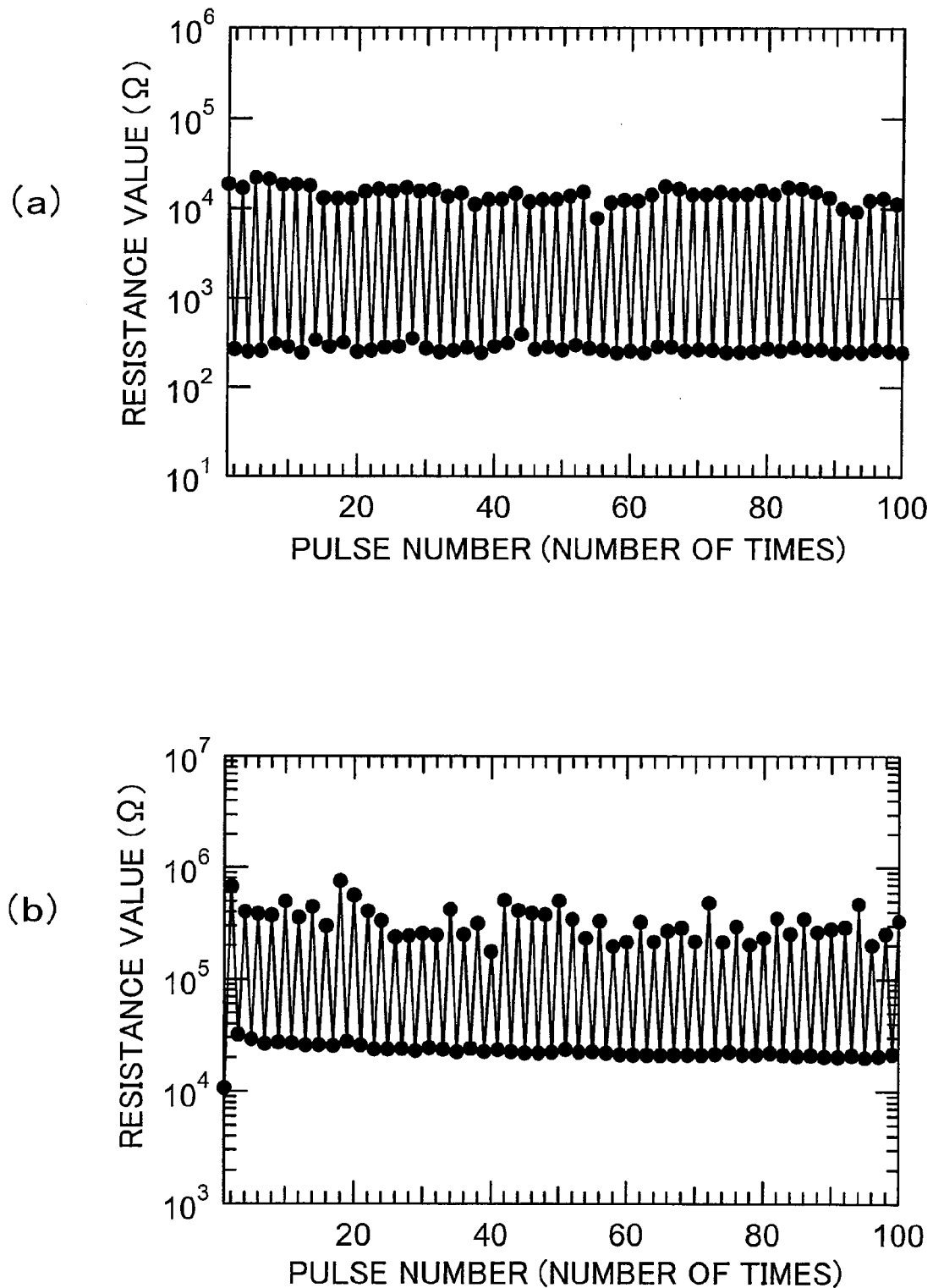
FIG. 6 is a view showing the relationship between the resistance value of the nonvolatile memory element according to Embodiment 1 of the present invention and the number of electric pulses applied.

The resistance changing phenomenon of the nonvolatile memory element manufactured as described above was measured. As a result, in the nonvolatile memory element using the Ta oxide film at a point α in FIG. 4 (oxygen flow ratio: about 1.7%, oxygen content: about 45 at %) to the nonvolatile memory element using the Ta oxide film at a point β in FIG. 4 (oxygen flow ratio: about 5%, oxygen content: about 65 at %), the high-resistance value was favorably not less than five times as large as the low-resistance value. FIGS. 6(a) and 6(b) show measurement results of the resistance changing characteristics with respect to the number of pulses applied, relating to the nonvolatile memory elements using the Ta oxide layers having the oxygen contents at the point α and the point β, respectively. As can be seen from FIGS. 6(a) and 6(b), in the elements using the Ta oxide layers having the oxygen contents at the point α and the point β, the high-resistance value was favorably not less than five times as large as the low-resistance value. Therefore, the composition range in which the oxygen content is 45~65 at %, i.e., the range of x, $0.8 \leq x \leq 1.9$ in the case where the resistance variable layer is expressed as $TaO_x$ is a more proper range of the resistance variable layer (oxygen content=45 at % corresponds to x=0.8, and the oxygen content=65 at % corresponds to x=1.9). In the composition analysis according to the RBS method, the analysis value of the oxygen content has a precision of about ±5 at %. Therefore, the composition range of x contains a measurement error associated with this precision, and in actuality, there is a chance that the composition range in which the oxygen content is 40~70 at % is this appropriate composition range. In the resistance variable layer outside this composition range, the resistance changing phenomenon is confirmed or presumed, but its resistivity is lower or higher than that of the resistance variable layer within this composition range. Therefore, it is considered that the high-resistance value is less than five times as large as the low-resistance value and the memory element including this resistance variable layer operates less stably.

[Resistance Changing Characteristics of Resistance Variable Element Using W, Ta, and Tan as Upper and Lower Electrode Materials]

Subsequently, description will be given of the result of the research conducted to confirm how resistance changing phenomenon occurs in response to electric pulses, in elements manufactured to have a structure in which an oxygen-deficient Ta oxide layer 504 is sandwiched between a lower electrode 503 and an upper electrode 505 which are made of W, Ta, or TaN, other than Pt, in order to confirm whether or not easiness of resistance changing operation depends on an electrode material. Since an experiment was conducted to evaluate only easiness of resistance changing operation, the upper and lower electrodes were made of the same material. The oxygen content of the oxygen-deficient Ta oxide used was set to 58 at % ($TaO_{1.38}$) which was about the middle in a suitable oxygen content range. The manufacturing method of the element was almost identical to the above. W, Ta, and TaN were deposited by a sputtering process.

The relationship between the element names and the electrode materials, the elements used to previously research the resistance changing phenomenon, and the elements described below are illustrated in table 2 all together.

TABLE 2

| Element name | Lower electrode material | Upper electrode material |
|---|---|---|
| A | Pt | Pt |
| B | Pt | Pt |
| C | W | W |
| D | Ta | Ta |
| E | TaN | TaN |
| F | W | Pt |
| G | W | Ir |
| H | W | Ag |
| I | W | Cu |
| J | W | Ni |
| K | W | Ta |
| L | W | Ti |
| M | W | Al |
| N | W | TaN |
| O | TaN | Pt |
| P | TaN | Pt |
| Q | Pt | Pt |
| R | Pt | Pt |
| S | Pt | Pt |

Firstly, a resistance changing characteristic of a nonvolatile memory element (hereinafter referred to as element C) including the lower electrode 503 and the upper electrode 505 which are both formed by thin films made of W will be described.

Figure 7:
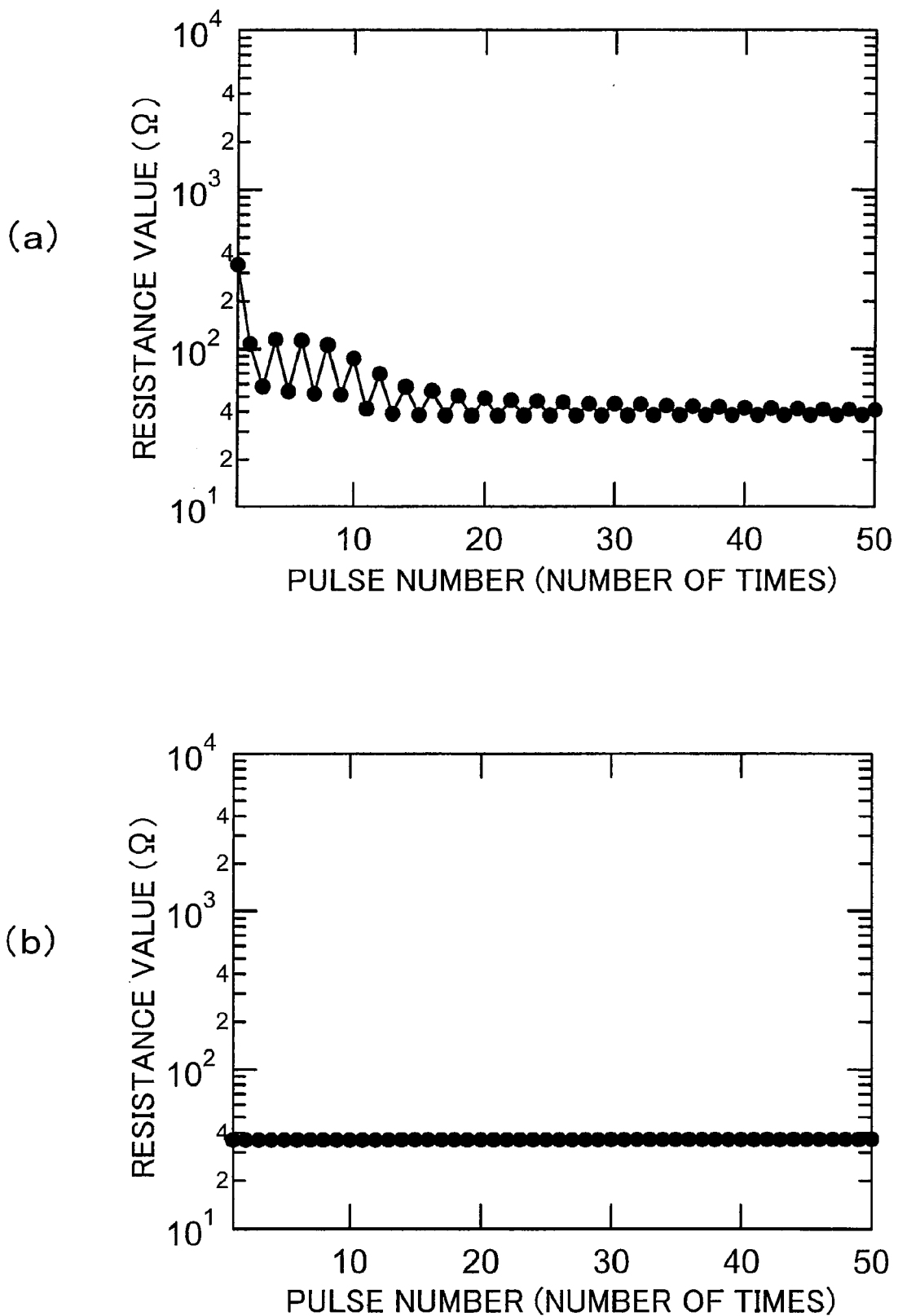
FIG. 7 is a view showing the relationship between the resistance value of the nonvolatile memory element according to Embodiment 1 of the present invention and the number of electric pulses applied.

FIG. 7 shows measurement results of resistance changing characteristics of the element C manufactured in this way in response to the electric pulses. FIG. 7(a) shows the changing of the resistance value in a case where the electric pulses of +7V and −5V were applied alternately to the upper electrode 505 on the basis of the lower electrode 503 to generate resistance in the region in the vicinity of the upper electrode 505 (i.e. upper electrode mode). As can be seen from FIG. 7(a), slight resistance changing phenomenon was observed until the pulse number was about 30 times. The resistance variable element switched to the high-resistance state by applying the electric pulse of +7V, while the resistance variable element switched to the low-resistance state by applying the electric pulse of −5V. However, when the pulse number exceeded 30 times, the resistance changing phenomenon was not substantially observed. FIG. 7(b) shows the changing of the resistance value in a case where the electric pulses of +5V and −7V were applied alternately to the upper electrode 505 to generate resistance in the region in the vicinity of the lower electrode 503 (lower electrode mode). As can be seen from FIG. 7(b), in this case, changing of the resistance value was not substantially observed but the resistance value was about 30Ω and constant.

When the results of the element A including the upper and lower electrodes made of Pt, which are shown in FIG. 1, is compared to the results of FIG. 7, it is apparent that resistance changing phenomenon did not easily occur when W was used for the electrode. In the measurement result of the element (A) shown in FIG. 1(a), the resistance value corresponding to the low-resistance state was 150Ω and the resistance value corresponding to the high-resistance state was about 1000Ω. Thus, resistance changing phenomenon occurred about 7 times larger in ratio. In contrast, in the measurement result of the element C using W as the electrode material, which is shown in FIG. 7(a), resistance changing phenomenon occurred between 50Ω and 100Ω at most even in a range in which the resistance changed with a large magnitude. Thus, resistance changing phenomenon occurred only about twice in ratio. In the measurement of the result of FIG. 1(a), the voltages of +2.0V and −1.5V were applied, whereas in the measurement result of FIG. 7(a), the resistance changing phenomenon was not substantially observed, although very high voltages of +7V and −5V were applied.

As should be clearly understood from the above, resistance changing phenomenon does not easily occur when the electrode is made of W than when the electrode is made of Pt.

The above results mean that the operation of the resistance variable element including the resistance variable layer using the oxygen-deficient Ta oxide significantly depends on the electrode material used. It is apparent that resistance changing phenomenon easily occurs when Pt is used for the electrode, and does not easily occur when W is used for the electrode, at least.

Figure 8:
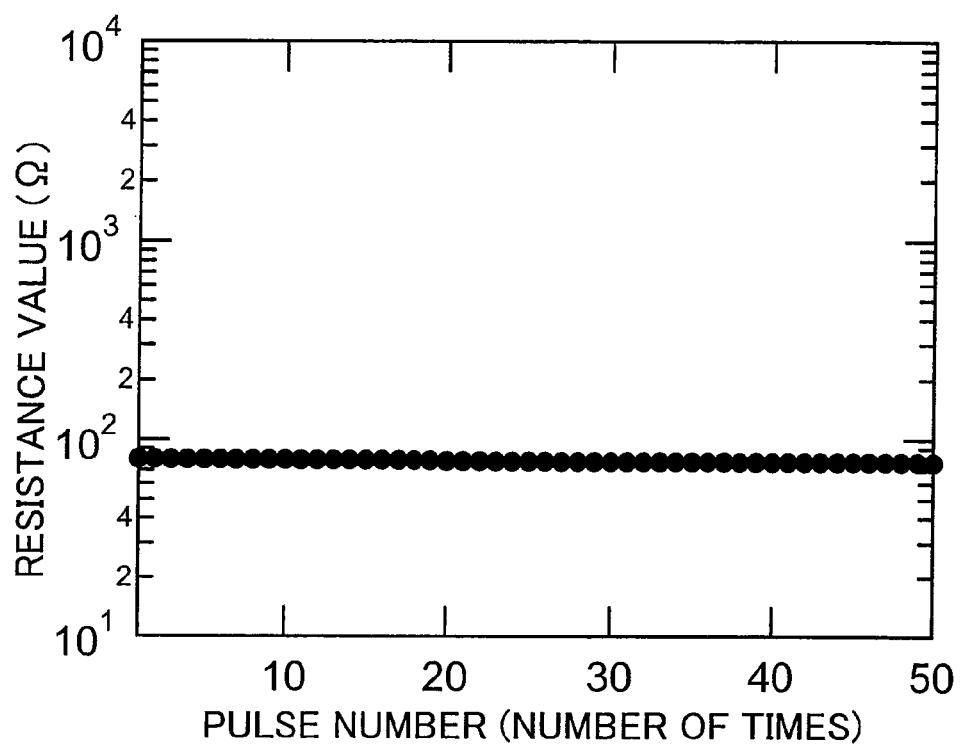
FIG. 8 is a view showing the relationship between the resistance value of the nonvolatile memory element according to Embodiment 1 of the present invention and the number of electric pulses applied.
Figure 8:
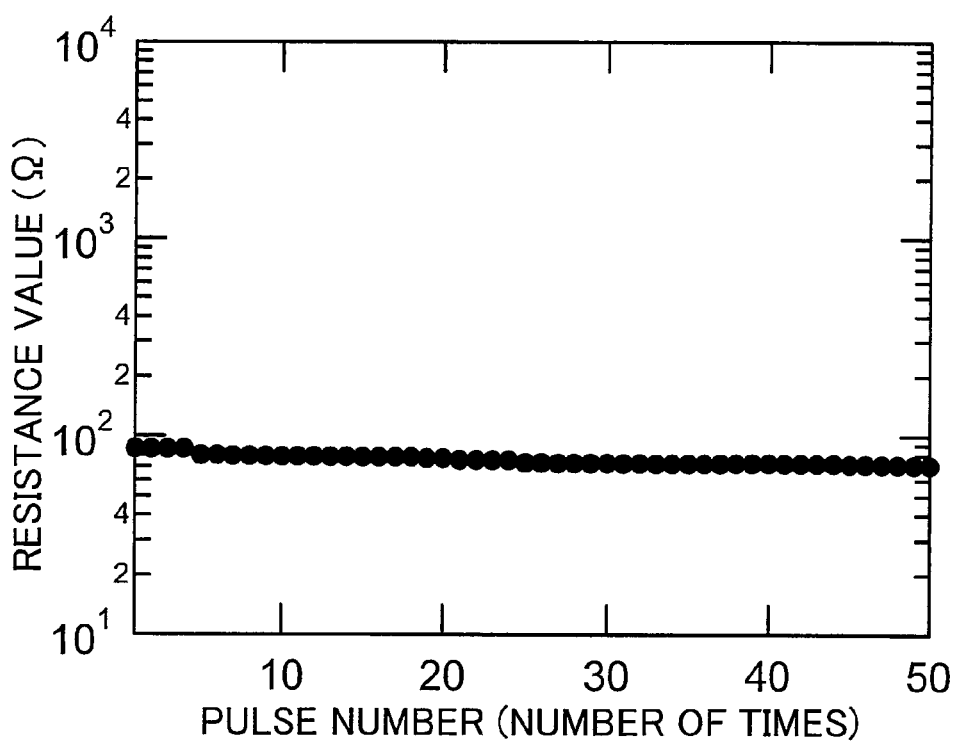
Figure 9:
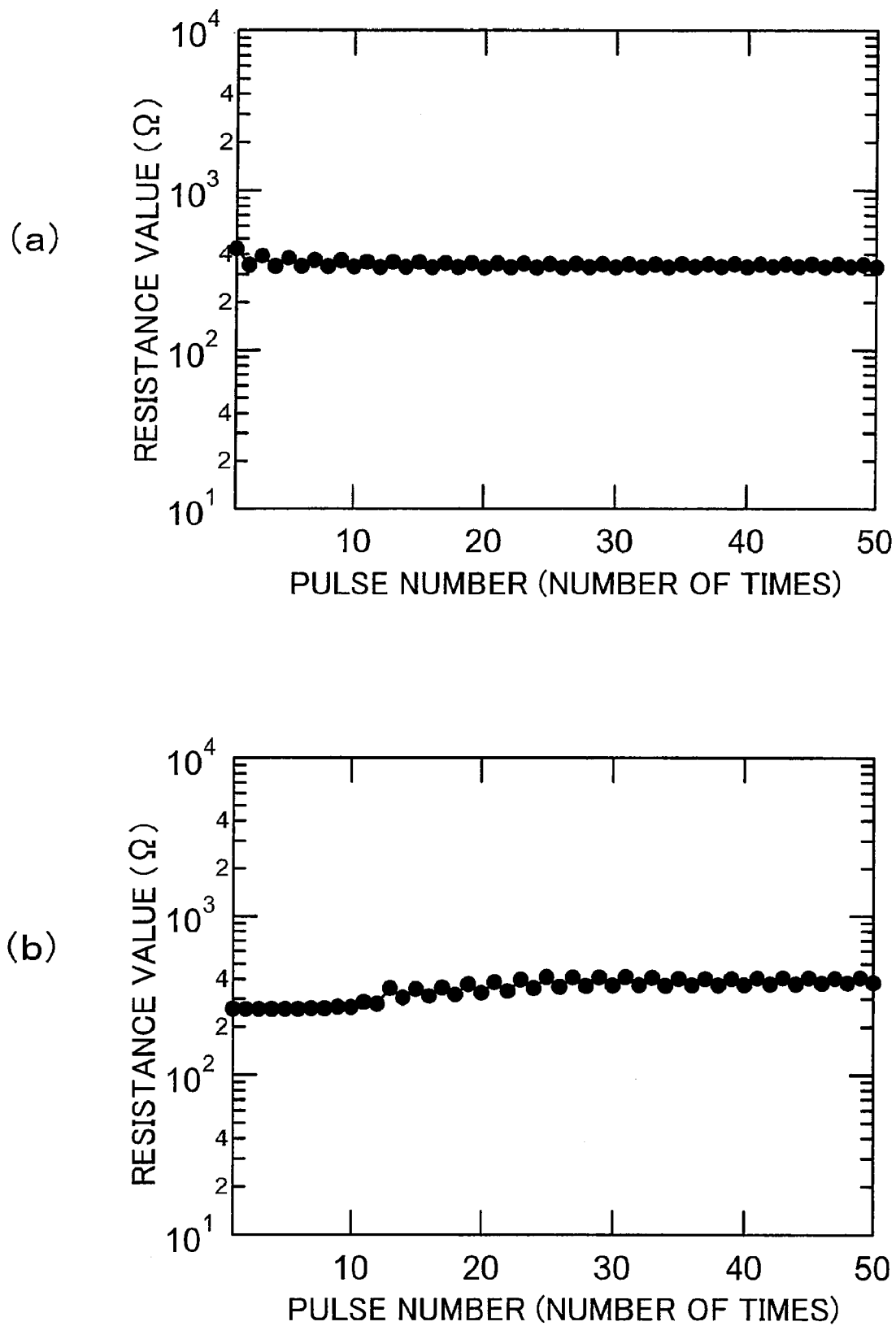
FIG. 9 is a view showing the relationship between the resistance value of the nonvolatile memory element according to Embodiment 1 of the present invention and the number of electric pulses applied.

Although not explained in detail, resistance variable elements using Ta and TaN for the upper and lower electrodes were manufactured and their resistance changing characteristics were measured. FIG. 8 shows resistance changing characteristics of an element D using Ta for the lower electrode 503 and the upper electrode 505. FIG. 8(a) shows a measurement result in a case where electric pulses of +7V and −5V were applied to the upper electrode 505. FIG. 8(b) shows a measurement result in a case where electric pulses of +5V and −7V were applied to the upper electrode 505. In either case, resistance changing phenomenon did not substantially occur. FIG. 9 shows resistance changing characteristic of an element E using TaN for the lower electrode 503 and the upper electrode 505. FIG. 9(a) shows a measurement result in a case where electric pulses of +7V and −5V were applied to the upper electrode 505. FIG. 9(b) shows a measurement result in a case where electric pulses of +5V and −7V were applied to the upper electrode 505. In this case, extremely slight resistance changing phenomenon occurred.

As should be appreciated from the above, there are materials which do not easily cause resistance changing phenomenon, in addition to W.

[Resistance Changing Characteristics of Resistance Variable Element Including Electrode Made of W and Pt]

Next, description will be given of a resistance changing characteristic of an element F which is a resistance variable element having a structure in which an oxygen-deficient Ta oxide is sandwiched between Pt which easily causes resistance changing phenomenon and W which does not easily cause resistance changing phenomenon and is high in process stability.

The element was manufactured using a W thin film as the lower electrode 503 and a Pt thin film as the upper electrode 505. The W thin film and the Pt thin film were deposited by subjecting W target and Pt target to sputtering in Ar gas, respectively.

Figure 10:
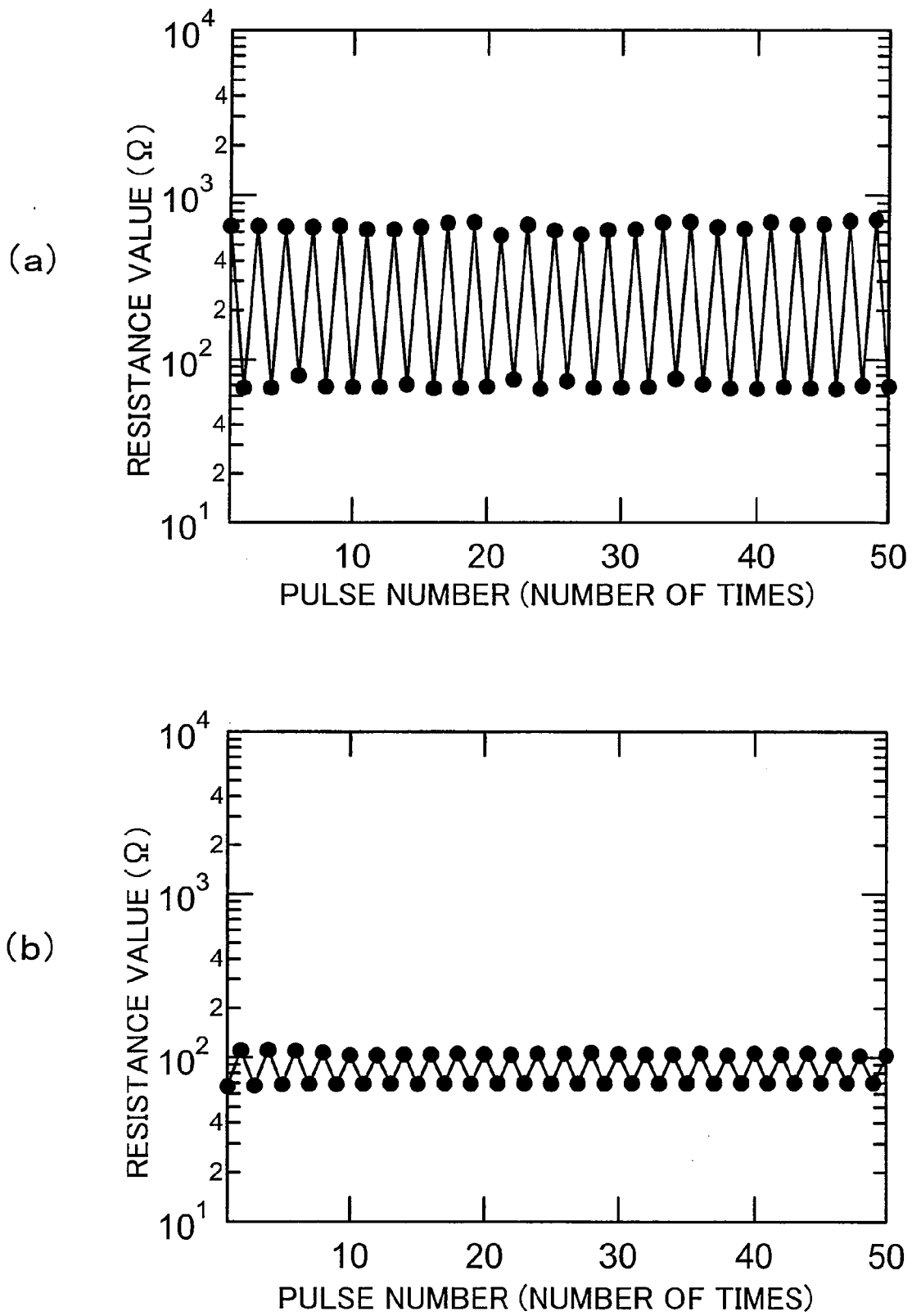
FIG. 10 is a view showing the relationship between the resistance value of the nonvolatile memory element according to Embodiment 1 of the present invention and the number of electric pulses applied.

FIG. 10 shows how the element F manufactured as described above changed resistance in response to the electric pulses. FIG. 10(a) shows the changing of the resistance value in a case where the electric pulses of +2.5V and −1.5V were applied alternately to the upper electrode 505 on the basis of the lower electrode 503, to generate resistance in the region in the vicinity of the upper electrode 505 (upper electrode mode). In this case, the resistance value changed to about 600Ω when the electric pulse of +2.5V was applied and changed to 60Ω when the electric pulse of −1.5V was applied. Thus, resistance changing phenomenon occurred stably.

FIG. 10(b) shows the changing of the resistance value in a case where the electric pulses of +1.5V and −2.5V were applied alternately to the upper electrode 505 on the basis of the lower electrode 503, to generate resistance in the region in the vicinity of the lower electrode 503 (lower electrode mode). In this case, resistance changing phenomenon occurred only between 60Ω and 100Ω and was substantially negligible as compared to the resistance changing characteristics in the upper electrode mode. From the results of FIGS. 10(a) and 10(b), the element F exhibited an ideal operation of the resistance variable nonvolatile memory element which changed resistance only in the region in the vicinity of one electrode and performed a bipolar operation.

Figure 3:
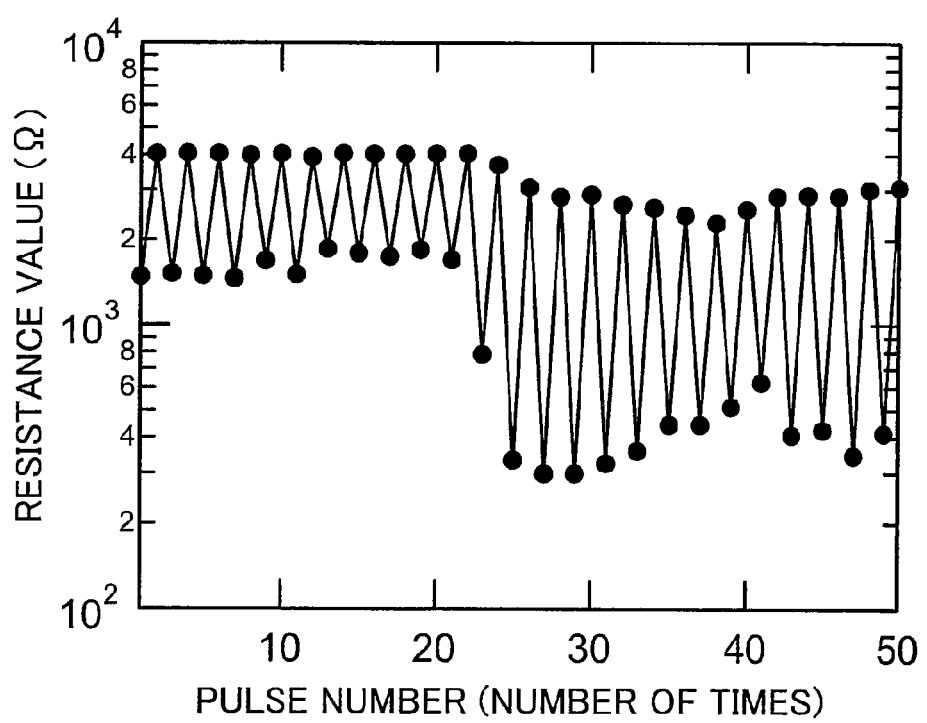
FIG. 3 is a view showing a resistance changing characteristic in which an upper electrode mode and a lower electrode mode seem to be mixed.
Figure 11:
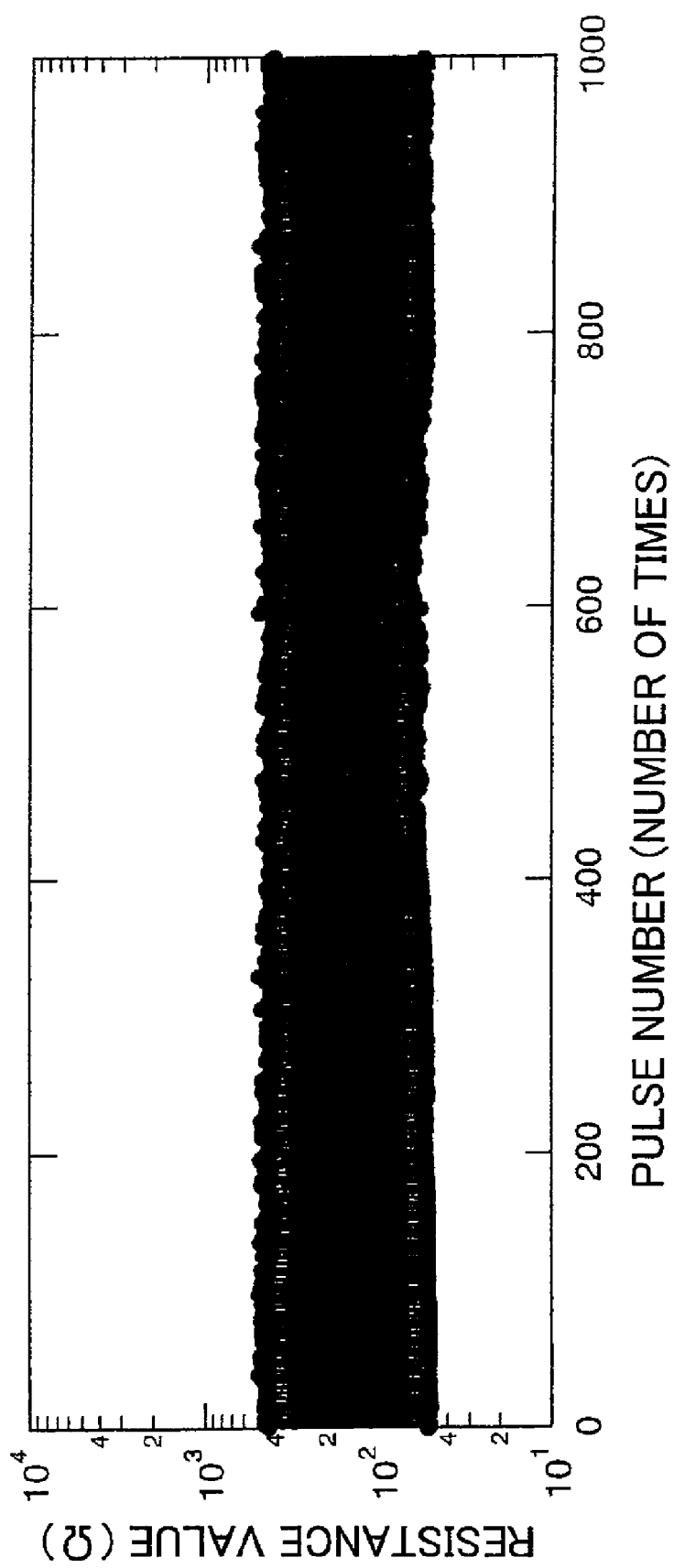
FIG. 11 is a view showing the relationship between the resistance value of the nonvolatile memory element according to Embodiment 1 of the present invention and the number of electric pulses applied.

Also, a phenomenon which is like mixing between the upper electrode mode and the lower electrode mode as shown in FIG. 3 was not observed. For example, FIG. 11 shows a result obtained by applying the electric pulse about 1000 times to an element (different element on the same substrate) which is different from the element F of the measurement result shown in FIG. 10. As can be seen, the resistance changing phenomenon occurred very stably.

From the above, it was discovered that by forming the structure in which the resistance variable layer is sandwiched between the electrode which easily causes resistance changing phenomenon and the electrode which does not easily cause resistance changing phenomenon, resistance changing phenomenon can occur at a desired electrode side, and therefore it is possible to manufacture a resistance variable nonvolatile memory element which is operable stably and thus exhibits a desired bipolar operation. Regarding the relationship between the applied voltage and the resistance value, an operation occurs, in which the resistance value becomes high when a positive voltage electric pulse is applied to the electrode which easily causes resistance changing phenomenon and becomes low when a negative voltage electric pulse is applied to the electrode which easily causes resistance changing phenomenon.

Embodiment 2

In this Embodiment, description will be given of evaluation of easiness with which resistance changing phenomenon occurs when various electrode materials are used. In this Embodiment, resistance changing characteristics in the case where the lower electrode 503 is made of W on a fixed basis and the upper electrode 505 is made of materials other than Pt will be described. The reason why the lower electrode 503 is made of W on a fixed basis is that W is relatively less easily oxidated, is stable and is relatively easily processed.

The manufacturing method of the sample is identical to that described in Embodiment 1. The lower electrodes 503 and the upper electrodes 505 were all deposited by the sputtering process. The oxygen-deficient Ta oxide which is the resistance variable material was deposited by subjecting Ta metal to sputtering in $O_2$ and Ar. To research the characteristic of resistance changing occurring when different electrodes were used, the oxygen-deficient Ta oxides were all set to have the same composition. That is, the oxygen-deficient Ta oxide with oxygen content of about 58% (x is 1.38 when the oxygen-deficient Ta oxide is expressed as $TaO_x$) was used on a fixed basis.

In this Embodiment, since the lower electrode 503 was made of W which does not easily operate, the result of the lower electrode mode (mode in which the element switches to the high-resistance state when the voltage is applied to the lower electrode such that the voltage of the lower electrode is higher than the voltage of the upper electrode) will not be described, but the result of the upper electrode mode (mode in which the element switches to the high-resistance state when the voltage is applied to the upper electrode such that the voltage of the upper electrode is higher than the voltage of the lower electrode) will be described. Although the voltages of the electric pulses for causing the element to change resistance in the upper electrode mode were somewhat different depending on the sample, the voltage for causing the element to switch to the high-resistance state was set to +1.8~+2.0V and the voltage for causing the element to switch to the low-resistance state was set to −1.3~−1.6V, on the basis of the voltage of the lower electrode.

Figure 12:
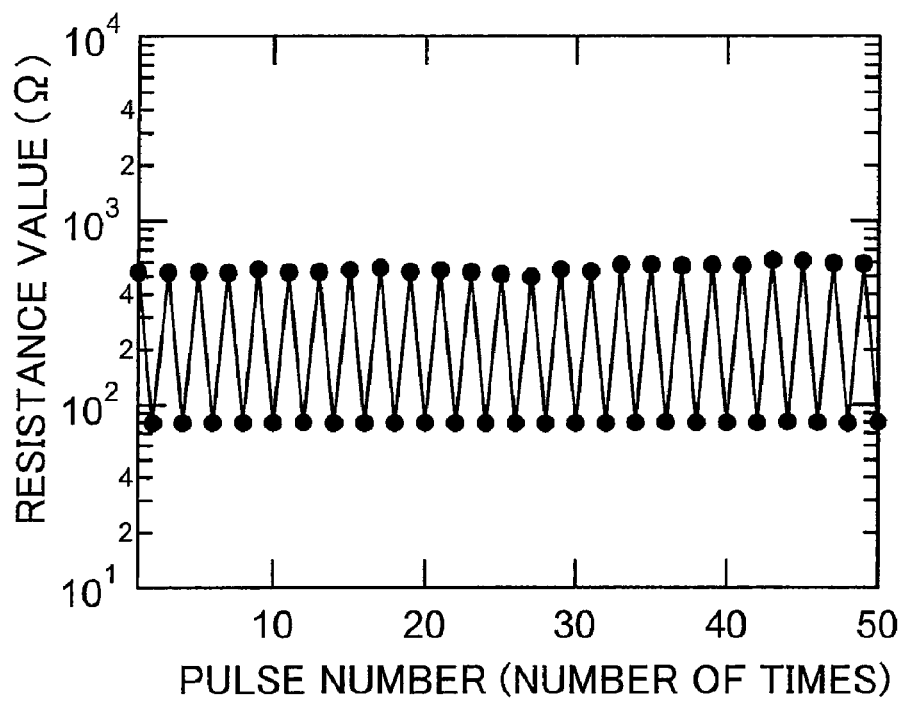
FIG. 12 is a view showing the relationship between the resistance value of the nonvolatile memory element according to Embodiment 2 of the present invention and the number of electric pulses applied.
Figure 13:
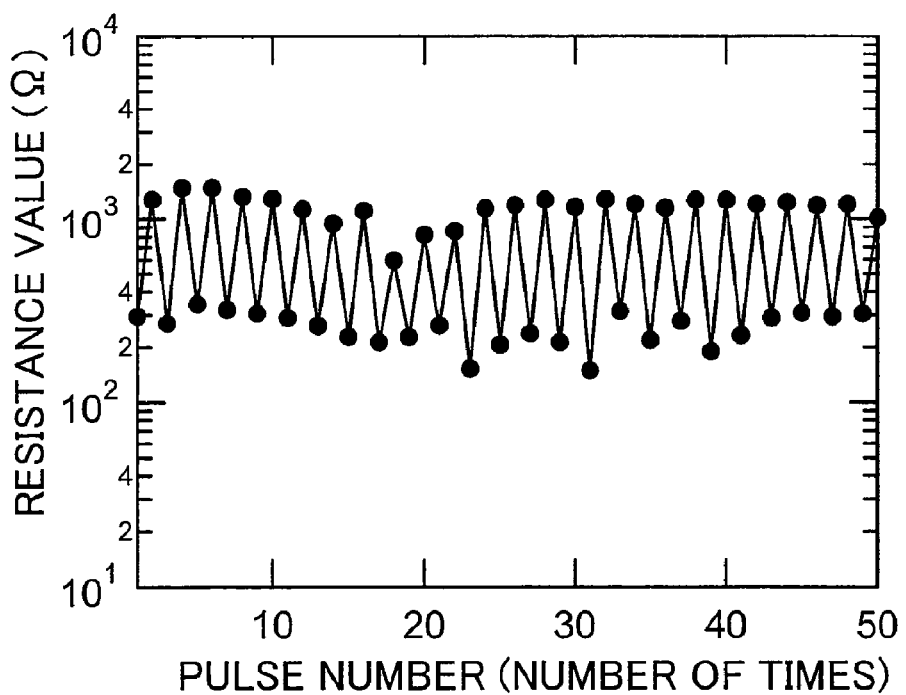
FIG. 13 is a view showing the relationship between the resistance value of the nonvolatile memory element according to Embodiment 2 of the present invention and the number of electric pulses applied.
Figure 14:
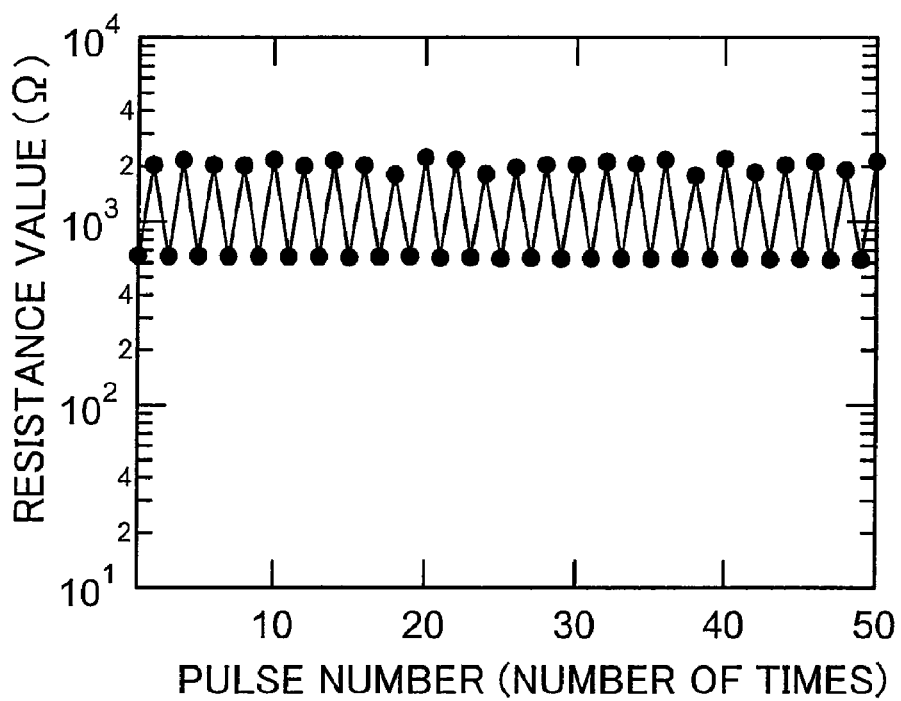
FIG. 14 is a view showing the relationship between the resistance value of the nonvolatile memory element according to Embodiment 2 of the present invention and the number of electric pulses applied.
Figure 15:
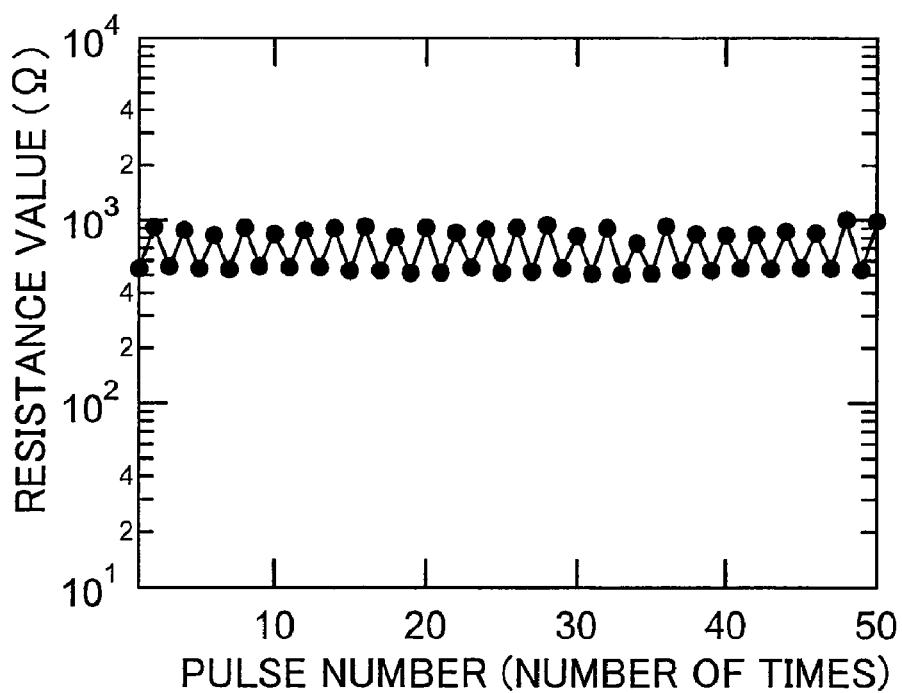
FIG. 15 is a view showing the relationship between the resistance value of the nonvolatile memory element according to Embodiment 2 of the present invention and the number of electric pulses applied.

FIGS. 12 to 19 show measurement results. With reference to the result of an element G including the upper electrode made of Ir, which is shown in FIG. 12, the result of an element H including the upper electrode made of Ag, which is shown in FIG. 13, and the result of an element I including the upper electrode made of Cu, which is shown in FIG. 14, it can be seen that resistance changing phenomenon occurred relatively stably with a large changing magnitude. With reference to the result of an element J including the upper electrode made of Ni, which is shown in FIG. 15, slight resistance changing phenomenon was observed but its changing magnitude was small.

Figure 16:
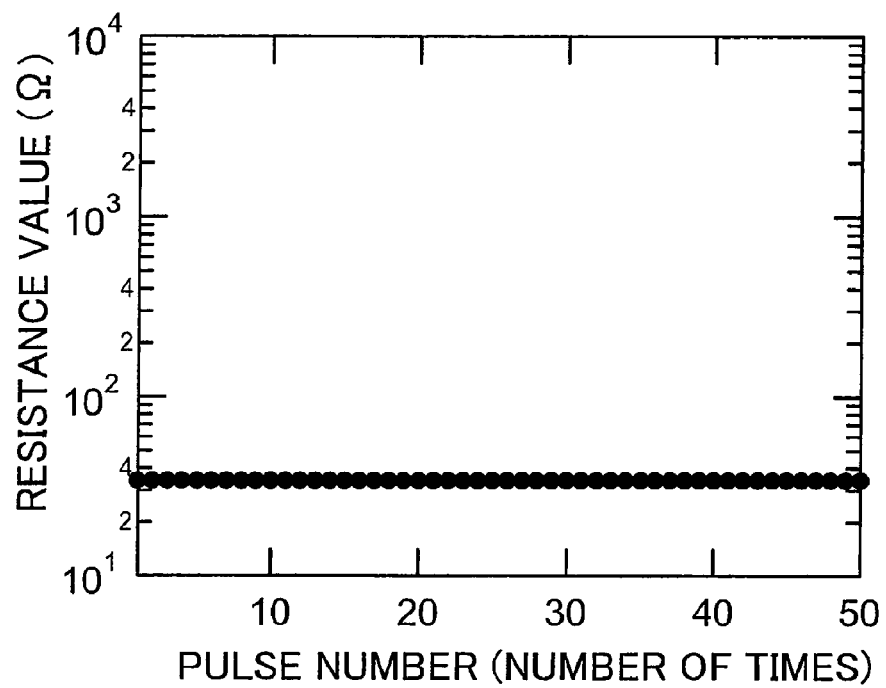
FIG. 16 is a view showing the relationship between the resistance value of the nonvolatile memory element according to Embodiment 2 of the present invention and the number of electric pulses applied.
Figure 17:
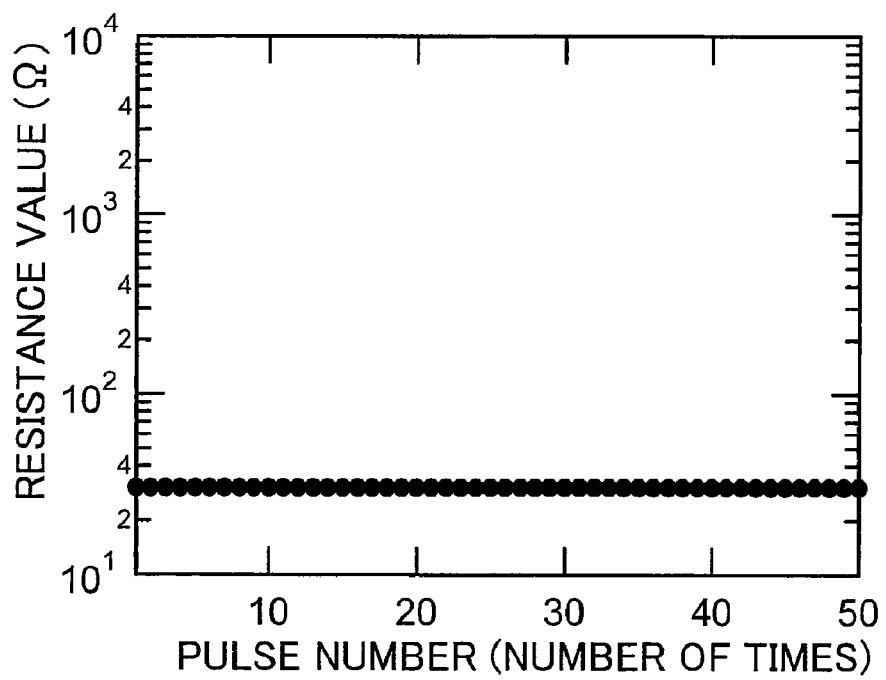
FIG. 17 is a view showing the relationship between the resistance value of the nonvolatile memory element according to Embodiment 2 of the present invention and the number of electric pulses applied.
Figure 18:
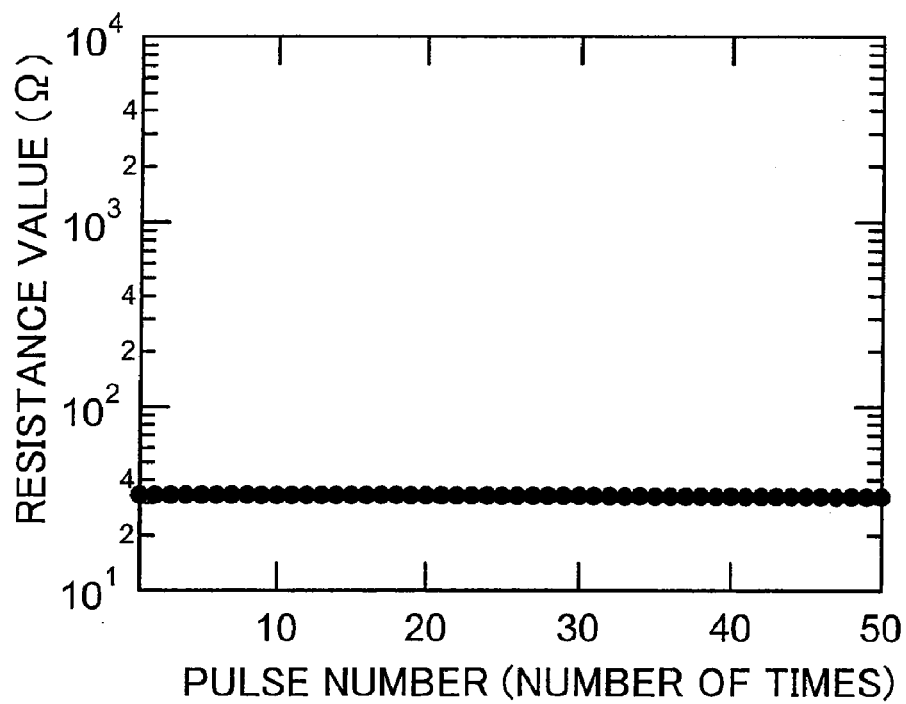
FIG. 18 is a view showing the relationship between the resistance value of the nonvolatile memory element according to Embodiment 2 of the present invention and the number of electric pulses applied.
Figure 19:
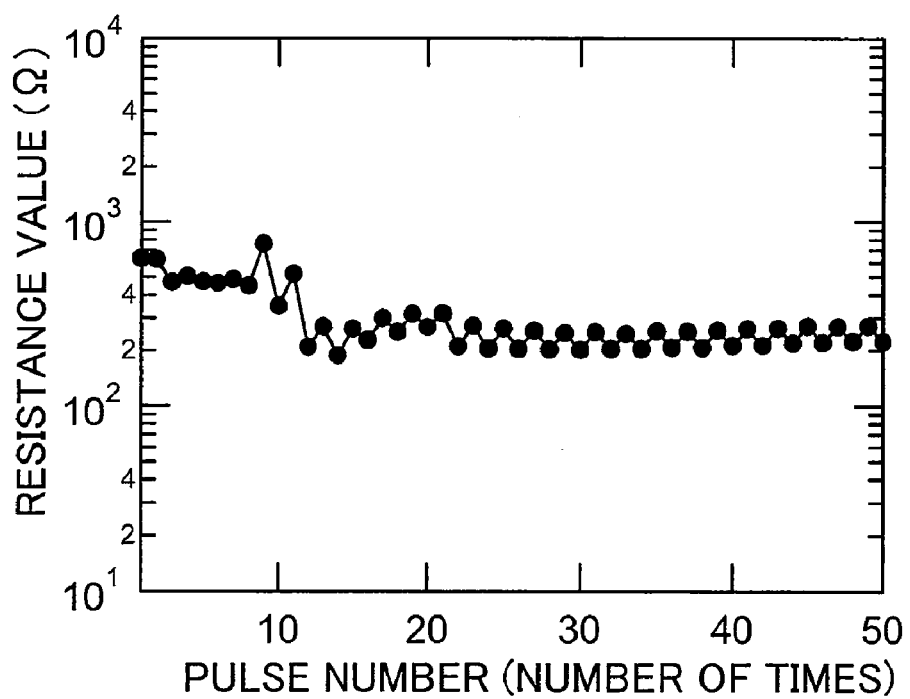
FIG. 19 is a view showing the relationship between the resistance value of the nonvolatile memory element according to Embodiment 2 of the present invention and the number of electric pulses applied.

With reference to the result of an element K including the upper electrode made of Ta, which is shown in FIG. 16, the result of an element L including the upper electrode made of Ti, which is shown in FIG. 17, and the result of an element M including the upper electrode made of Al, which is shown in FIG. 18, any resistance changing phenomenon was not observed at all. With reference to the result of an element N including the upper electrode made of TaN, which is shown in FIG. 19, very slight resistance changing phenomenon was observed. It may be considered that these materials essentially have a characteristic in which resistance changing phenomenon does not easily occur.

From the above results, it is found out that for the nonvolatile memory elements including the oxygen-deficient Ta oxide, there are materials which easily cause resistance changing phenomenon (easily operate) and materials which do not easily cause resistance changing phenomenon (less easily operate). Within the scope of this Embodiment, the electrodes which easily operate are Pt, Ir, Ag, and Cu, while the electrodes which do not easily operate are W, Ni, Ta, Ti, Al and TaN. By forming a resistance variable element having a structure in which the oxygen-deficient Ta oxide is sandwiched between combinations of materials selected from these materials, resistance changing operation which is stable and without mixing between modes is achieved. Nonetheless, with reference to FIGS. 7(a), 10(b), 15 and 19, slight resistance changing phenomenon was observed, using W, Ni, and TaN electrodes. For this reason, by using these materials for one of the electrodes and by using for the other electrode, for example, electrode materials Ta, Ti, and Al, resistance changing phenomenon of which was not observed in the experiment in this Embodiment, slight but stable resistance changing operation is expected.

Figure 20:
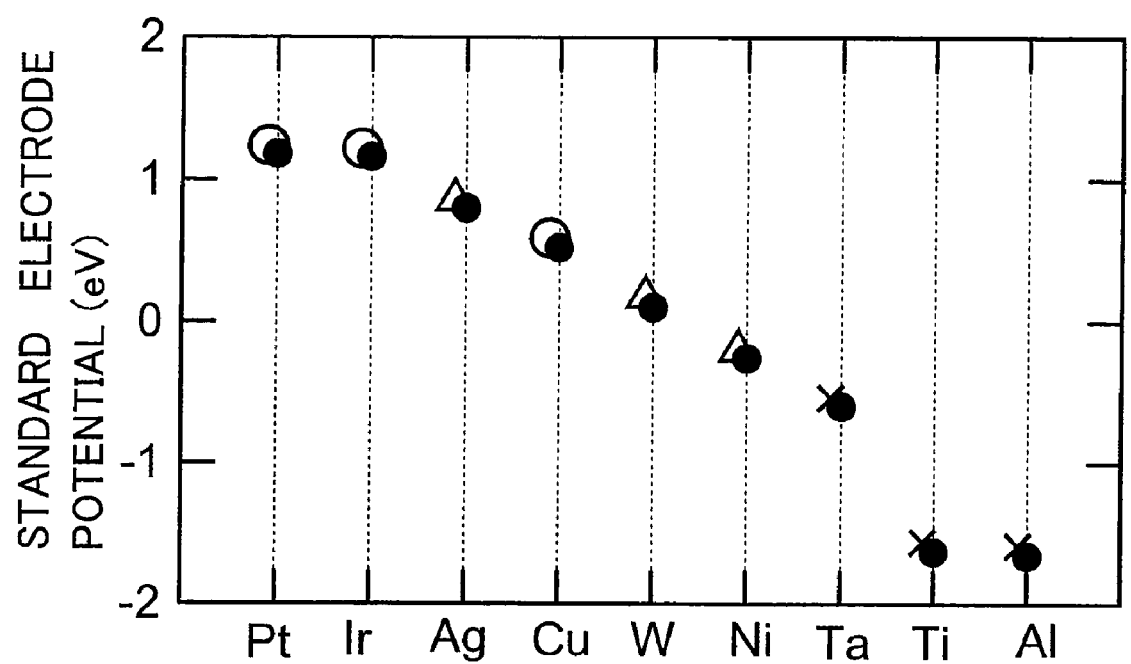
FIG. 20 is a view showing the relationship between electrode materials and standard electrode potentials in the nonvolatile memory elements according to Embodiment 1 and Embodiment 2 of the present invention.

Subsequently, a mechanism for causing resistance changing phenomenon and material dependency of easiness of resistance changing operation will be considered a little. FIG. 20 shows results of Embodiment 1 and Embodiment 2. On a horizontal axis, electrode materials are plotted and on a vertical axis, standard electrode potentials are plotted. In FIG. 20, ○ indicates that resistance changing phenomenon easily occurred, Δ indicates that resistance changing phenomenon occurred with a small magnitude, and X indicates that resistance changing phenomenon did not occur. As can be seen from FIG. 20, resistance changing phenomenon occurred in materials which have higher standard electrode potentials than Ta which was a constituent element of the resistance variable layer and resistance changing phenomenon did not occur in materials having lower standard electrode potentials. In addition, it can be seen that resistance changing phenomenon occurred more easily as the difference in standard electrode potential was larger, while the resistance changing phenomenon occurred less easily as the difference was smaller. In general, the standard electrode potential is an indication of easiness of oxidation. When the value of the standard electrode potential is larger, oxidation less easily occurs, whereas when the value is smaller, oxidation occurs more easily. From this fact, it is presumed that the easiness of oxidation plays an important role in the mechanism of the resistance changing phenomenon.

Figure 21:
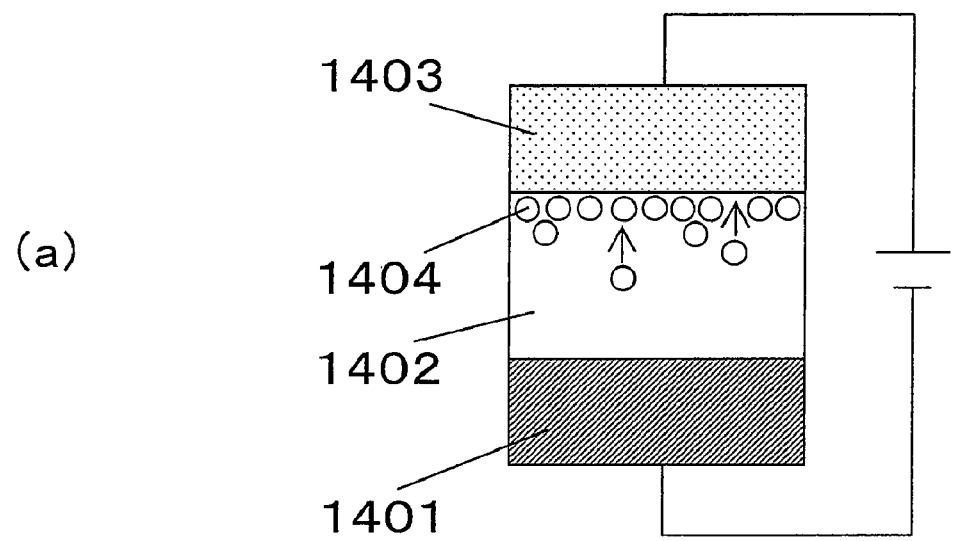
FIG. 21 is a schematic cross-sectional view for explaining the operation of the nonvolatile memory element according to Embodiment 2 of the present invention.
Figure 21:
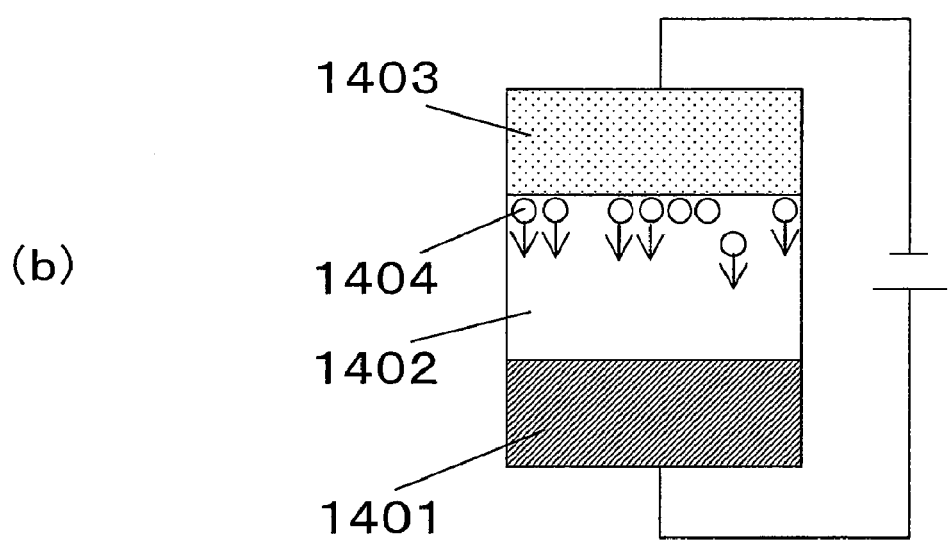

Based on the above result, the mechanism of resistance changing will be described. Firstly, a case where the upper electrode is made of a material which easily causes resistance changing phenomenon (material which has a higher standard electrode potential and is not easily oxidized) will be described with reference to FIG. 21. As shown in FIG. 21(a), in a case where in a resistance variable element including a lower electrode 1401, an oxygen-deficient Ta oxide layer 1402, and an upper electrode 1403 which is made of a material which is oxidated less easily than Ta, the voltage is applied to the upper electrode 1403 such that the voltage of the upper electrode 1403 is higher than the voltage of the lower electrode 1401, oxygen atoms in the oxygen-deficient Ta oxide are converted into ions, which travel due to an electric field and gather to the region in the vicinity of an interface between the Ta oxide layer 1402 and the upper electrode 1403. However, the metal forming the upper electrode 1403 is oxidated less easily than Ta and therefore oxygen ions 1404 stay at the interface between the oxygen-deficient Ta oxide 1402 and the upper electrode 1403 and are bonded to Ta in the region the vicinity of the interface to produce an oxygen-deficient Ta oxide with higher oxygen concentration. As a result of this, the element switches to a high-resistance state. As shown in FIG. 21(b), when a higher voltage is applied to the lower electrode 1401, oxygen atoms are converted into oxygen ions 1401 again and return to the inside of the oxygen-deficient Ta oxide 1402. It is presumed that as a result, resistance switches to a low-resistance state.

Figure 22:
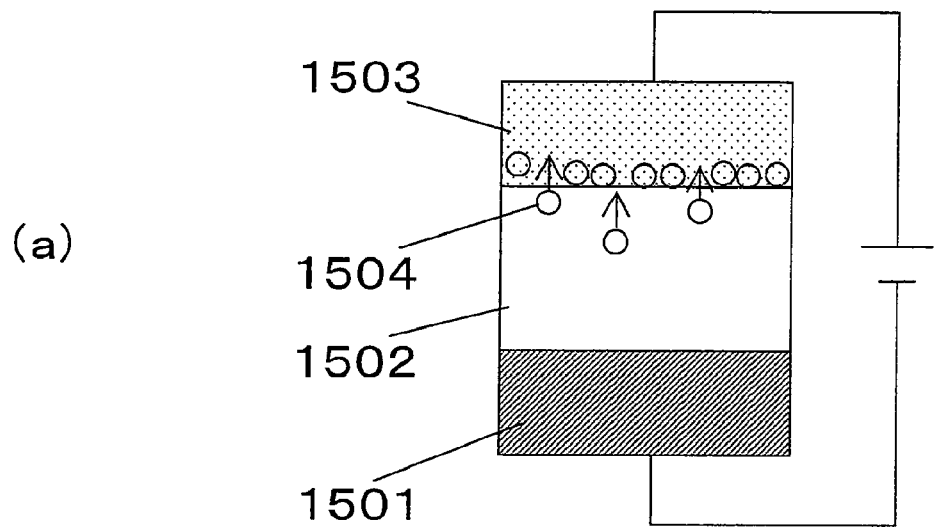
FIG. 22 is a schematic cross-sectional view for explaining the operation of the nonvolatile memory element according to Embodiment 2 of the present invention.
Figure 22:
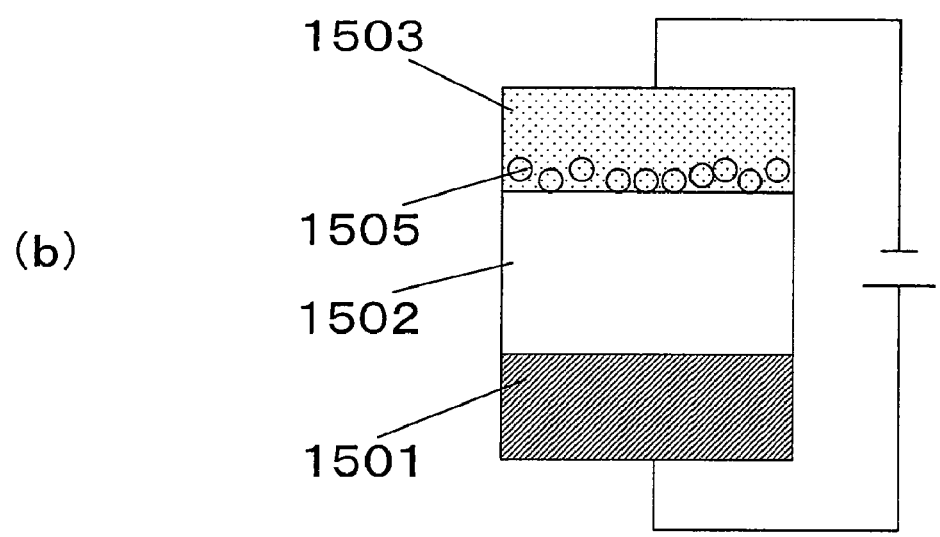

FIG. 22 shows a case where the upper electrode is made of a material which is oxidated more easily than Ta. As shown in FIG. 22(a), in a case where in a resistance variable element including a lower electrode 1501, an oxygen-deficient Ta oxide layer 1502, and an upper electrode 1503 which is made of a material which is oxidated more easily than Ta, the voltage is applied to the upper electrode 1503 such that the voltage of the upper electrode 1503 is higher than the voltage of the lower electrode 1501, oxygen atoms in the oxygen-deficient Ta oxide are converted into ions 1504, which travel due to an electric field and gather to the region in the vicinity of an interface between the Ta oxide layer 1502 and the upper electrode 1503. In this case, since the upper electrode 1503 is oxidated more easily than Ta, the oxygen ions 1504 are sucked into the upper electrode 1503 and are bonded to the material forming the upper electrode 1503. In this case, unlike the example shown in FIG. 21, since a high-resistance layer is not formed at the interface between the oxygen-deficient Ta oxide 1502 and the upper electrode 1503 and the oxygen ions 1504 are fewer than the elements forming the upper electrode 1503, the resistance value does not substantially increase. On the other hand, as shown in FIG. 22(b), it may be considered that when a higher voltage is applied to the lower electrode 1501, oxygen 1505 sucked into the upper electrode 1503 is bonded more stably to the material forming the upper electrode 1503 and therefore is less likely to return to the inside of the oxygen-deficient Ta oxide 1502, and as a result, the resistance value does not change greatly.

Assuming that the materials forming the upper electrodes in the elements shown in FIGS. 21 and 22 are oxidated as easily as Ta, it is presumed that an operation which is substantially intermediate between the operations of the above two examples, i.e., slight resistance changing phenomenon occurs.

As should be understood from the above result, in the nonvolatile memory element using the oxygen-deficient Ta oxide for the resistance variable layer, the upper and lower electrodes may be made of the materials with different standard electrode potentials. This makes it possible to cause resistance changing phenomenon to occur dominantly in the region in the vicinity of one electrode and thus attain ideal bipolar resistance changing characteristics. In addition, mixing between resistance changing modes does not occur, and a stable resistance changing operation is achieved. More suitably, a material which has a higher standard electrode potential than Ta and has a larger standard electrode potential difference with that of Ta may be used as one electrode material and a material which has a higher standard electrode potential than Ta and has a smaller standard electrode potential difference with that of Ta may be used as the other electrode material. Still more suitably, a material which has a higher standard electrode potential than Ta may be used as one electrode material and a material which has a lower standard electrode potential than Ta may be used as the other electrode material. As should be evident from the above mechanism, the element operates such that when a positive voltage electric pulse is applied to the electrode which easily causes resistance changing phenomenon, the resistance value increases, while when a negative voltage electric pulse is applied to the electrode which easily causes resistance changing phenomenon, the resistance value decreases.

Furthermore, in a case where the material forming both of the upper and lower electrodes or only the lower electrode is oxidated as easily as Ta and slight resistance changing phenomenon occurs, the nonvolatile memory element may be configured so that the resistance changing magnitude in the upper electrode mode is larger than the resistance changing magnitude in the lower electrode mode. That is, in this case, there are an upper electrode mode (first mode) in which the resistance value reversibly changes such that R1 and R2 satisfy R1>R2 when a resistance value occurring when a positive voltage is applied to a second electrode on the basis of a first electrode is expressed as R1 and when a resistance value occurring when a negative voltage is applied to the second electrode on the basis of the first electrode is expressed as R2, and a lower electrode mode (second mode) in which the resistance value reversibly changes such that R3 and R4 satisfy R3≧R4 when a resistance value occurring when a negative voltage is applied to the second electrode on the basis of first electrode is expressed as R3 and when a resistance value occurring when a positive voltage is applied to the second electrode on the basis of the first electrode is expressed as R4. The materials of the upper electrode and the lower electrode may be selected so that R1/R2 which is a ratio of R1 to R2 and R3/R4 which is a ratio of R3 to R4 satisfy R1/R2>R3/R4.

Embodiment 3

In this Embodiment, description will be given of an optimal structure of the oxygen-deficient Ta oxide layer for achieving an ideal resistance variable nonvolatile memory element which performs a bipolar operation without the forming process.

[Manufacturing Method of Nonvolatile Memory Element]

Figure 23:
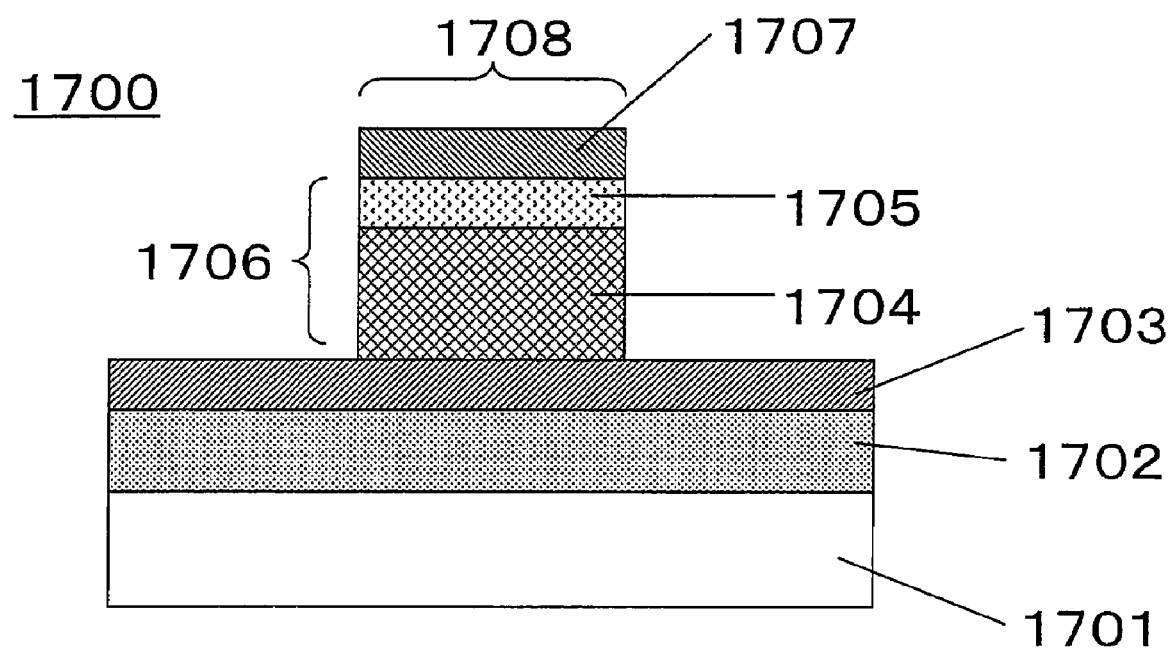
FIG. 23 is a cross-sectional view showing a configuration of a nonvolatile memory element according to Embodiment 3 of the present invention.

To achieve the nonvolatile memory element which is operable without the forming step, the nonvolatile memory element having a structure shown in FIG. 23 was manufactured under control. Hereinafter, the manufacturing steps of the nonvolatile memory element will be described with reference to FIG. 23.

As shown in FIG. 23, initially, over a substrate 1701 which is monocrystalline silicon, a 200 nm-thick oxide layer 1702 was formed by thermal oxidation process. Then, a 100 nm-thick TaN thin film was deposited over the oxide layer 1702 as a lower electrode layer 1703 by a sputtering process. Then, a first oxygen-deficient Ta oxide layer 1704 was deposited over the lower electrode layer 1703 by a reactive sputtering process using a Ta target.

The oxygen-deficient Ta oxide layer of the element manufactured in this Embodiment was manufactured in a sputtering apparatus different from that used in Embodiment 1 and Embodiment 2 and therefore different sputtering conditions were used. To be specific, the substrate was installed in the sputtering apparatus, and then the sputtering apparatus was evacuated to about $8\times10^{-6}$ Pa. Then, using Ta as a target, sputtering was conducted for 20 seconds under the condition in which the power was set to 1.6 kW, argon gas was flowed with a rate of 34 sccm, oxygen gas was flowed at a rate of 21 sccm, and pressure in the sputtering apparatus was kept at 0.17 Pa. As a result, an oxygen-deficient Ta oxide layer having oxygen content of about 61 at % ($TaO_{1.6}$) and a thickness of 30 nm was deposited.

Then, the substrate was introduced into an oxygen plasma generating apparatus, and oxidation process was conducted by exposing the substrate to oxygen plasma under the condition in which the temperature of the substrate was raised up to 250 degrees C. This oxidation process resulted in a Ta oxide layer 1705 which was higher in oxygen content than the oxygen-deficient Ta oxide layer 1704. To distinguish between the oxygen-deficient Ta oxide layer 1704 and the Ta oxide layer 1705, the oxygen-deficient Ta oxide layer 1704 is referred to as a first oxygen-deficient oxide layer. Also, the Ta oxide layer 1705 is expressed as a second Ta oxide layer for some time for convenience (analysis result of the second Ta oxide layer will be described later). Hereinafter, the first oxygen-deficient Ta oxide layer and the second Ta oxide layer will be collectively referred to as a resistance variable layer 1706. Then, over the second Ta oxide layer 1705, a 150-nm thick Pt thin film was deposited as the upper electrode layer 1707 by the sputtering process. Finally, by a photoresist step and a dry etching step, an element region 1708 was formed. The element region 1708 had a square shape of 0.5 μm×0.5 μm. Through the above mentioned steps, the nonvolatile memory element having a structure in which the first oxygen-deficient Ta oxide layer 1704 and the second Ta oxide layer 1705 were sandwiched between the lower electrode 1703 made of TaN and the upper electrode 1707 made of Pt was manufactured. Hereinafter, this element is referred to as element O.

As a comparative example, an element having a structure shown in FIG. 5 in which the surface of the first oxygen-deficient Ta oxide layer was not oxidated by oxygen plasma was manufactured. To be specific, a nonvolatile memory element having a structure in which the first oxygen-deficient Ta oxide layer 504 was sandwiched between the lower electrode 503 made of Ta nitride and the upper electrode 505 made of Pt was manufactured. Hereinafter, this element is referred to as an element P. Table 3 illustrates oxygen plasma process times of the element O and the element P and initial resistances of the elements as described below.

TABLE 3

|  | Element O | Element P |
|---|---|---|
| Oxidation method | Oxygen plasma oxidation (250 degrees C.) | No oxidation |
| Initial resistance (Ω) | 1060 | 192 |

[Resistance Changing Characteristics of Element O and Element P]

Subsequently, the characteristics obtained when resistance changing phenomenon is caused to occur by applying electric pulses to the element O and the element P manufactured actually in this Embodiment will be described.

Figure 24:
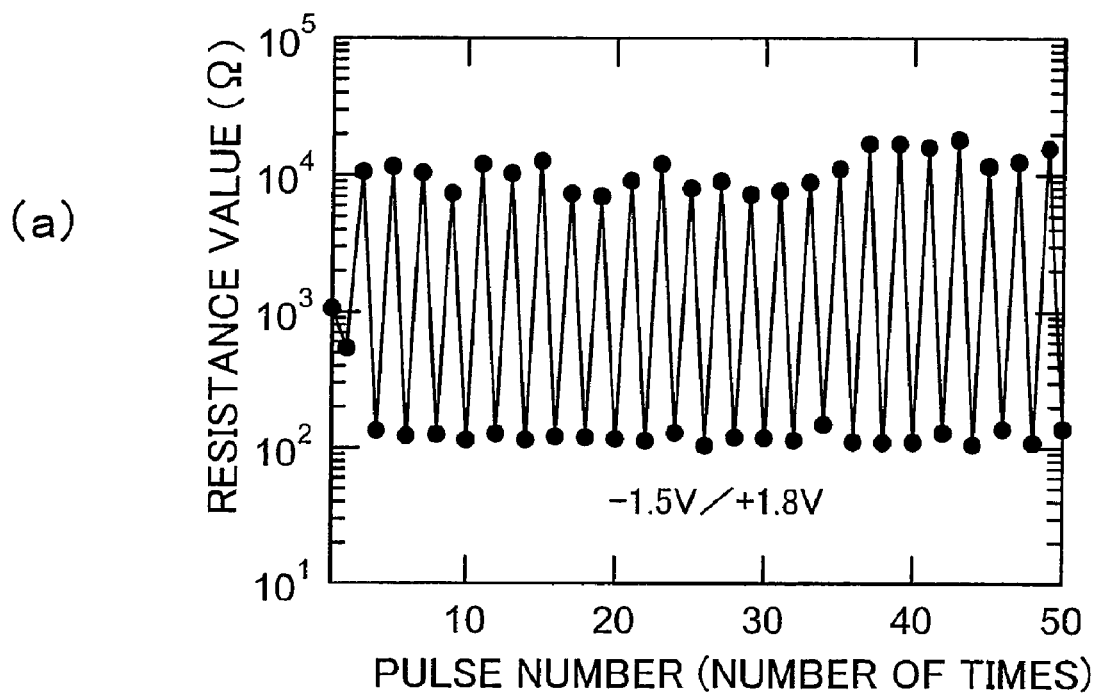
FIG. 24 is a view showing the relationship between a resistance value of a resistance variable layer included in a nonvolatile memory element according to Embodiment 3 of the present invention and the electric pulses applied.
Figure 24:
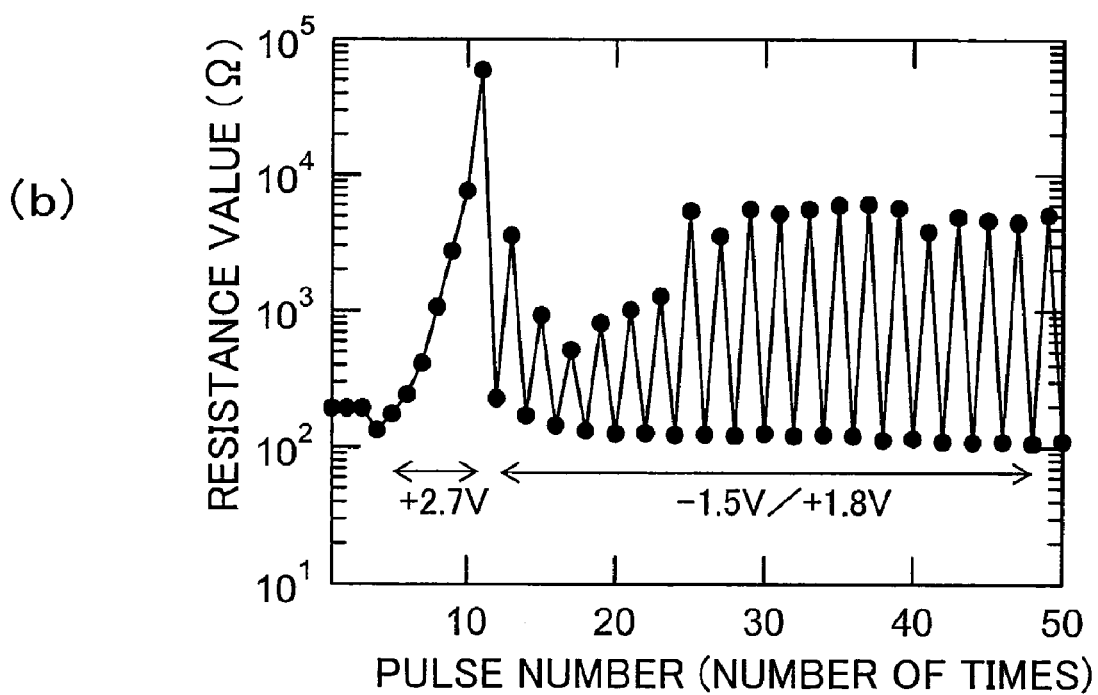

FIG. 24 is a view showing the relationship between a resistance value of a resistance variable layer included in a nonvolatile memory element according to this Embodiment of the present invention and the electric pulses applied. FIGS. 24(a) and 24(b) show measurement results of the element O and the element P, respectively.

Firstly, the measurement results of the initial resistances of the element O and the element P will be considered. The initial resistance of each element was measured by applying a low voltage of 50 mV which was lower than a threshold voltage (low voltage which does not cause resistance changing phenomenon, typically about 1V) between the lower electrode layer and the upper electrode layer in each element and by measuring a current flowing therethrough. As a result, the initial resistance of the element O was 1060Ω and the initial resistance of the element P was 192Ω. The initial resistance of the element O formed by oxidating the first oxygen-deficient Ta oxide layer was higher (see table 3 and FIG. 24). It implies that the resistance of the element O was higher because of the presence of the second Ta oxide layer which had higher oxygen concentration and higher resistance.

Subsequently, the resistance changing characteristics of the element O and the element P will be described. In this Embodiment, a case where the element is operated at the upper electrode side where the second Ta oxide layer is formed will be described. In other words, a result of the case where the element is operated in a mode in which resistance increases when an electric pulse of a positive voltage is applied to the upper electrode will be described. Firstly, the result of the element O formed by conducting oxidation using oxygen plasma to form the second Ta oxide layer will be described. As can be seen from the result of FIG. 24(a), when a negative voltage −1.5V was applied to the nonvolatile memory element just after manufacture, an initial resistance value which was about 1060Ω decreased to about 500Ω, while it increased up to about 10000Ω when a positive voltage of 1.8V was applied thereto. After that, the resistance value changed between about 100Ω and about 10000Ω by applying the electric pulse of the negative voltage −1.5V and the electric pulse of the positive voltage 1.8V alternately, and favorable resistance changing phenomenon occurred. That is, without the forming step, resistance changing phenomenon occurred at the upper electrode side. On the other hand, FIG. 24(b) shows a result of the element P in which the first oxygen-deficient Ta oxide layer was not oxidated, which result was significantly different from the above result. That is, the element P just after manufacture did not exhibit resistance changing characteristics at all even though the negative voltage of −1.5V and the positive voltage of 1.8V were applied to the element P. Accordingly, when the electric pulses continued to be applied with a positive voltage of 2.7V as a fixed value, the resistance value gradually increased and increased up to 100000Ω at the time point when the pulse number was 11 times. Then, when the pulse of the voltage −1.5V was applied, the resistance value decreased to about 200Ω. After that, the resistance increased and decreased by applying the electric pulses of voltages of +1.8V and −1.5V. It may be judged that the element P just after manufacture did not operate and required the forming step (initial step in which the voltage of +2.7V continued to be applied) to cause resistance changing phenomenon. From the above results, it implies that the second Ta oxide layer is required to operate the nonvolatile memory element without the forming step.

The role of the second Ta oxide layer has not been made clear yet at present time when the mechanism of the resistance changing phenomenon is not clear. Assuming that the resistance changing phenomenon of the resistance variable nonvolatile memory element of this Embodiment is caused to occur by the migration of oxygen atoms at the interface between the electrode and the Ta oxide layer as described in Embodiment 2, there is a possibility as described below. That is, the second Ta oxide layer may possibly serves to effectively apply a voltage to the region in the vicinity of the interface. In other words, it is considered that the resistance changing phenomenon occurs by the fact that the oxygen atoms gather to or diffuse from the region in the vicinity of the interface between the upper electrode 1707 and the resistance variable layer 1706 due to an electric field. To be specific, negatively charged oxygen atoms gather to the upper electrode 1707 side upon application of a positive voltage to the upper electrode 1707 and a high-resistance layer is formed, causing the element to switch to a high-resistance state. On the other hand, upon application of a negative voltage, the oxygen atoms diffuse into the Ta oxide layer, resulting in lowered resistance. If the second Ta oxide layer 1705 which is the high-resistance layer is present at the interface, this region is subjected to a high voltage, and the oxygen is injected into the high-resistance layer 1705. Thereby, the oxygen content of the high-resistance layer 1705 further increases and the high-resistance layer 1705 is close to $Ta_2O_5$ having a stoichiometric composition which is known as an insulator. As a result, the resistance of the element itself increases and the element switches to the high-resistance state. That is, the second Ta oxide layer serves to trigger resistance changing phenomenon. However, if the second Ta oxide layer 1705 which is the high-resistance layer is not present at the interface, the voltage is applied uniformly to the resistance variable layer 1706, and the high-resistance layer which is close to an insulator is less likely to be formed in the vicinity of the interface. As a result, the resistance changing phenomenon is less likely to occur. However, even in the structure in which the second Ta oxide layer 1705 is not present, if a layer which is similar to the second Ta oxide layer 1705 is formed once by so-called forming step, for example, by applying a voltage higher than the voltage for operating the element steadily or by applying electric pulses many times, stable resistance changing operation will follow.

Considering the results obtained in this Embodiment in conjunction with the above Embodiments 1 and 2, it is possible to achieve a nonvolatile memory element which performs a bipolar operation without the forming step and stably operates without mixing between switching modes, by forming the nonvolatile memory element by combining the second Ta oxide layer with an optimal electrode material. That is, the structure of the element of FIG. 23 may be formed by using the electrode material (e.g., Ta, Ti, Al, etc.) which does not easily operate for the lower electrode 1703 and by using the electrode material (e.g., Pt, Ir, Ag, Cu, etc.) which easily operates for the upper electrode 1707. This makes it possible to achieve a nonvolatile memory element which performs stable operation that the resistance value increases by applying the electric pulse of the positive voltage to the upper electrode, without the forming step.

On the other hand, if the structure of the element of FIG. 17 is formed by using the electrode material which easily operates for the lower electrode 1703 and by using the electrode material which does not easily operate for the upper electrode 1707, resistance changing phenomenon will not occur unless the forming step is performed. That is, to operate the nonvolatile memory element without the forming step, it is necessary to dispose the electrode material which easily operates at the side where the second Ta oxide layer is located.

[Analysis of Ta Oxide Layer]

To analyze the resistance variable layer 1706 manufactured in this Embodiment, a sample for analysis was prepared as described below. To be specific, a sample was prepared in such a manner that over a substrate which was provided with a 200 nm-thick oxide layer on a monocrystalline silicon substrate and did not have an element pattern, 30 nm-thick Ta oxide layer having oxygen content of about 61 at % ($TaO_{1.6}$) which was similar to the first oxygen-deficient Ta oxide layer was deposited and then oxidated by oxygen plasma under a substrate temperature of 250 degrees C. This sample corresponds to the resistance variable layer 1706 of the element O, and therefore is referred to as sample O' hereinafter. It should be noted that the sample O' was different from the element O in that the upper electrode layer which is an obstruction to analysis was not formed in the element O'.

The sample O' manufactured as described above was analyzed by a method called the X-ray reflectometry which is suitable for analysis of a very thin film (manufacturer: Rigaku, software name: X-ray reflectivity data processing software). In this method, X-ray is caused to enter the surface of the sample at a small angle, and intensity of the reflected X-ray is measured. Fitting is performed assuming a proper structure model with respect to the spectra, and the layer thickness and refractive index of the resistance variable layer in the sample for analysis is evaluated. In the present case, parameters of the fitting are layer structure of the oxygen-deficient Ta oxide, layer thicknesses and $\delta(=1-\text{refractive index})$ of the respective layers.

Figure 25:
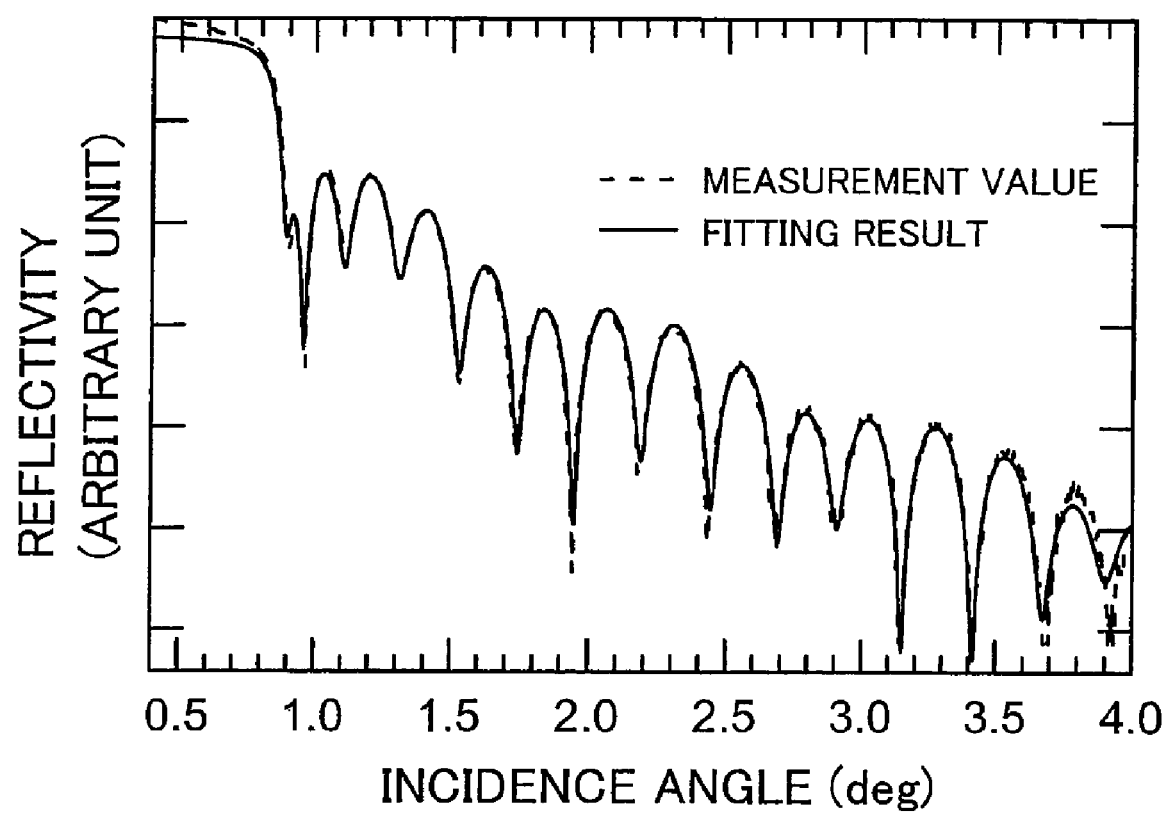
FIG. 25 is a view showing X-ray reflectivity spectra of a resistance variable layer made of a tantalum oxide according to Embodiment 3 of the present invention.

FIG. 25 shows measurement result. In FIG. 25, a horizontal axis indicates an incidence angle of X-ray and a vertical axis indicates the reflectivity of the X-ray. FIG. 25 indicates a pattern (broken line) obtained by actual measurement of the X-ray reflectivity of the sample for analysis and a result (solid line) of fitting performed assuming that two oxygen-deficient Ta oxide layers were present on the substrate. As can be seen from FIG. 25, the reflectivity pattern obtained by actual measurement and the reflectivity pattern obtained by the fitting conformed to each other very well. Although not shown, measurement data was not be able to be reproduced well when fitting was conducted assuming that a single oxygen-deficient Ta oxide layer was present on the substrate.

Table 4 indicates analysis results obtained by the fitting performed assuming this two-layer structure.

TABLE 4

| | | | Sample O' |
|---|---|---|---|
| Oxidation method | | | Oxygen plasma oxidation (250 degrees C.) |
| X-ray reflectivity measurement result | $TaO_x$ layer | Layer thickness (nm) | 26.6 |
| | | $\delta$ | $28.5 \times 10^{-6}$ |
| | | X | 1.54 |
| | $TaO_y$ layer | Layer thickness (nm) | 8.1 |
| | | $\delta$ | $22.2 \times 10^{-6}$ |
| | | Y | 2.47 |

As can be seen from this table, the layer thickness of the first oxygen-deficient Ta oxide layer located at the substrate side was 26.6 nm, and $\delta$ of the first oxygen-deficient Ta oxide layer was $28.5 \times 10^{-6}$, while the layer thickness of the second Ta oxide layer located at the surface side was 8.1 nm, and $\delta$ of the second Ta oxide layer was $22.2 \times 10^{-6}$. It is difficult to derive a correct composition from the values of $\delta$. But, it can be roughly estimated from the fact that $\delta$ of metal Ta is $39 \times 10^{-6}$ and $\delta$ of $Ta_2O_5$ is $22 \times 10^{-6}$, etc. When the first oxygen-deficient Ta oxide layer is expressed as $TaO_x$, x is calculated as 1.54. The first oxygen-deficient Ta oxide layer may be regarded as a Ta oxide having a non-stoichiometric composition as initially set. When the second Ta oxide layer is expressed as $TaO_y$, y is calculated as 2.47. This value is very close to a value of $Ta_2O_5$ ($TaO_{2.5}$) which is a Ta oxide having a stoichiometric composition, but the second Ta oxide layer is in slightly oxygen-deficient state.

The above results are measurement results of the samples prepared for analysis, as described firstly. But, it may be presumed that the element O produced actually has substantially the same structure. That is, it is presumed that the element O has a structure in which the two-layer structure consisting of the first oxygen-deficient Ta oxide layer 1704 and the second Ta oxide layer 1705 is sandwiched between electrodes.

Consider the second Ta oxide layer a little. As described above, the second oxygen-deficient Ta oxide had a composition close to $Ta_2O_5$ having a stoichiometric composition. However, from simple consideration described below, the second Ta oxide layer has an electric characteristic which is far from the electric characteristic of an insulator.

In general, $Ta_2O_5$ having a stoichiometric composition is regarded as an insulator. The insulator is generally defined as a material having a resistivity of $10^8$ Ωcm or higher (Presented by "Semiconductor Engineering for Integrated Circuit" Industry Search Committee (1992) Usami Akira, Kanefusa Shinji, Maekawa Takao, Tomokage Hajime, Inoue Morio). Assuming that the second Ta oxide layer of this Embodiment is an insulator and has a resistivity of $10^8$ Ωcm, the resistance value should be about $4\times10^9$ Ω (calculated according to "resistance value=resistivity×layer thickness/area"), if it has a square shape of 0.5 μm×0.5 μm (area of the element region 1708 in this Embodiment) and a layer thickness of 8 nm (approximately layer thickness of the second Ta oxide layer). If the layer thickness of the second Ta oxide layer is 1 nm, the resistance value is $5\times10^8$ Ω. On the other hand, the initial resistance of the element O is about 1000Ω with reference to table 3 and is at least about 6-7 digit lower than that in the case where the second Ta oxide layer is assumed as an insulator. From this calculation result, it is found out that the second Ta oxide layer manufactured in this Embodiment is not an insulator but an electrically-conductive oxide layer. The reason why the second Ta oxide layer has a low resistance regardless of the fact that its composition is close to that of $Ta_2O_5$ which is an insulator, may be that oxygen is deficient, defects are formed in a layer and a current flows through the defects. Based on the above result, the second Ta oxide layer is hereinafter referred to as an electrically-conductive second oxygen-deficient Ta oxide layer or simply referred to as second oxygen-deficient Ta oxide layer.

Although in this Embodiment, TaN is used for the lower electrode and Pt is used for the upper electrode, the materials are not limited to these. That is, the nonvolatile memory element may be formed by a combination of the electrode which easily operates and the electrode which does not easily operate as described in Embodiment 2. To be specific, the structure of the element of FIG. 23 may be formed by using the electrode material (e.g., Ta, Ti, Al etc.) which does not easily operate for the lower electrode 1703 and by using the electrode material (e.g., Pt, Ir, Ag, Cu, etc.) for the upper electrode 1707. This makes it possible to achieve a nonvolatile memory element which performs stable operation that the resistance value increases when the electric pulse of the positive voltage is applied to the upper electrode 1707 without the forming step.

Figure 26:
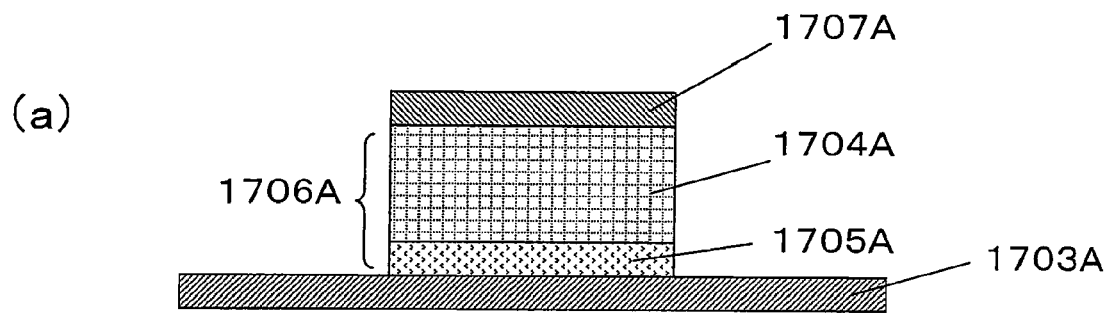
FIG. 26 is a cross-sectional view showing a configuration of a nonvolatile memory element according to Embodiment 3 of the present invention.
Figure 26:
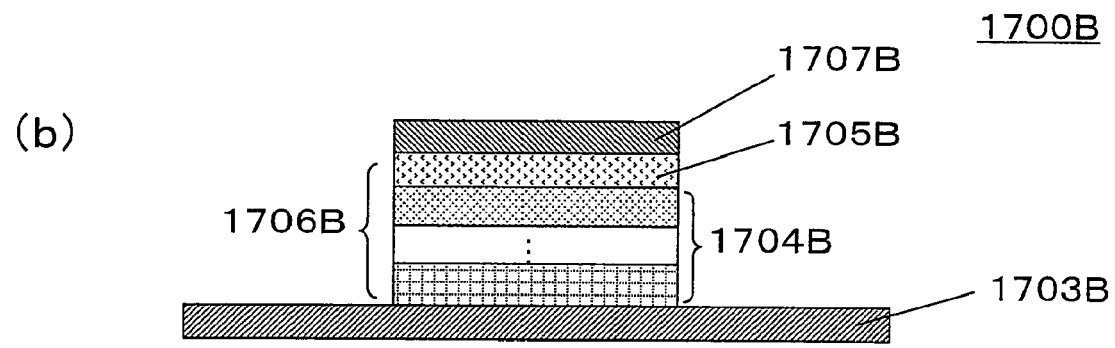

The structure of the nonvolatile memory element is not limited to the structure shown in FIG. 23. The electrode material which easily operates may be in contact with the second oxygen-deficient Ta oxide which has high oxygen concentration and high resistance. Therefore, as shown in FIG. 26(*a*), a second oxygen-deficient Ta oxide layer 1705A may be deposited over a lower electrode 1703A. In this case, by using the electrode which easily operates for the lower electrode 1703A and the electrode which does not easily operate for the upper electrode 1707A, it is possible to achieve a nonvolatile memory element which stably exhibits resistance changing characteristics stably that it switches to the high-resistance state by applying a positive voltage to the lower electrode without the forming step.

It is difficult to form the second oxygen-deficient Ta oxide layer 1705A in the example of FIG. 26(*a*) by oxidation, but it is possible to deposit it by sputtering or chemical vapor deposition. For example, in the case of the sputtering process, firstly, the second Ta oxide layer 1705A which has high oxygen content and a high-resistance may be deposited by conducting sputtering with high oxygen gas flow ratio during the deposition, and then the first Ta oxide layer 1704A may be deposited with the oxygen gas flow ratio set lower.

As shown in FIG. 26(*b*), a first oxygen-deficient Ta oxide layer 1704B may be composed of two or more Ta oxide layers which are different in composition, instead of a single layer. Or, the first oxygen-deficient Ta oxide layer 1704B may be formed by a Ta oxide layer having a composition changing continuously. It should be noted that in this case, the oxygen content of the second oxygen-deficient Ta oxide layer 1705B must be higher than those of the layers compositing the first oxygen-deficient Ta oxide layer 1704B. In FIG. 26(*b*), the second oxygen-deficient Ta oxide layer 1705B and the upper electrode are illustrated as being in contact with each other for the convenience. Alternatively, as shown in FIG. 26(*a*), the second oxygen-deficient Ta oxide layer 1705B may be located at the lower electrode side.

Embodiment 4

In Embodiment 3, the resistance changing characteristics and the structure of the nonvolatile memory element including about 8 nm-thick second oxygen-deficient Ta oxide layer have been described. In this Embodiment, a result obtained by forming a thinner second oxygen-deficient Ta oxide layer will be described.

In this Embodiment, results of experiments conducted to confirm only how the second oxygen-deficient Ta oxide layer affects the resistance changing operation of the nonvolatile memory element will be described. The element manufactured includes upper and lower electrodes made of Pt. Since the nonvolatile memory element of this Embodiment is the same as the nonvolatile memory element of Embodiment 2 in constituents composing the element but is different from the same in materials forming the element, the manufacturing method will be described with reference to FIG. 23.

[Manufacturing Method of Nonvolatile Memory Element]

The second oxygen-deficient Ta oxide layer of the nonvolatile memory element manufactured in this Embodiment was deposited within the sputtering apparatus in which the first oxygen-deficient Ta oxide layer was deposited. Hereinafter, a specific procedure will be described.

The procedure for manufacturing the element is similar to those of Embodiment 1 to Embodiment 3. Initially, a layer structure of the substrate 1701, the oxide layer 1702, and the lower electrode 1703 made of Pt was formed. Then, over the lower electrode layer 1703, the first oxygen-deficient Ta oxide layer 1704 was deposited by so-called reactive sputtering for subjecting Ta target to sputtering in argon gas and oxygen gas. The film deposition conditions in this case were such that the sputtering power was set to 250 W, the total gas pressure which is a sum of Ar gas pressure and $O_2$ gas pressure was set to 3.3 Pa, the oxygen gas flow ratio was set to 3.4%, the substrate temperature was set to 30 degrees C. and the film deposition time was set to 7 minutes as in Embodiment 1 and Embodiment 2. As a result, the first oxygen-deficient Ta oxide layer 1704 which was 30 nm-thick and had oxygen content of about 58 at %, i.e., expressed as $TaO_{1.4}$ was deposited.

Thereafter, while keeping the sputtering conditions such as the gas pressure condition and the power, a shutter was inserted between the Ta target and the substrate 1701 placed opposite to the Ta target, which state was kept for a specified time. Thereby, the uppermost surface of the first oxygen-deficient Ta oxide layer 1704 was oxidated by oxygen plasma. As a result, the second oxygen-deficient Ta oxide layer 1705 which was higher in oxygen content than the first oxygen-deficient Ta oxide layer 1704 was deposited over the surface of the first oxygen-deficient Ta oxide layer 1704 (analysis result of the second oxygen-deficient Ta oxide layer 1705 will be described later).

Thereafter, over the second Ta oxide layer 1705, the upper electrode layer 1707 made of Pt was deposited, and the element region 1708 was formed by a photoresist step and a dry etching step. In this Embodiment, the element region 170 had a circular shape of 3 μm-diameter and is provided like an island.

In this Embodiment, element Q and element R were manufactured by changing an oxidation time (i.e. oxygen plasma exposure time) using the above described oxygen plasma. As a comparative example, element S was manufactured without exposure to the oxygen plasma. To be specific, the element R was manufactured in such a manner that the upper electrode was deposited just after the first oxygen-deficient Ta oxide was deposited. Table 5 shows the relationship between the manufactured elements and the oxygen plasma exposure time.

TABLE 5

|  | Element Q | Element R | Element S |
| --- | --- | --- | --- |
| Oxygen plasma exposure time (minute) | 0.5 | 1 | 0 |
| Initial resistance(Ω) | 650 | 1890 | 11 |

Hereinafter, the characteristics and the like of the elements Q, R, and S manufactured as described above will be described.

[Resistance Changing Characteristics of Elements Q, R, S]

Firstly, the initial resistances of the element Q, the element R, and the element S were measured and the results are described in table 5. The initial resistance of each element was measured by applying a low voltage of 50 mV which was lower than a threshold voltage between the lower electrode layer and the upper electrode layer in each element and by measuring a current flowing therethrough. With reference to table 5, the initial resistance of the element Q (oxygen plasma exposure time: 0.5 minute) was 650Ω and the initial resistance of the element R (oxygen plasma exposure time: 1 minute) was 1890Ω. On the other hand, the initial resistance of the element S (oxygen plasma exposure time: 0 minute) was 11Ω and was a very small value. From this result, it is interpreted that the second oxygen-deficient Ta oxide layer was formed by exposing the first oxygen-deficient Ta oxide layer to oxygen plasma and thereby the initial resistance increased.

Subsequently, the characteristics obtained by applying the electric pulses to the element Q and the element R to cause resistance changing phenomenon will be described.

Figure 27:
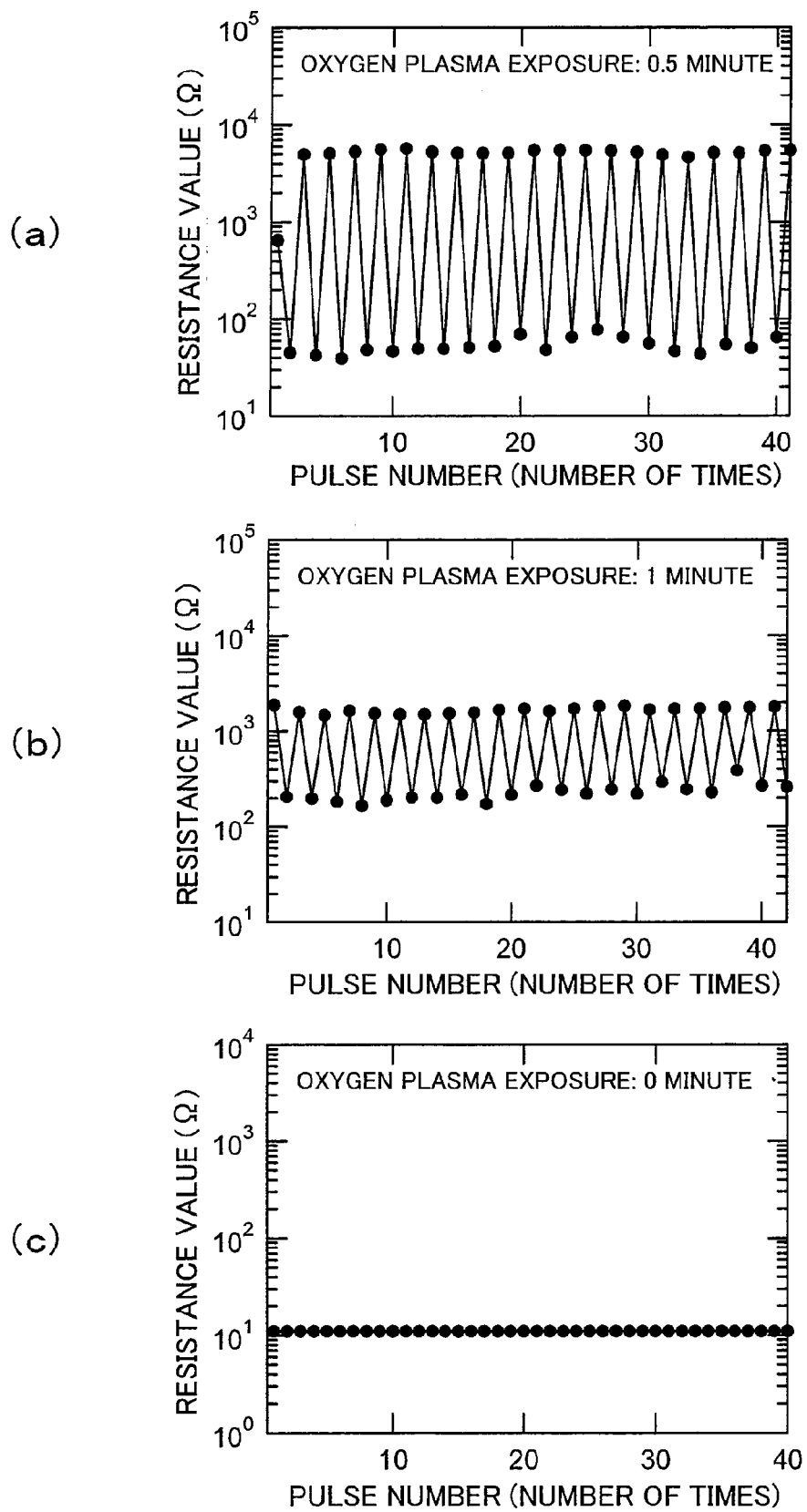
FIG. 27 is a view showing the relationship between a resistance value of a resistance variable layer included in a nonvolatile memory element according to Embodiment 4 of the present invention and the number of the electric pulses applied.

FIG. 27 is a view showing the relationship between the resistance value of the resistance variable layer included in the nonvolatile memory element according to this Embodiment and the electric pulses applied. FIGS. 27(a) to 27(c) are views showing measurement results of the element Q, the element R and the element S, respectively. In this case, to cause the resistance changing phenomenon, two kinds of electric pulses of a negative voltage pulse of −2.0V and a positive voltage pulse of 3.0V, and of each pulse width of 100 ns were applied alternately repetitively between the lower electrode layer 1703 and the upper electrode layer 1707.

With reference to FIG. 27(a) showing the resistance changing characteristic of the element Q obtained by irradiation with the oxygen plasma for 0.5 minute, it is seen that the resistance value decreased from 650Ω to about 50Ω when the electric pulse of a negative voltage of −2.0V was applied to the sample in an initial state just after the measurement. After that, it was confirmed that the resistance value increased up to 5000Ω in response to the electric pulse of a positive voltage of 3.0°V, and thereafter reversible resistance changing phenomenon occurred very stably between 50Ω and 5000Ω. In other words, without the forming step, stable resistance changing characteristics was observed abruptly.

As can be seen from FIG. 27(b), the element R obtained by irradiation with oxygen plasma for one minute caused reversible resistance changing phenomenon stably within a measurement range. When the electric pulse of −2V was applied to the element whose initial resistance value was 1890Ω, the resistance value decreased to about 200Ω, and when the electric pulse of +3V was applied to the element next, the resistance value increased up to 2000Ω. In this case, also, resistance changing phenomenon occurred stably without the forming step.

On the other hand, with reference to FIG. 27(c) showing the resistance changing characteristic of the element S, it is found out that resistance changing phenomenon did not occur even if two kinds of electric pulses of −2.0V and 3.0V were applied thereto. The element R was manufactured in such a manner that the oxygen plasma exposure time was 0 minute, i.e., the second electrode 1707 was deposited just after the first oxygen-deficient Ta oxide layer 1704 was deposited. It is presumed that the second oxygen-deficient Ta oxide layer 1705 was not present or otherwise was very thin if it was. From these results, the second oxygen-deficient Ta oxide layer 1705 is required to cause resistance changing phenomenon without the forming process.

As should be appreciated from the above, reversible resistance changing characteristics can be confirmed in the element Q and the element R each having the second oxygen-deficient Ta oxide layer 1705. Hereinafter, the result of analysis of the Ta oxide layers corresponding to the element Q and the element R will be described.

[Analysis of Ta Oxide Layer]

To analyze the structure of the resistance variable layers 1706 in the element Q and the element R, samples for analysis were manufactured and analyzed as in above described Embodiment 3.

To be specific, the samples were prepared in such a manner that over a substrate in which a 200 nm-thick oxide layer was deposited over a monocrystalline silicon substrate, the first oxygen-deficient oxide was deposited, and the following oxygen plasma irradiation process was conducted for them, under the same conditions as those for the element Q and the element R. These samples are expressed as sample Q' and sample R', respectively. Table 6 shows the oxygen plasma exposure times of the samples and analysis results of the samples which will be described later. Pt corresponding to the upper electrode layer 1707 was not deposited over the sample Q' and the sample R', and therefore, the resistance variable layers were exposed.

TABLE 6

|  |  |  | Sample Q' | Sample R' |
| --- | --- | --- | --- | --- |
| Oxygen plasma exposure time(min) |  |  | 0.5 | 1 |
| X-ray reflectivity measurement result | TaO$_x$ layer | Layer thickness (nm) | 28.6 | 28.7 |
|  |  | δ | $29.3 \times 10^{-6}$ | $29.3 \times 10^{-6}$ |
|  |  | x | 1.43 | 1.43 |

TABLE 6-continued

| | | Sample Q' | Sample R' |
|---|---|---|---|
| TaO$_y$ layer | Layer thickness (nm) | 1.1 | 1.2 |
| | δ | 22.3 × 10$^{-6}$ | 24.9 × 10$^{-6}$ |
| | y | 2.45 | 2.07 |

With reference table 6, the layer thickness of the first oxygen-deficient Ta oxide of the sample Q' was 28.6 nm and x was 1.43 when the first oxygen-deficient Ta oxide was expressed as TaO$_x$. The layer thickness of the second oxygen-deficient Ta oxide layer of the sample Q' was very thin and about 1.1 nm and y was 2.45 when the second oxygen-deficient Ta oxide layer was expressed as TaO$_y$. The layer thickness of the first oxygen-deficient Ta oxide of the sample R' was 28.7 nm and x was 1.43 when the first oxygen-deficient Ta oxide was expressed as TaO$_x$. The layer thickness of the second oxygen-deficient Ta oxide layer of the sample R' was about 1.2 nm which was substantially equal to that of the sample Q' and y was 2.07 when the second oxygen-deficient Ta oxide layer was expressed as TaO$_y$.

In either case, the first oxygen-deficient Ta oxide layer had a composition (x=1.4) as initially aimed. The second oxygen-deficient Ta oxide layer had a value which was deficient in oxygen with respect to the stoichiometric composition (Ta$_2$O$_5$) and had a layer thickness which was very thin and about 1 nm.

Since the sputtering was conducted and the oxygen plasma irradiation process was conducted under the same conditions for the element Q and the element R and for the sample Q' and the sample R', it is presumed that the second oxygen-deficient Ta oxide layer 1705 was present between the first oxygen-deficient Ta oxide layer 1704 and the upper electrode 1707 in the element Q and the element R as in the case of the sample Q' and the sample R.' Therefore, it is presumed that the second oxygen-deficient oxide layer 1705 which had a layer thickness of 1.1 nm was formed in the element Q as in the case of the sample Q', and the second oxygen-deficient oxide layer 1705 which had a layer thickness of 1.2 nm was formed in the element Q, as in the case of the sample Q'.

As described above, stable resistance changing phenomenon was observed in the element Q and the element R without the forming step. However, resistance changing phenomenon was not observed in the element S which did not include second oxygen-deficient Ta oxide layer having high oxygen content, unless at least the forming step was performed. In other words, the second oxygen-deficient Ta oxide is indispensable to enable resistance changing phenomenon to occur without the forming step. In this second oxygen-deficient Ta oxide, within the scope of this Embodiment, y may be about 2.1 and the layer thickness may be about 1 nm when the second oxygen-deficient Ta oxide is expressed as TaO$_y$.

In light of the result of Embodiment 4 in conjunction with the result of Embodiment 3, the element is operable without the forming step if the layer thickness of the second oxygen-deficient Ta oxide layer is at least not less than 1 nm and not more than 8 nm. Also, regarding the oxygen content, y may be not less than 2.1 based on this Embodiment. Nonetheless, if y reaches 2.5, the second oxygen-deficient Ta oxide layer undesirably becomes a stoichiometric composition Ta oxide, i.e., Ta$_2$O$_5$ which is an insulator. Therefore, y should not be a value which is not more than 2.5.

Although in Embodiment 3 and Embodiment 4, the oxidation process is employed using oxygen plasma to form the second oxygen-deficient Ta oxide layer 1705, the forming method is not limited to this. Oxidation using other oxygen gas, sputtering or chemical vapor deposition process may be employed so long as it is capable of forming the oxygen-deficient Ta oxide.

Although in Embodiment 3 and Embodiment 4, the X-ray reflectometery is employed for analysis of the Ta oxide layer, the method is not limited to this. In other method, instrument analysis method such as Rutherford backscattering (RBS), Auger electron spectroscopy (AES), X-ray photoelectron spectroscopy (XPS), or electron probe micro-analysis (EPMA) may be employed.

Although in Embodiment 1 to Embodiment 4 as described above, the film thickness of the lower electrode 503 or 1703 of the nonvolatile memory element is 100 nm, the layer thickness of the oxygen-deficient Ta oxide layer 504 or the resistance variable layer 1706 is about 30 nm, and the upper electrode layer 505 or 1707 is 150 nm, these values are determined to easily perform an element fabrication process, and the values of the layer thickness are not limited to these values.

Although in Embodiment 1 to Embodiment 4, the lower electrode layer 503 or 1703, the layer thickness of the oxygen-deficient Ta oxide layer 504 or the resistance variable layer 1706, and the upper electrode layer 505 or 1707 are deposited by the sputtering process, the forming method is not limited to this but the chemical vapor deposition process and other processes may be employed.

Embodiment 5

The above described nonvolatile memory element according to Embodiment 1 to Embodiment 4 is applicable to nonvolatile semiconductor devices having various configurations. A semiconductor device according to Embodiment 5 is a nonvolatile semiconductor device which includes the nonvolatile memory element according to Embodiment 1 to Embodiment 4 and is so-called a cross-point nonvolatile semiconductor device in which active layers intervene at cross points (i.e. three-dimensional cross points) between word lines and bit lines.

[Configuration of Semiconductor Device According to Embodiment 5]

Figure 28:
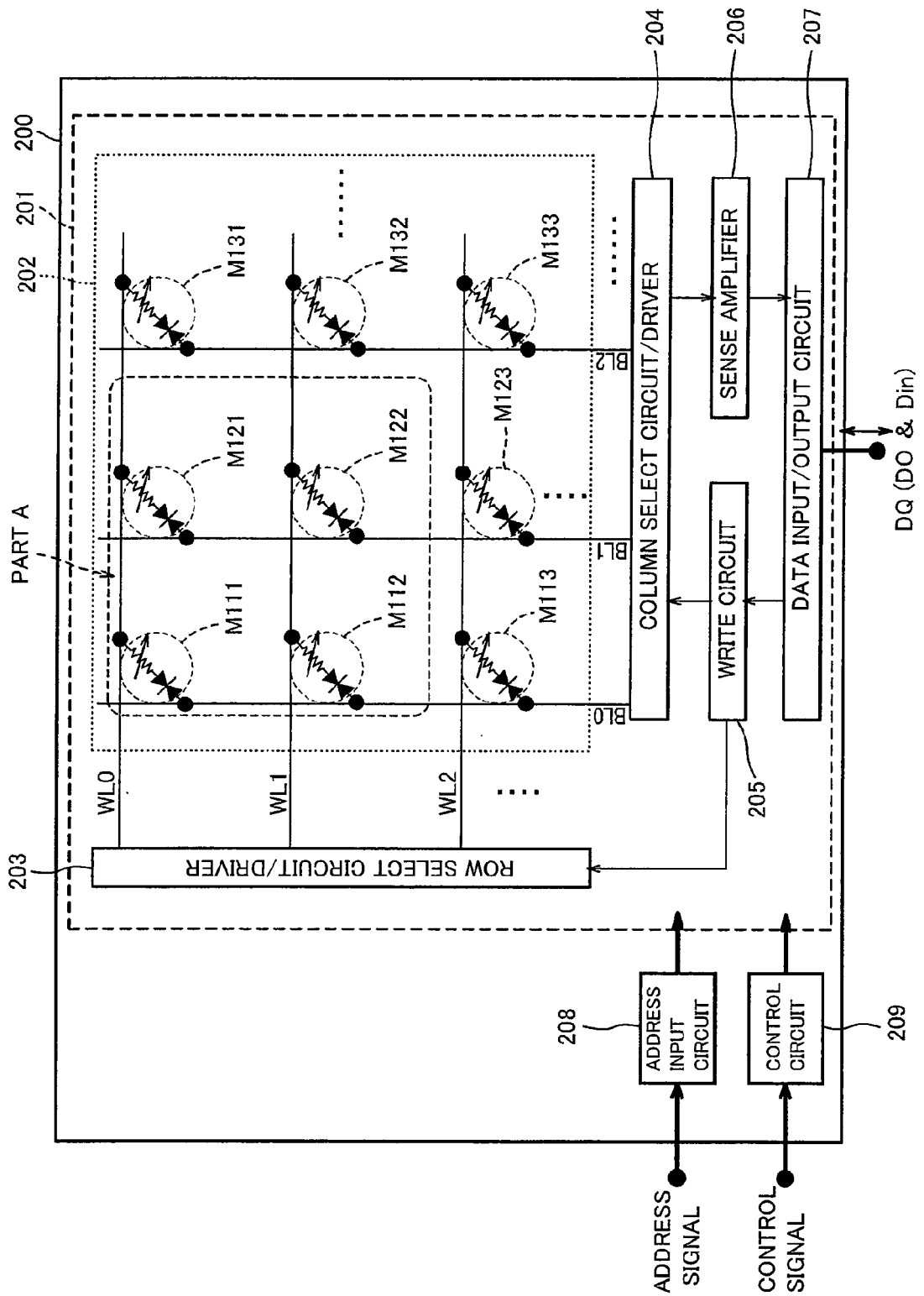
FIG. 28 is a block diagram showing a configuration of a nonvolatile semiconductor device according to Embodiment 5 of the present invention.
Figure 29:
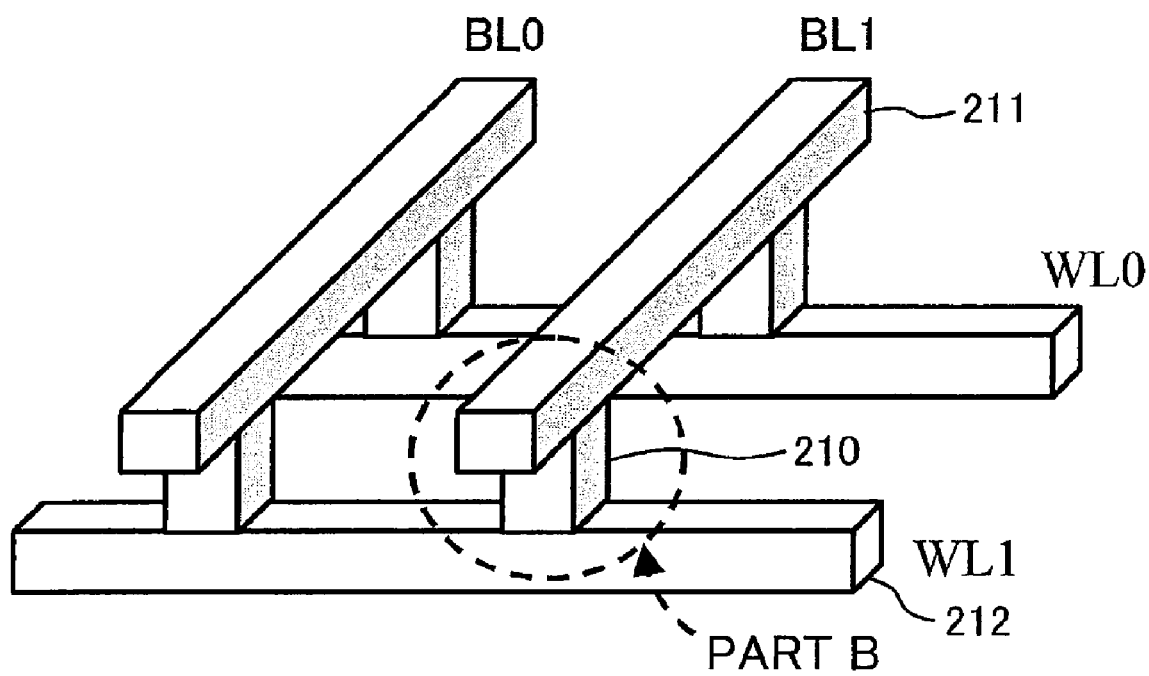
FIG. 29 is a perspective view showing a configuration (configuration of 4 bits) in part A in FIG. 28.

FIG. 28 is a block diagram showing a configuration of a nonvolatile semiconductor device according to Embodiment 5 of the present invention. FIG. 29 is a perspective view showing a configuration (configuration corresponding to 4 bits) in part A of FIG. 28.

As shown in FIG. 28, a nonvolatile semiconductor device 200 according to this embodiment includes a memory main section 201 on a semiconductor substrate. The memory main section 201 includes a memory array 202, a row select circuit/drivers 203, a column select circuit/drivers 204, a write circuit 205 for writing data, a sense amplifier 206 which detects an amount of a current flowing through a selected bit line and determines the data as "1" or "0," and a data input/output circuit 207 which executes input/output processing of input/output data via a terminal DQ. The nonvolatile semiconductor device 200 further includes an address input circuit 208 which receives an address signals externally input, and a control circuit 209 for controlling the operation of the memory main section 201, based on a control signal externally input.

As shown in FIGS. 28 and 29, the memory array 202 includes plural word lines WL0, WL1, WL2, . . . which are formed on the semiconductor substrate to extend in parallel with each other, and plural bit lines BL0, BL1, BL2, . . . which are formed above the plural word lines WL0, WL1, WL2, . . . , so as to extend in parallel with each other within a plane parallel to a main surface of the semiconductor substrate and so as to three-dimensionally cross the plural word lines WL0, WL1, WL2, . . . .

Further, plural memory cells M111, M112, M113, M121, M122, M123, M131, M132, M133, . . . (hereinafter expressed as "memory cells M111, M112, . . . ") are arranged in matrix so as to respectively correspond to the three-dimensional cross points of the plural word lines WL0, WL1, WL2, . . . , and the plural bit lines BL0, BL1, BL2, . . . .

The memory cells M111, M112, . . . correspond to the nonvolatile memory elements according to Embodiment 1, and each of them has a resistance variable layer comprising, for example, an oxygen-deficient Ta oxide. It should be noted that in this embodiment, each of these memory cells M111, M112, . . . includes a current controlling element as described later.

The memory cells M111, M112, . . . in FIG. 28 are identified by reference numeral 210 in FIG. 29.

The address input circuit 208 receives address signals from an external circuit (not shown), and outputs row address signals and column address signals to the row select circuit/drivers 203 and to the column select circuit/drivers 204, respectively, based on the address signals. The address signals are signals indicating the address of a specified memory cell to be selected from among the plural memory cells M111, M112, . . . . The row address signals are signals indicating a row address in the address indicated by the address signals, and the column address signals are signals indicating a column address in the address indicated by the address signals.

In a write cycle of data, the control circuit 209 outputs to the write circuit 205, a write signal for causing application of a write voltage, according to the input data Din input to the data input/output circuit 207. In a read cycle of data, the control circuit 209 outputs to the column select circuit/drivers 204, a read signal for causing application of a read voltage.

The row select circuit/drivers 203 receives the row address signals output from the address input circuit 208, selects one from among the plural word lines WL0, WL1, WL2, . . . based on the row address signals and applies a predetermined voltage to the selected word line.

The column select circuit/driver 204 receives column address signals output from the address input circuit 208, selects one from among the plural bit lines BL0, BL1, BL2, . . . based on the column address signals and applies the write voltage or the read voltage to the selected bit line.

Receiving the write signal output from the control circuit 209, the write circuit 205 outputs to the row select circuit/drivers 203 a signal for causing application of a voltage to the selected word line, and outputs to the column select circuit/drivers 204 a signal for causing application of a write voltage to the selected bit line.

In the read cycle of data, the sense amplifier 206 detects an amount of a current flowing through the selected bit line which is a read target, and determines the data as "1" or "0." The resulting output data DO is output to the external circuit via the data input/output circuit 207.

[Configuration of Nonvolatile Memory Element Included in Nonvolatile Semiconductor Device According to Embodiment 5]

Figure 30:
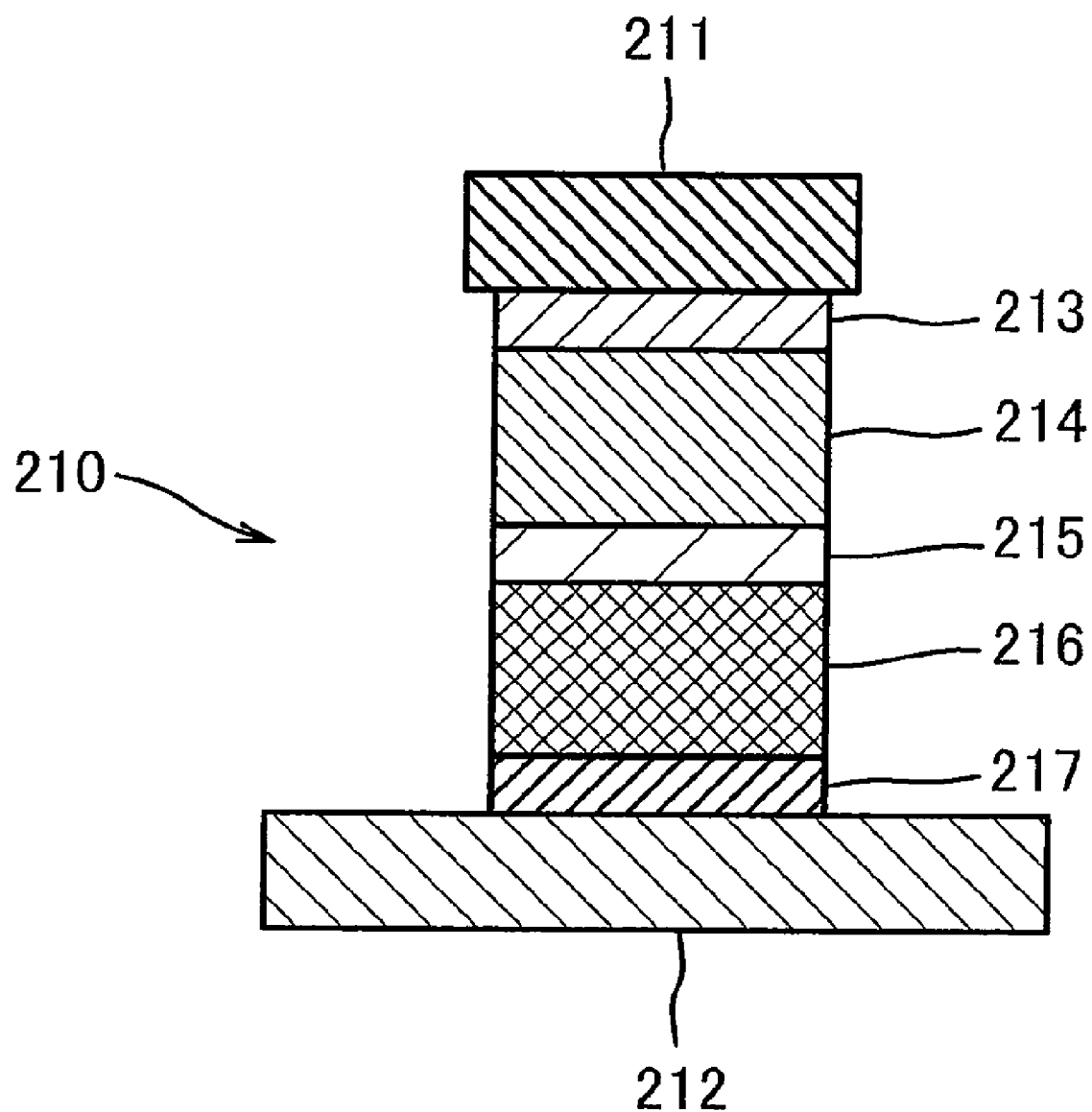
FIG. 30 is a cross-sectional view showing a configuration of a nonvolatile memory element included in a nonvolatile semiconductor device according to Embodiment 5 of the present invention.

FIG. 30 is a cross-sectional view showing a configuration of the nonvolatile memory element included in the nonvolatile semiconductor device according to Embodiment 5 of the present invention. In FIG. 30, a configuration of part B in FIG. 29 is shown.

As shown in FIG. 30, a nonvolatile memory element 210 included in the nonvolatile semiconductor device according to this Embodiment intervenes between a lower wire 212 (corresponding to the word line WL1 in FIG. 29) which is a copper wire and an upper wire 211 (corresponding to the bit line BL1 in FIG. 29) which is a copper wire, and includes a lower electrode 217, a current controlling element 216, an inner electrode 215, a resistance variable layer 214, and an upper electrode 213 which are stacked in this order.

The inner electrode 215, the resistance variable layer 214, and the upper electrode 213 correspond to the lower electrode layer 503, the resistance variable layer 504, and the upper electrode layer 505 in the nonvolatile memory element 500 according to Embodiment 1 shown in FIG. 5, respectively, or the lower electrode layer 1703, the resistance variable layer 1706 and the upper electrode layer 1707 in the nonvolatile memory element 1700 according to Embodiment 2 to Embodiment 4 shown in FIG. 23. Therefore, the resistance variable layer 214 is formed as in Embodiment 1 to Embodiment 4.

By forming the upper electrode 213 and the inner electrode 215 which are in contact with the resistance variable layer 214 with different materials, a nonvolatile memory element which is operable stably can be formed. For example, by forming the upper electrode 213 of Pt and the inner electrode 215 of W, it is possible to obtain a nonvolatile memory element which is operable stably only in the region in the vicinity of the upper electrode 213.

The current controlling element 216 is connected in series with the resistance variable layer 214 via the inner electrode 215. The current controlling element 216 is an element represented by a MIM (Metal-Insulator-Metal) diode, or a MSM (Metal-Semiconductor-Metal) diode, and exhibits a non-linear current characteristic with respect to a voltage. In addition, the current controlling element 216 has a bidirectional current characteristic with respect to a voltage, and is placed into an electrically-conductive state by applying a predetermined threshold voltage Vf (for example, not lower than +1V or not higher than −1V on the basis of one electrode).

[Configuration of Modification of Nonvolatile Memory Element Included in Nonvolatile Semiconductor Device According to Embodiment 5]

The configuration of the nonvolatile memory element included in the nonvolatile semiconductor device according to this Embodiment is not limited to that shown in FIG. 30, but may have a configuration shown below.

FIGS. 31(a) to 31(g) are cross-sectional views showing configurations of modifications of the nonvolatile memory element included in the nonvolatile semiconductor device according to Embodiment 5 of the present invention.

FIG. 31(a) shows a configuration in which the resistance variable layer 214 is formed on the current controlling element 216, and the inner electrode is omitted, unlike the configuration of FIG. 30. The portion of the current controlling element 216 which is in contact with the resistance variable layer 214 may be formed of a material different from the material of the upper electrode 213.

FIG. 31(b) shows a configuration in which the resistance variable layer 214 is formed on the current controlling element 216, and the lower electrode, the inner electrode, and the upper electrode are omitted, unlike the configuration of FIG. 30. Also, in this case, the portion of the current controlling element 216 which is in contact with the resistance variable layer 214 may be formed of a material different from that of the upper wire 213.

FIG. 31(c) shows a configuration in which the lower electrode is omitted, unlike the configuration of FIG. 30. Alternatively, a configuration in which the upper electrode is omitted may be used, although not shown.

Figure 31:
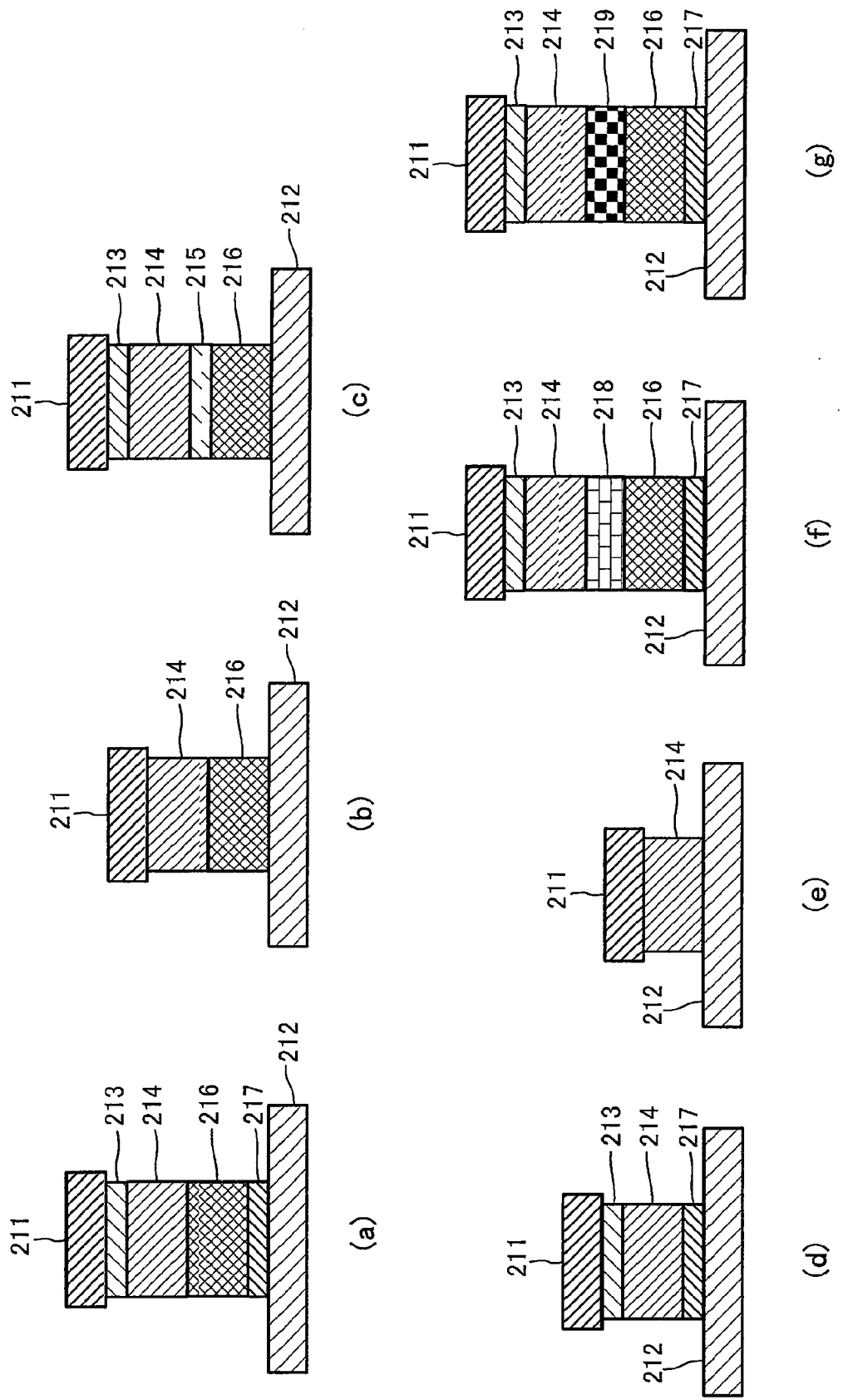
FIG. 31 is a cross-sectional view showing configurations of modifications of the nonvolatile memory element included in the nonvolatile semiconductor device according to Embodiment 5 of the present invention.

FIG. 31(*d*) shows a configuration in which the inner electrode and the current controlling element are omitted, unlike the configuration of FIG. 30. Also, in this case, the lower electrode 217 and the upper electrode 213 may be formed of different materials.

FIG. 31(*e*) shows a configuration in which the upper electrode and the lower electrode are further omitted. In this case, the lower wire 212 and the upper wire 211 may be formed of different materials.

FIG. 31(*f*) shows a configuration in which the inner electrode is omitted but instead an ohmic resistance layer 218 is provided unlike the configuration of FIG. 30. FIG. 31(*g*) shows a configuration in which a second resistance variable layer 219 is provided in place of the inner electrode. In these cases, the resistance layer 218 and the resistance variable layer 219 may be regarded as the lower electrode, and these layers and the upper electrode 213 may be formed of different materials.

In the above modifications, in the configuration in which the upper electrode is omitted, the upper wire 211 serves as the upper electrode of the nonvolatile memory element, while in the configuration in which the lower electrode is omitted, the lower wire 212 serves as the lower electrode of the nonvolatile memory element.

When the memory cells are relatively fewer in number, a bypass current flowing to unselected memory cells is reduced. In that case, the above described current controlling element may be dispensed with.

As should be understood from the above, for the nonvolatile memory elements included in the nonvolatile semiconductor device according to this embodiment, various configurations may be used.

[Example of Configuration of Nonvolatile Semiconductor Device Having a Multi-Layer. Structure]

The memory arrays of the nonvolatile semiconductor device according to this Embodiment shown in FIGS. 28 and 30 may be three-dimensionally stacked to attain a nonvolatile semiconductor device having a multi-layer structure.

Figure 32:
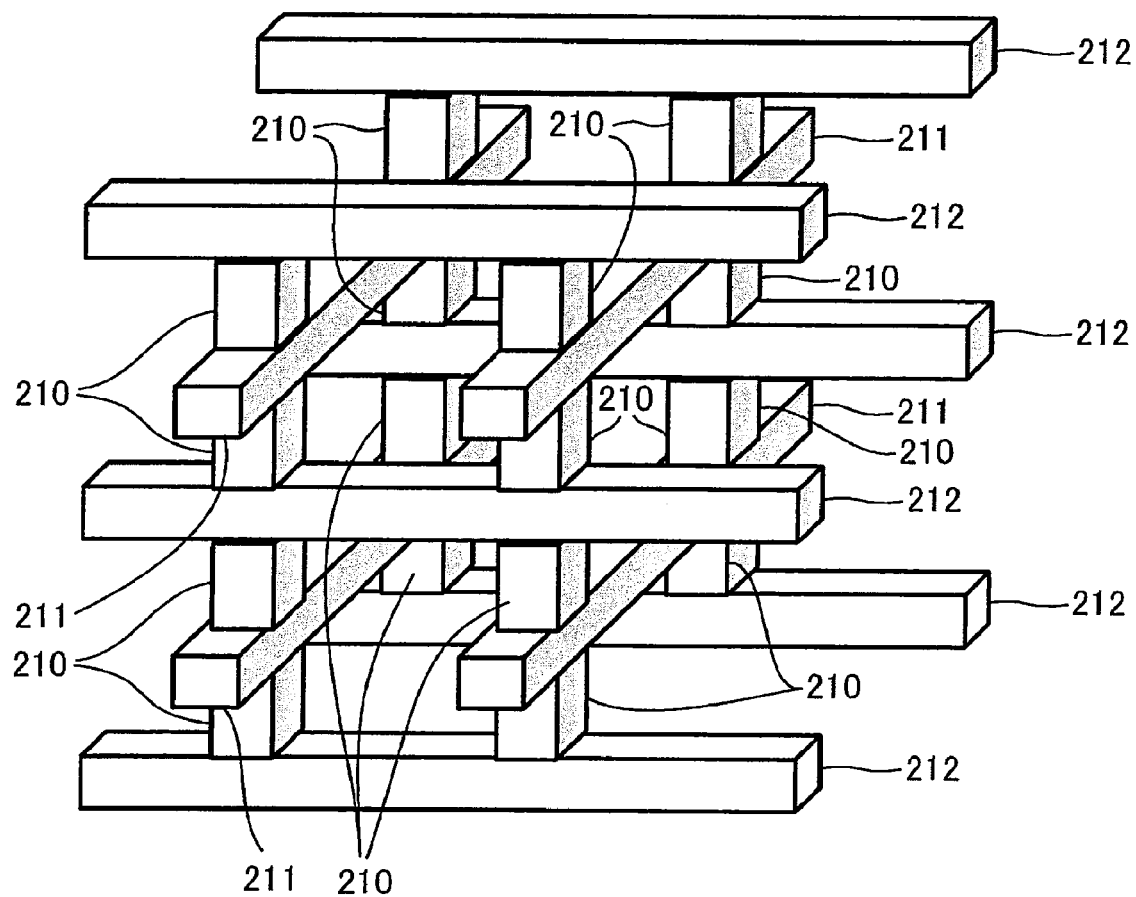
FIG. 32 is a perspective view showing a configuration of a memory array included in a nonvolatile semiconductor device of a multi-layer structure of the present invention.

FIG. 32 is a perspective view showing a configuration of a memory array included in the nonvolatile semiconductor device having the multi-layer structure of the present invention. As shown in FIG. 32, the nonvolatile semiconductor device includes a multi-layer memory array having plural layers of stacked memory arrays each including plural lower wires 212 formed on a semiconductor substrate (not shown) so as to extend in parallel with each other, plural upper wires 211 formed above the plural lower wires 212 so as to extend in parallel with each other within a plane parallel to a main surface of the semiconductor substrate and so as to three-dimensionally cross the plural lower wires 212, and plural memory cells 210 arranged in matrix so as to respectively correspond to three-dimensional cross points of the plural lower wires 212 and the plural upper wires 211.

In the example shown in FIG. 32, the wire layers are formed in five layers and the nonvolatile memory elements arranged at the three-dimensional cross points are formed in four layers. Alternatively, the number of these layers may be increased or decreased as desired.

By providing the multi-layer memory array configured as described above, a nonvolatile memory having a super-large capacity is attainable.

[Example of Operation of Nonvolatile Semiconductor Device]

Subsequently, an example of the operation of the nonvolatile semiconductor device according to Embodiment 5 in a write cycle in which data is written and in a read cycle in which data is read, will be described with reference to a timing chart shown in FIG. 33.

Figure 33:
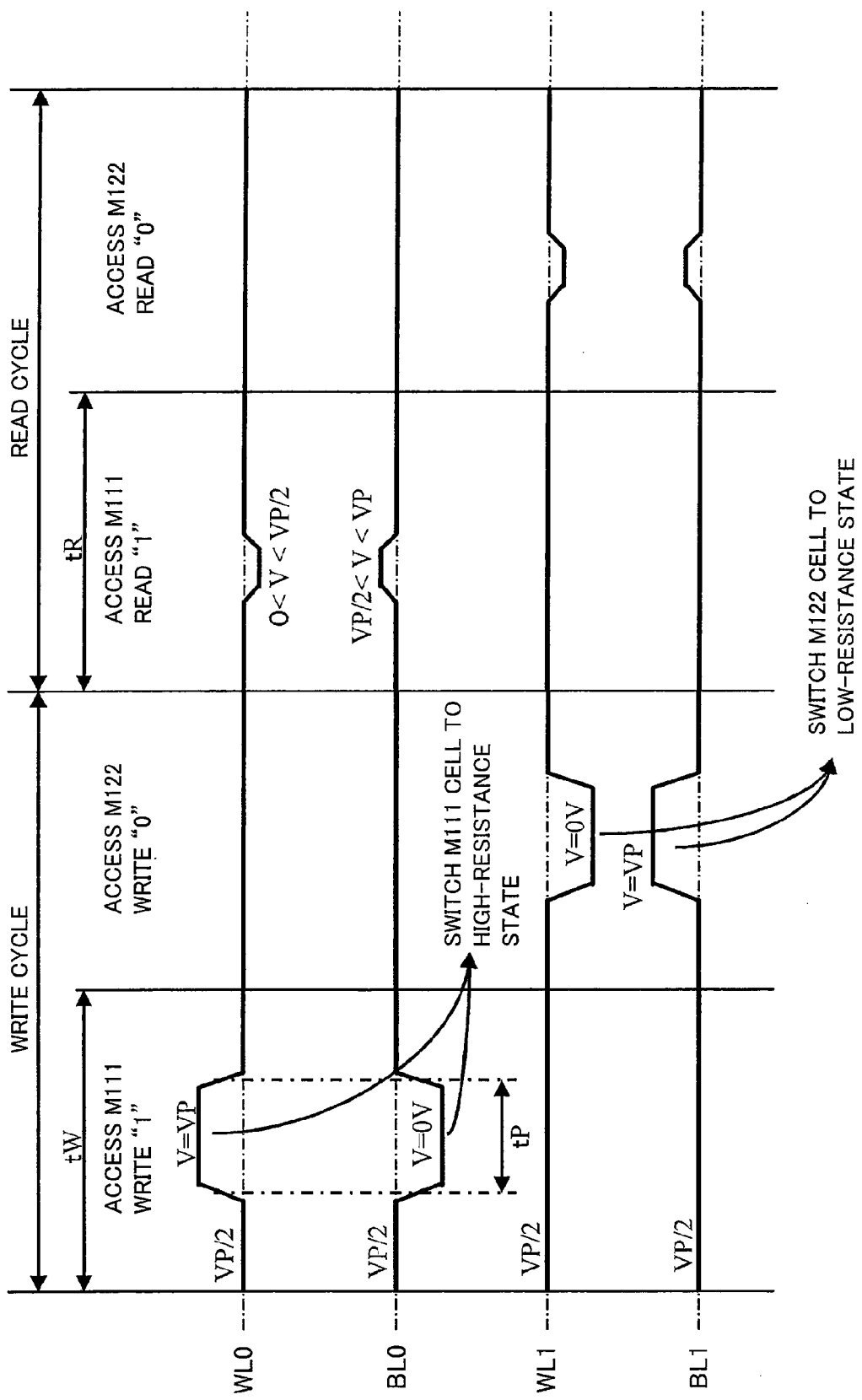
FIG. 33 is a timing chart showing an example of the operation of the nonvolatile semiconductor device according to Embodiment 5 of the present invention.

FIG. 33 is a timing chart showing an example of the operation of the nonvolatile semiconductor device according to Embodiment 5 of the present invention. Illustrated herein is the example of operation in which an event that the resistance variable layer is in the high-resistance state is allocated to data "1" and an event that the resistance variable layer is in the low-resistance state is allocated to data "0." For the convenience of explanation, writing and reading of data with respect to the memory cells M111 and M112 will be described.

VP in FIG. 33 denotes a pulse voltage required to enable the memory cell including the resistance variable element and the current controlling element to change its resistance. A relationship VP/2<threshold voltage Vf is desirably established. This is because, this relationship can suppress a leak current flowing to unselected memory cells. This makes it possible to reduce an undesired current supplied to memory cells which do not require writing of data, thereby facilitating achievement of low electric power consumption. In addition, unintended insufficient writing (generally referred to as disturb) to the unselected memory cells is advantageously suppressed.

In FIG. 33, tW denotes a write cycle time which is a time required for one write cycle, and tR denotes a read cycle time which is a time required for one read cycle.

In a write cycle for the memory cell M111, a pulse voltage VP having a pulse width tP is applied to the word line WL0, and according to this timing, a voltage of 0V is applied to the bit line BL0 in the same manner. In this way, a write voltage for writing data "1" is applied to the memory cell M111, causing the resistance variable layer in the memory cell M111 to switch to the high-resistance state. That is, the data "1" is written to the memory cell M111.

Then, in a write cycle for the memory cell M122, a voltage of 0V and a pulse width tP is applied to the word line WL1, and according to this timing, the pulse voltage VP is applied to the bit line BL1 in the same manner. In this way, a write voltage for writing data "0" is applied to the memory cell M122, causing the resistance variable layer in the memory cell M122 to switch to the low-resistance state. That is, the data "0" is written to the memory cell M122.

In a read cycle for the memory cell M111, a pulse voltage which has a smaller amplitude than the pulse for writing and has a value larger than 0V and smaller than VP/2 is applied to the word line WL0. According to this timing, a pulse voltage which has smaller amplitude than the pulse for writing and has a value larger than VP/2 and smaller than VP is applied to the bit line BL0. Thereby, a current corresponding to the resistance value of the resistance variable layer 214 in the memory cell M111 switched to the high-resistance state is output, and its output current value is detected, so that the data "1" is read.

Then, in a read cycle for the memory cell M122, a voltage identical to that in the previous read cycle for the memory cell M111 is applied to the word line WL1 and the bit line BL1. Thereby, a current corresponding to the resistance value of the resistance variable layer 214 in the memory cell M122 switched to the low-resistance state is output, and its output current value is detected, so that the data "0" is read.

Embodiment 6

A nonvolatile semiconductor device according to Embodiment 6 is a nonvolatile semiconductor device which includes the nonvolatile memory element according to Embodiment 1 to Embodiment 4, and is of a one transistor/one nonvolatile memory section type.

[Configuration of Nonvolatile Semiconductor Device According to Embodiment 6]

Figure 34:
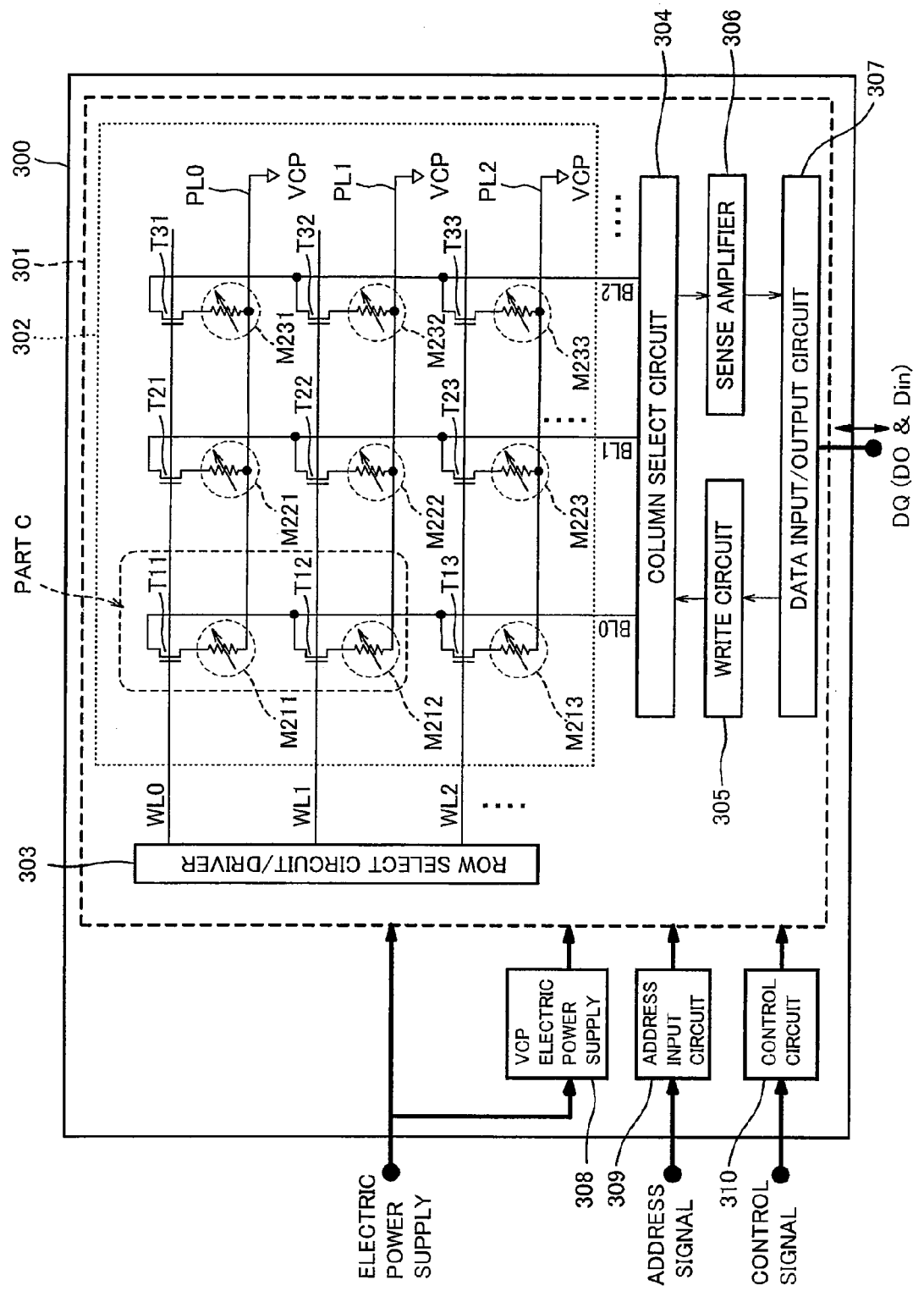
FIG. 34 is a block diagram showing a configuration of a nonvolatile semiconductor device according to Embodiment 6 of the present invention.
Figure 35:
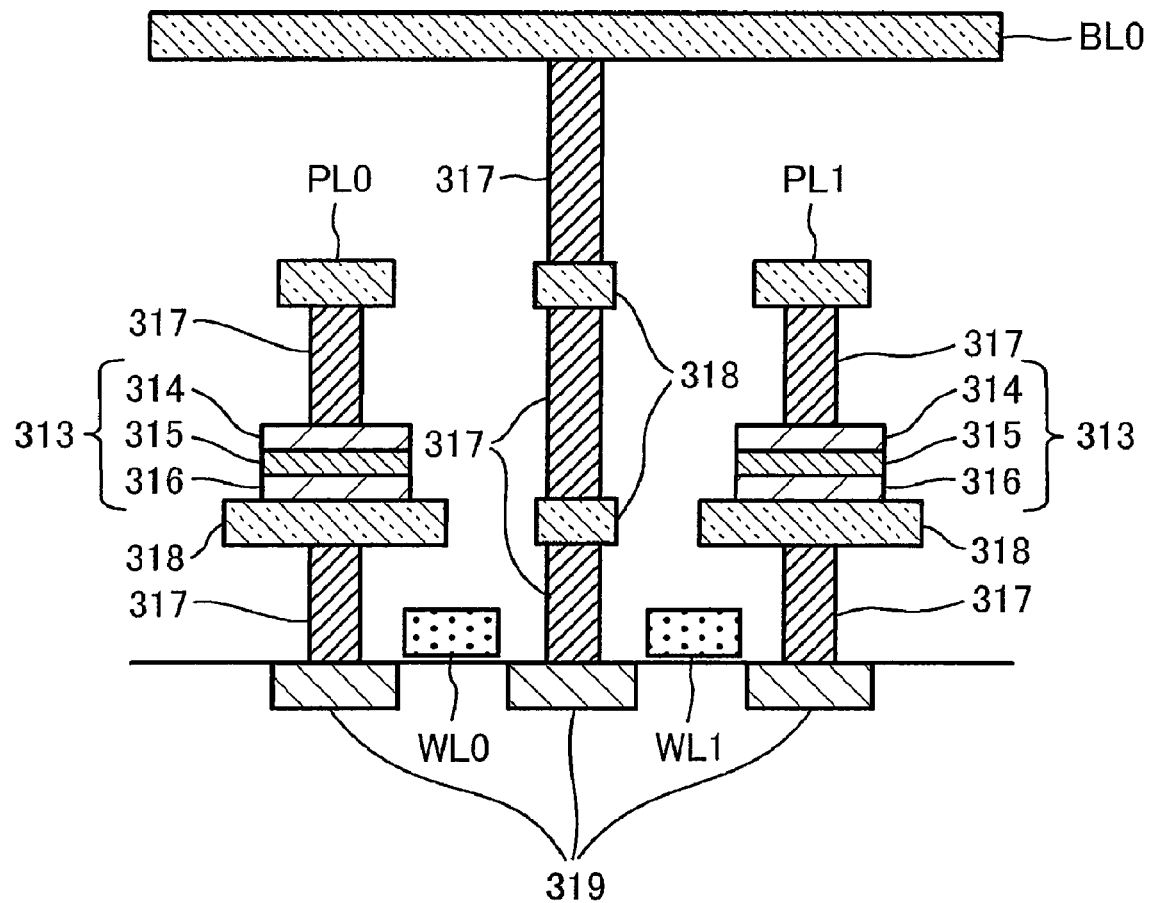
FIG. 35 is a cross-sectional view showing a configuration (configuration of 2 bits) in part C in FIG. 33.

FIG. 34 is a block diagram showing a configuration of a nonvolatile semiconductor device according to Embodiment 6 of the present invention. FIG. 35 is a cross-sectional view showing a configuration (configuration corresponding to 2 bits) in part C of FIG. 34.

As shown in FIG. 34, a nonvolatile semiconductor device 300 according to this embodiment includes a memory main section 301 on a semiconductor substrate. The memory main section 301 includes a memory array 302, a row select circuit/drivers 303, a column select circuit 304, a write circuit 305 for writing data, a sense amplifier 306 which detects an amount of a current flowing through a selected bit line and determines the data as "1" or "0," and a data input/output circuit 307 which executes input/output processing of input/output data via the terminal DQ. The nonvolatile semiconductor device 300 further includes a cell plate electric power supply (VCP electric power supply) 308, an address input circuit 309 which receives address signals externally input, and a control circuit 310 for controlling the operation of the memory main section 301, based on the control signal externally input.

The memory array 302 includes plural word lines WL0, WL1, WL2, . . . and plural bit lines BL0, BL1, BL2, . . . which are formed on the semiconductor substrate and are arranged to cross each other, plural transistors T11, T12, T13, T21, T22, T23, T31, T32, T33, . . . (hereinafter expressed as "transistors T11, T12, . . . ") provided to respectively correspond to cross-points of the word lines WL0, WL1, WL2, . . . and the bit lines BL0, BL1, BL2, . . . , and plural memory cells M211, M212, M213, M221, M222, M223, M231, M232, N233 (hereinafter expressed as "memory cells M211, M212, . . . ") provided to respectively correspond to the transistors T11, T12, . . . such that one memory cell corresponds to one transistor.

The memory array 302 further includes plural plate lines PL0, PL1, PL2, . . . which are arranged to extend in parallel with the word lines WL0, WL1, WL2, respectively.

As shown in FIG. 34, the bit line BL0 is provided above the word lines WL0 and WL1, and the plate lines PL0 and PL1 are provided between the word lines WL0 and WL1 and the bit line BL0.

Each of the memory cells M211, M212, . . . corresponds to the nonvolatile memory element according to Embodiment 1 to Embodiment 4, and includes a resistance variable layer. To be specific, the nonvolatile memory element 313 in FIG. 35 corresponds to the memory cells M211, M212, . . . in FIG. 34, and is constituted by the upper electrode 314, the resistance variable layer 315, and the lower electrode 316. If the upper electrode 314 and the lower electrode 316 are made of different materials, stable resistance changing phenomenon described in Embodiment 1 to Embodiment 4 is attained.

In FIG. 35, 317 denotes a plug layer, 318 denotes a metal wire layer, and 319 denotes source/drain regions.

As shown in FIG. 34, drains of the transistors T11, T12, T13, . . . are connected to the bit line BL0, drains of the transistors T21, T22, T23, . . . are connected to the bit line BL1, and drains of the transistors T31, T32, T33, . . . are connected to the bit line BL2.

Gates of the transistors T11, T21, T31, . . . are connected to the word line WL0, gates of the transistors T12, T22, T32, . . . are connected to the word line WL1, and gates of the transistors T13, T23, T33, . . . are connected to the word line WL2.

Sources of the transistors T11, T12, . . . are connected to the memory cells M211, M212, . . . , respectively.

The memory cells M211, M221, M231, . . . are connected to the plate line PL0, the memory cells M212, M222, M232, . . . are connected to the plate line PL1, and the memory cells M213, M223, M233, . . . are connected to the plate line PL2.

The address input circuit 309 receives address signals from an external circuit (not shown), and outputs row address signals and column address signals to the row select circuit/drivers 303 and to the column select circuit 304, respectively, based on the address signals. The address signals are signals indicating the address of a specified memory cell to be selected from among the plural memory cells M211, M212, . . . . The row address signals are signals indicating a row address in the address indicated by the address signals, and the column address signals are signals indicating a column address in the address indicated by the address signals.

In a write cycle of data, the control circuit 310 outputs to the write circuit 305, a write signal for causing application of a write voltage, according to the input data Din input to the data input/output circuit 307. On the other hand, in a read cycle of data, the control circuit 310 outputs to the column select circuit 304, a read signal for causing application of a read voltage.

The row select circuit/driver 303 receives the row address signals output from the address input circuit 309, selects one from among the plural word lines WL0, WL1, WL2, . . . according to the row address signals, and applies a predetermined voltage to the selected word line.

The column select circuit 304 receives column address signals output from the address input circuit 309, selects one from among the plural bit lines BL0, BL1, BL2, . . . according to the column address signals, and applies the write voltage or the read voltage to the selected bit line.

Receiving the write signal output from the control circuit 310, the write circuit 305 outputs to the column select circuit 304, a signal for causing application of the write voltage to the selected bit line.

In the read cycle of data, the sense amplifier 306 detects an amount of a current flowing through the selected bit line which is a read target, and determines the data as "1" or "0." The resulting output data DO is output to the external circuit via the data input/output circuit 307.

In Embodiment 6 using the configuration of one transistor/one nonvolatile memory section, a storage capacity is smaller than that of the cross-point configuration in Embodiment 5. However, since Embodiment 6 may dispense with the current controlling element such as the MIM diode, Embodiment 6 has an advantage that it is easily combined with the CMOS process, and operation control therefor is easy.

[Example of Operation of Nonvolatile Semiconductor Device]

Subsequently, an example of the operation of the nonvolatile semiconductor device according to Embodiment 6 in a write cycle in which data is written and in a read cycle in which data is read, will be described with reference to a timing chart shown in FIG. 36.

Figure 36:
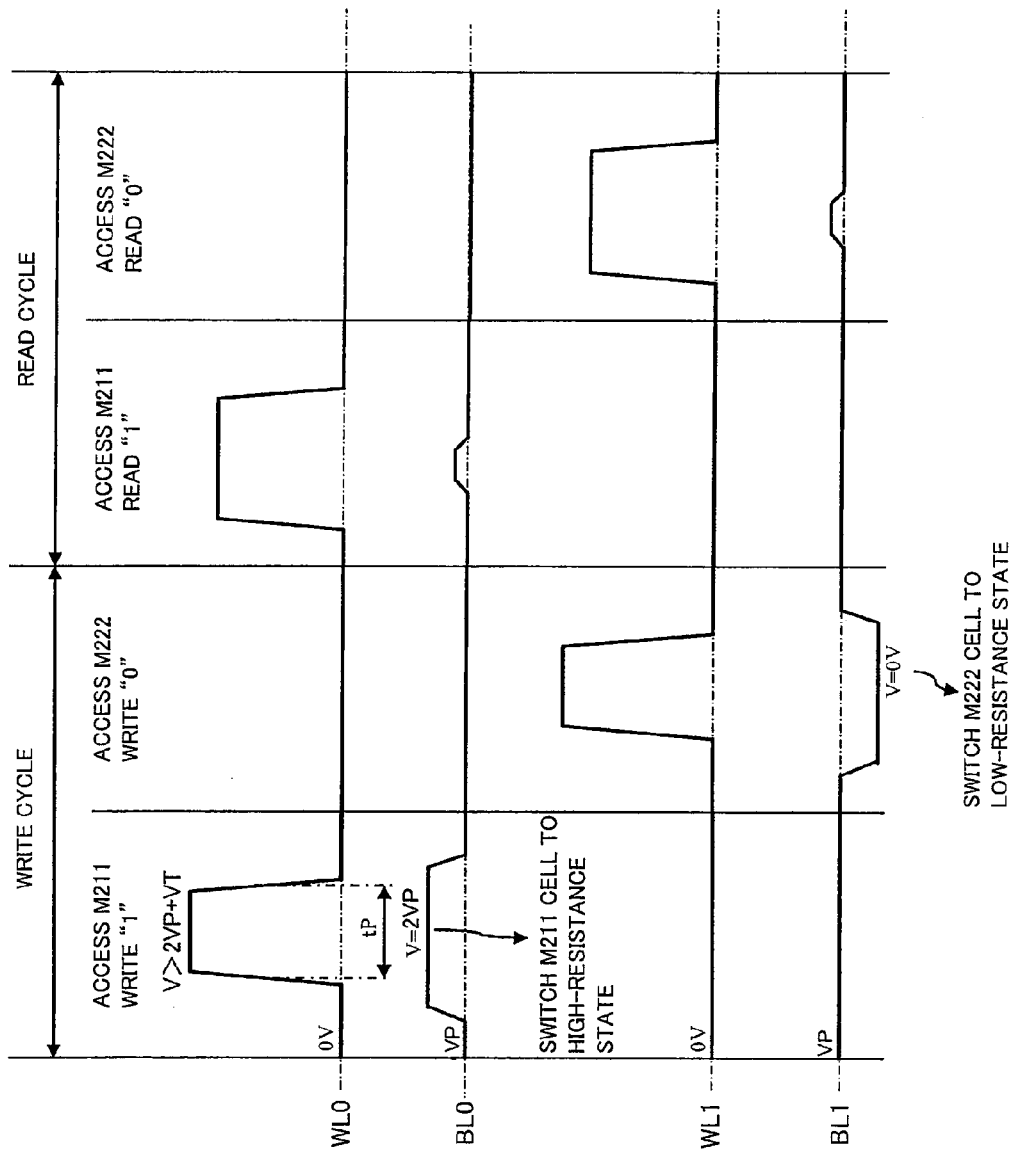
FIG. 36 is a timing chart showing an example of the operation of the nonvolatile semiconductor device according to Embodiment 6 of the present invention.

FIG. 36 is a timing chart showing an example of the operation of the nonvolatile semiconductor device according to Embodiment 6 of the present invention. Illustrated herein is the example of operation in which an event that the resistance variable layer is in the high-resistance state is allocated to data "1" and an event that the resistance variable layer is in the low-resistance state is allocated to data "0." For the convenience of explanation, writing and reading of data with respect to the memory cells M211 and M222 are shown.

In FIG. 36, VP denotes a pulse voltage required to enable the resistance variable element to change its resistance, and VT denotes a threshold voltage of the transistor. The voltage VP is always applied to the plate line, and the bit line is precharged with a voltage VP when it is unselected.

In a write cycle for the memory cell M211, a voltage which is higher than a pulse voltage 2VP+transistor threshold voltage VT and has a pulse width tP is applied to the word line WL0, causing the transistor T11 to be tuned on. According to this timing, a pulse voltage 2VP is applied to the bit line BL0. In this way, a write voltage for writing data "1" is applied to the memory cell M211, causing the resistance variable layer in the memory cell M211 to switch to the high-resistance state. That is, the data "1" is written to the memory cell M211.

Then, in a write cycle for the memory cell M222, a voltage which is higher than a pulse voltage 2VP+transistor threshold voltage VT and has a pulse width tP is applied to the word line WL1, causing the transistor T22 to be tuned on. According to this timing, a voltage of 0V is applied to the bit line BL1. In this way, a write voltage for writing data "0" is applied to the memory cell M222, causing the resistance variable layer in the memory cell M222 to switch to the low-resistance state. That is, the data "0" is written to the memory cell M222.

In a read cycle for the memory cell M211, a predetermined voltage for turning on the transistor T11 is applied to the word line WL0, and according to this timing, a pulse voltage having a smaller amplitude than the pulse width for writing is applied to the bit line BL0. Thereby, a current corresponding to the resistance value of the resistance variable layer of the memory cell M211 switched to the high-resistance state is output, and its output current value is detected, so that the data "1" is read.

Then, in a read cycle for the memory cell M222, a voltage identical to that in the previous read cycle for the memory cell M211 is applied to the word line WL1 and to the bit line BL1. Thereby, a current corresponding to the resistance value of the resistance variable layer of the memory cell M222 switched to the low-resistance state is output, and its output current value is detected, so that the data "0" is read.

Embodiment 7

A nonvolatile semiconductor device according to Embodiment 7 is a nonvolatile semiconductor device which includes the nonvolatile memory element according to Embodiment 1 to Embodiment 4 having a programming function and a logic circuit for executing predetermined calculation.

[Configuration of Nonvolatile Semiconductor Device]

Figure 37:
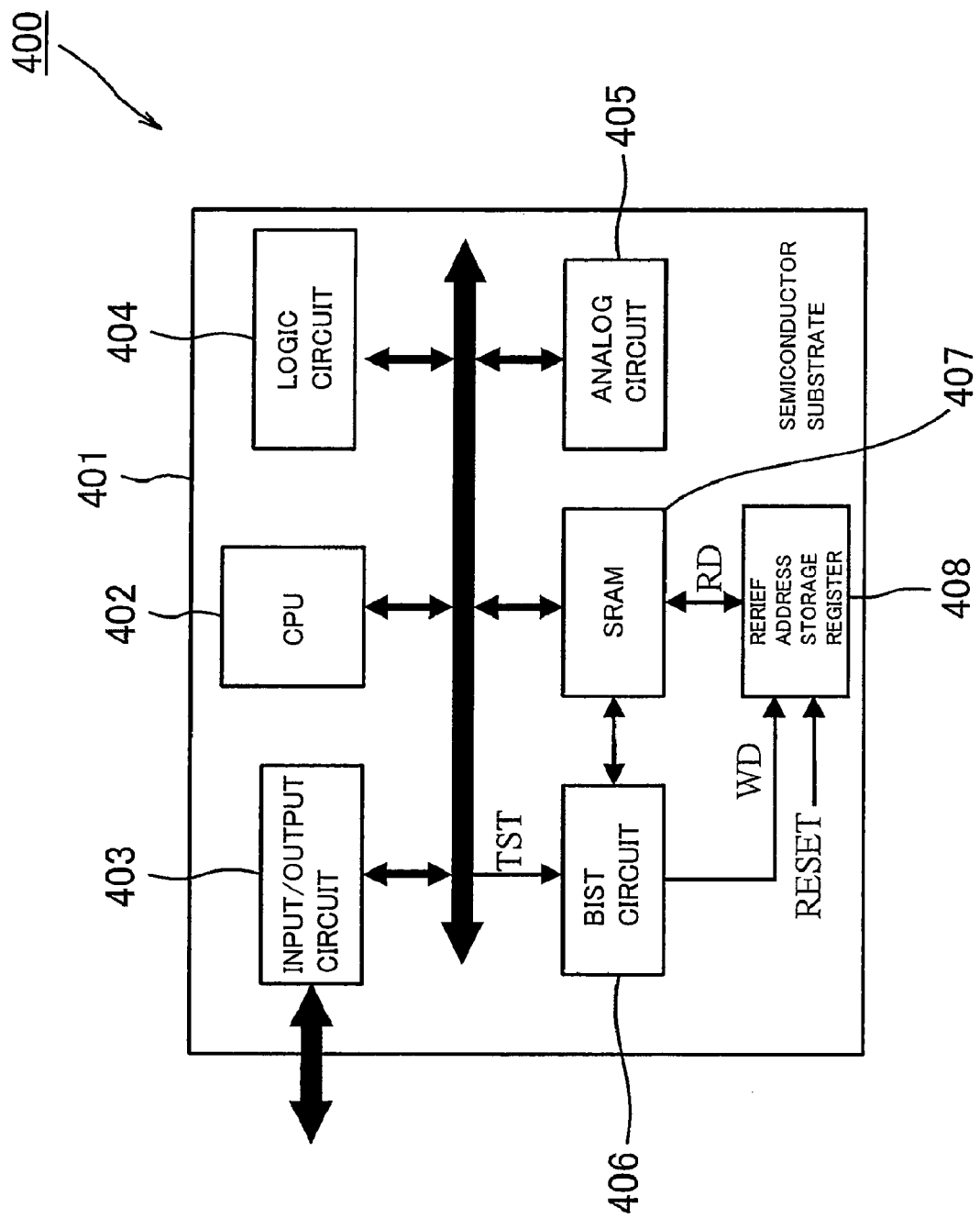
FIG. 37 is a block diagram showing a configuration of a nonvolatile semiconductor device according to Embodiment 7 of the present invention.

FIG. 37 is a block diagram showing a configuration of a nonvolatile semiconductor device according to Embodiment 7 of the present invention.

As shown in FIG. 37, a nonvolatile semiconductor device 400 according to this Embodiment includes, on a semiconductor substrate 401, a CPU 402, an input/output circuit 403 for inputting/outputting data to/from an external circuit, a logic circuit 404 for executing predetermined calculation, an analog circuit 405 for processing analog signals, a BIST (Built In Self Test) circuit 406 for performing self diagnosis, a SRAM 407, and an address storage register for redundancy 408 which is connected to the BIST circuit 406 and to the SRAM 407 and serves to store specific address data.

Figure 38:
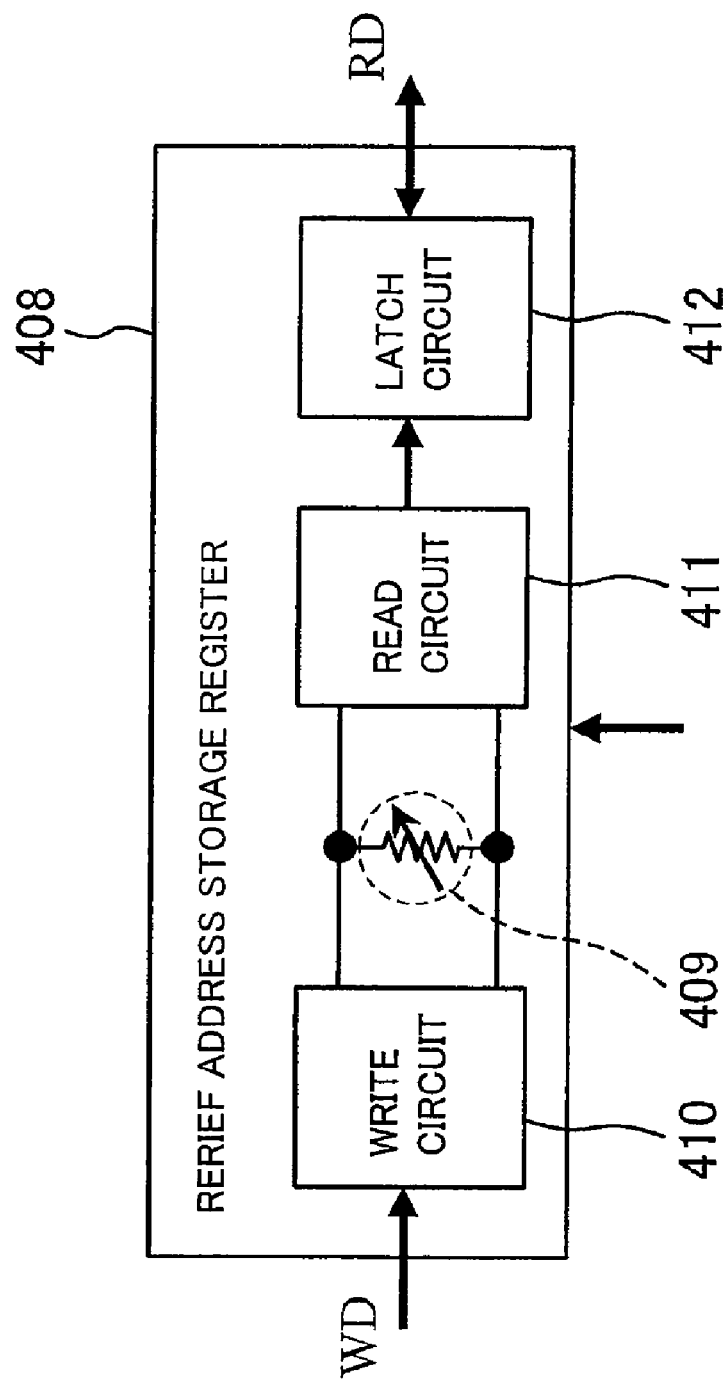
FIG. 38 is a block diagram showing a configuration of an address storage register for redundancy included in a nonvolatile semiconductor device according to Embodiment 7 of the present invention.
Figure 39:
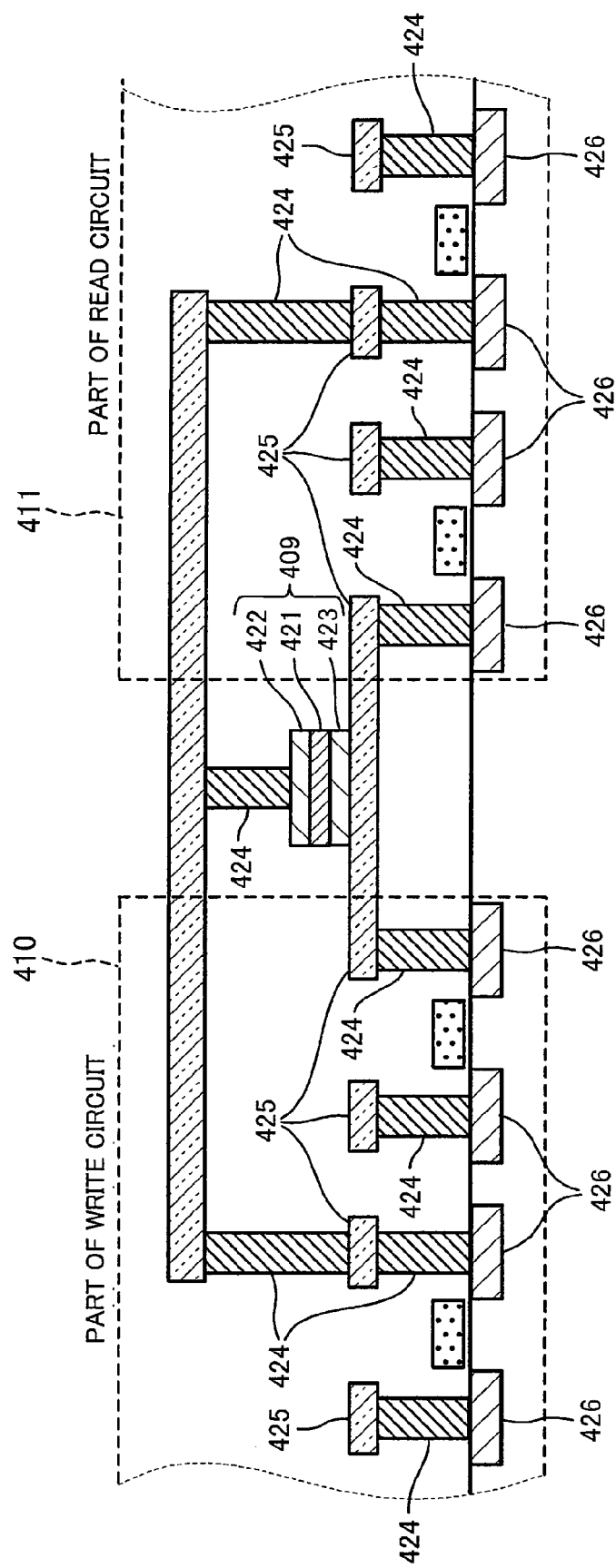
FIG. 39 is a cross-sectional view showing a configuration of the address storage register for redundancy included in the nonvolatile semiconductor device according to Embodiment 7 of the present invention.
Figure 40:
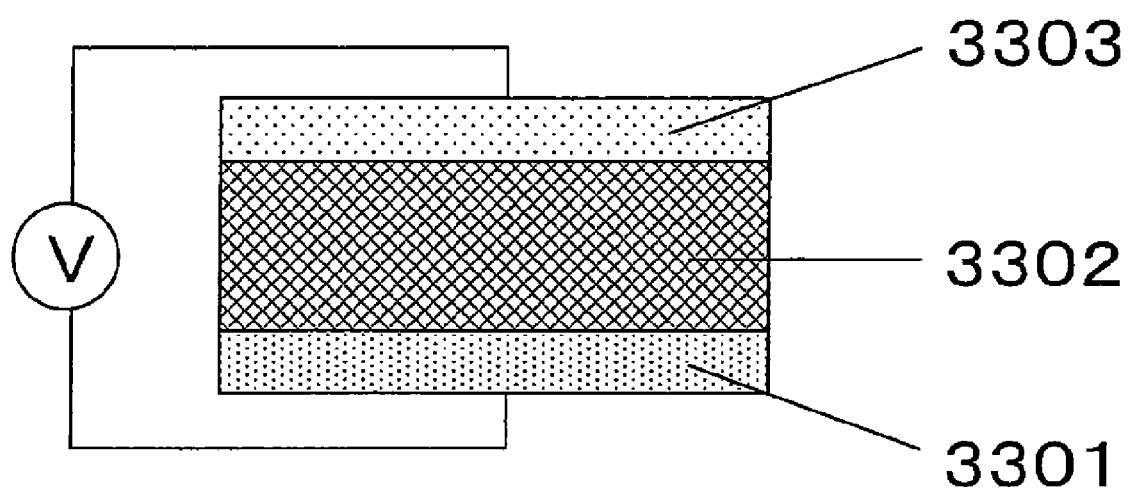
FIG. 40 is a cross-sectional view showing a configuration of a memory element manufactured to confirm instability of resistance changing phenomenon.

FIG. 38 is a block diagram showing a configuration of an address storage register for redundancy included in the nonvolatile semiconductor device according to Embodiment 7 of the present invention. FIG. 39 is a cross-sectional view showing a configuration of the address storage register for redundancy.

As shown in FIGS. 38 and 39, the address storage register for redundancy 408 includes a nonvolatile memory element 409 corresponding to the nonvolatile memory element according to Embodiment 1 To Embodiment 4, a write circuit 410 for writing specific address data to the nonvolatile memory element 409, a read circuit 411 for reading the address data written in the nonvolatile memory element 409, and a latch circuit 412.

The nonvolatile memory element 409 is connected to a switch section to the write circuit 410 side and a switch section to the read circuit 411 side, and has a structure in which a resistance variable layer 421 is sandwiched between an upper electrode 422 and a lower electrode 423. The nonvolatile memory element 409 corresponds to the nonvolatile memory element according to Embodiment 1 to Embodiment 4.

In FIG. 39, 424 denotes a plug layer, 425 denotes a metal wire layer, and 426 denotes a source/drain layer.

Whereas in this Embodiment, two-layer wires are provided and the nonvolatile memory element is provided between the first wire and the second wire, multi-layer wires of three or more layers may alternately be provided and the nonvolatile memory element may be disposed between desired wires, for example. In further alternative, the nonvolatile memory element may be disposed between plural wires as desired.

[Example of Operation of Nonvolatile Semiconductor Device]

Subsequently, an example of the operation of the nonvolatile semiconductor device according to this Embodiment configured as described above will be described.

Hereinafter, a case where the address data is written to the address storage register for redundancy 408 will be described. The BIST circuit 406 inspects a memory block in the SRAM 407, upon reception of a diagnosis command signal TST.

The memory block is inspected during inspection in a manufacturing process of LSI, and during various diagnostic processes carried out in the case where the LSI is mounted to an actual system.

If a faulty bit is detected as a result of inspection of the memory block, the BIST circuit 406 outputs write data command signal WD to the address storage register for redundancy 408. Receiving the write data command signal WD, the address storage register for redundancy 408 stores therein address data corresponding to the faulty bit.

The address data is stored by switching the resistance state of the resistance variable layer in the associated register to the high-resistance state or to the low-resistance state, according to the address data. The switching of the resistance variable layer to the high-resistance state or to the low-resistance state is implemented as in Embodiment 1.

In this way, the address data is written to the address storage register for redundancy 408. When the SRAM 407 is accessed, the address data written in the address storage register for redundancy 408 is read simultaneously. The address data is read by detecting an output current value corresponding to the resistance state of the resistance variable layer as in Embodiment 1.

When the address data read from the address storage register for redundancy 408 matches the address data of an access target, backup memory cells for redundancy provided within the SRAM 407 are accessed, so that data is read or written.

The self diagnosis performed as described above eliminates a need for an expensive LSI tester provided externally, in inspection in the manufacturing process. In addition, Embodiment 7 has an advantage that at Speed test can be conducted. Furthermore, Embodiment 7 has an advantage that since faulty bits due to deterioration with time can be relieved as well as faulty bits in the inspection, a high quality can be maintained for a long period of time.

The nonvolatile semiconductor device according to this Embodiment is applicable to a case where data is written only once in the manufacturing process and to a case where data is rewritten repeatedly after shipment of products.

Numeral modifications and alternative embodiments of the present invention will be apparent to those skilled in the art in view of the foregoing description. Accordingly, the description is to be construed as illustrative only, and is provided for the purpose of teaching those skilled in the art the best mode of carrying out the invention. The details of the structure and/or function may be varied substantially without departing from the spirit of the invention.

INDUSTRIAL APPLICABILITY

A nonvolatile memory element and nonvolatile semiconductor device of the present invention are capable of a high-speed operation, have a stable rewrite characteristic, and are useful as a nonvolatile memory element and the like used in various electronic hardware such as digital home appliance, memory cards, cellular phones, and personal computers.

The invention claimed is:

1. A nonvolatile memory element comprising:
a first electrode;
a second electrode; and
a resistance variable layer which is disposed between the first electrode and the second electrode such that the resistance variable layer is in contact with the first electrode and the second electrode, the resistance variable layer having reversibly changeable resistances in response to electric signals with different polarities which are applied between the first electrode and the second electrode;
wherein the resistance variable layer comprises an oxygen-deficient tantalum oxide layer, the first electrode and the second electrode comprise materials which are made of different elements, and a standard electrode potential $V_1$ of the first electrode, a standard electrode potential $V_{Ta}$ of tantalum, and a standard electrode potential $V_2$ of the second electrode satisfy a relationship $V_1 < V_2$ and $V_{Ta} < V_2$.

2. The nonvolatile memory element according to claim 1, wherein $V_1 - V_{Ta}$ which is a difference between the standard electrode potential $V_1$ of the material of the first electrode and the standard electrode potential $V_{Ta}$ of tantalum and $V_2 - V_{Ta}$ which is a difference between the standard electrode potential $V_2$ of the material of the second electrode and the standard electrode potential $V_{Ta}$ of tantalum satisfy a relationship $0 < V_1 - V_{Ta} < V_2 - V_{Ta}$.

3. The nonvolatile memory element according to claim 1, wherein $V_1 - V_{Ta}$ which is a difference between the standard electrode potential $V_1$ of the material of the first electrode and the standard electrode potential $V_{Ta}$ of tantalum and $V_2 - V_{Ta}$ which is a difference between the standard electrode potential $V_2$ of the material of the second electrode and the standard electrode potential $V_{Ta}$ of tantalum satisfy a relationship $V_1 - V_{Ta} \leq 0 < V_2 - V_{Ta}$.

4. The nonvolatile memory element according to claim 1, wherein the first electrode comprises a material selected from a group consisting of W, Ni, Ta, Ti, Al, and Ta nitride, and the second electrode comprises a material selected from a group consisting of Pt, Ir, Pd, Ag and Cu.

5. The nonvolatile memory element according to claim 1, wherein the first electrode comprises a material selected from a group consisting of Ta, Ti, and Al, and the second electrode comprises a material selected from a group consisting of Pt, Ir, Pd, Ag, Cu, W, Ni and Ta nitride.

6. The nonvolatile memory element according to claim 1, wherein when a resistance value occurring when a positive voltage is applied to the second electrode on the basis of the first electrode is expressed as R1 and a resistance value occurring when a negative voltage is applied to the second electrode on the basis of the first electrode is expressed as R2, the resistance value changes reversibly such that R1 and R2 satisfy R1>R2 in a first mode;
wherein when a resistance value occurring when a negative voltage is applied to the second electrode on the basis of the first electrode is expressed as R3 and a resistance value occurring when a positive voltage is applied to the second electrode on the basis of the first electrode is expressed as R4, the resistance value changes reversibly such that R3 and R4 satisfy R3>R4 in a second mode; and
wherein R1/R2 which is a ratio of R1 to R2 and R3/R4 which is a ratio of R3 to R4 satisfy R1/R2>R3/R4.

7. The nonvolatile memory element according to claim 1, wherein when the oxygen-deficient tantalum oxide layer is expressed as $TaO_x$, $0.8 \leq x \leq 1.9$ is satisfied.

8. The nonvolatile memory element according to claim 1, wherein the oxygen-deficient tantalum oxide layer has, in a thickness direction thereof, a first region containing a first oxygen-deficient tantalum oxide and a second region containing a second oxygen-deficient tantalum oxide which is higher in oxygen content than the first oxygen-deficient tantalum oxide.

9. The nonvolatile memory element according to claim 8, wherein the oxygen-deficient tantalum oxide layer includes at least a first oxygen-deficient tantalum oxide layer which is the first region and a second oxygen-deficient tantalum oxide layer which is the second region such that the first oxygen-deficient tantalum oxide layer and the second oxygen-deficient tantalum oxide layer are stacked together.

10. The nonvolatile memory element according to claim 9, wherein the second oxygen-deficient tantalum oxide layer has a layer thickness which is not less than 1 nm and not more than 8 nm.

11. The nonvolatile memory element according to claim 8, wherein the second electrode comprises a material having a standard electrode potential higher than the standard electrode potential of tantalum and a standard electrode potential of a material forming the first electrode, and the second region is positioned between the first region and the second electrode.

12. The nonvolatile memory element according to claim 8, wherein when the first oxygen-deficient tantalum oxide is expressed as $TaO_x$, $0.8 \leq x \leq 1.9$ is satisfied.

13. The nonvolatile memory element according to claim 8, wherein when the second oxygen-deficient tantalum oxide is expressed as $TaO_y$, $2.1 \leq y < 2.5$ is satisfied.

14. The nonvolatile memory element according to claim 1, wherein the oxygen-deficient tantalum oxide layer is in contact with the second electrode.

15. A nonvolatile semiconductor device comprising:
a semiconductor substrate; and
a memory array including plural first electrode wires provided on the semiconductor substrate to extend in parallel with each other; plural second electrode wires provided above the plural first electrode wires to extend in parallel with each other within a plane parallel to a main surface of the semiconductor substrate and to three-dimensionally cross the plural first electrode wires; and nonvolatile memory elements which are provided to respectively correspond to three-dimensional cross points between the plural first electrode wires and the plural second electrode wires;

wherein each of the nonvolatile memory elements includes a resistance variable layer disposed between a first electrode which is the first electrode wire and a second electrode which is the second electrode wire, a resistance value of the resistance variable layer being changeable reversibly in response to a voltage between the first electrode and the second electrode; and wherein the resistance variable layer comprises an oxygen-deficient tantalum oxide layer, the first electrode and the second electrode comprise materials which are made of different elements, and a standard electrode potential $V_1$ of the first electrode, a standard electrode potential $V_{Ta}$ of tantalum, and a standard electrode potential $V_2$ of the second electrode satisfy a relationship $V_1 < V_2$ and $V_{Ta} < V_2$.

16. The nonvolatile semiconductor device according to claim 15, wherein each of the nonvolatile memory elements includes a current controlling element between the first electrode and the second electrode;

and wherein the current controlling element is electrically connected to the resistance variable layer.

17. The nonvolatile semiconductor device according to claim 15, comprising a multi-layer memory array in which plural layers of the memory array are stacked together.

18. A nonvolatile semiconductor device comprising:
a semiconductor substrate;
a logic circuit provided on the semiconductor substrate, for executing predetermined calculation; and
a nonvolatile memory element provided on the semiconductor substrate and having a programming function;

wherein the nonvolatile memory element includes a first electrode, a second electrode, and a resistance variable layer disposed between the first electrode and the second electrode, a resistance value of the resistance variable layer being changeable reversibly in response to a voltage between the first electrode and the second electrode; and wherein the resistance variable layer comprises an oxygen-deficient tantalum oxide layer, the first electrode and the second electrode comprise materials which are made of different elements, and a standard electrode potential $V_1$ of the first electrode, a standard electrode potential $V_{Ta}$ of tantalum, and a standard electrode potential $V_2$ of the second electrode satisfy a relationship $V_1 < V_2$ and $V_{Ta} < V_2$.

19. The nonvolatile memory element according to claim 15, wherein $V_1 - V_{Ta}$ which is a difference between a standard electrode potential $V_1$ of the material of the first electrode and a standard electrode potential $V_{Ta}$ of tantalum and $V_2 - V_{Ta}$ which is a difference between a standard electrode potential $V_2$ of the material of the second electrode and the standard electrode potential $V_{Ta}$ of tantalum satisfy a relationship $$0 < V_1 - V_{Ta} < V_2 - V_{Ta}.$$

20. The nonvolatile memory element according to claim 15, wherein $V_1 - V_{Ta}$ which is a difference between a standard electrode potential $V_1$ of the material of the first electrode and a standard electrode potential $V_{Ta}$ of tantalum and $V_2 - V_{Ta}$ which is a difference between a standard electrode potential $V_2$ of the material of the second electrode and the standard electrode potential $V_{Ta}$ of tantalum satisfy a relationship $$V_1 \leq V_{Ta} \leq 0 < V_2 - V_{Ta}.$$

21. A nonvolatile semiconductor device comprising:
a semiconductor substrate; and
a memory array including plural first electrode wires provided on the semiconductor substrate to extend in parallel with each other; plural second electrode wires provided above the plural first electrode wires to extend in parallel with each other within a plane parallel to a main surface of the semiconductor substrate and to three-dimensionally cross the plural first electrode wires; and nonvolatile memory elements which are provided to respectively correspond to three-dimensional cross points between the plural first electrode wires and the plural second electrode wires;

wherein each of the nonvolatile memory elements includes a first electrode connected to the first electrode wire, a second electrode connected to the second electrode wire, and a resistance variable layer disposed between the first electrode and the second electrode, a resistance value of the resistance variable layer being changeable reversibly in response to a voltage between the first electrode and the second electrode; and wherein the resistance variable layer comprises an oxygen-deficient tantalum oxide layer, the first electrode and the second electrode comprise materials which are made of different elements, and a standard electrode potential $V_1$ of the first electrode, a standard electrode potential $V_{Ta}$ of tantalum, and a standard electrode potential $V_2$ of the second electrode satisfy a relationship $V_1 < V_2$ and $V_{Ta} < V_2$.

22. The nonvolatile semiconductor device according to claim 21, wherein each of the nonvolatile memory elements includes a current controlling element between the first electrode and the second electrode;

and wherein the current controlling element is electrically connected to the resistance variable layer.

23. The nonvolatile semiconductor device according to claim 21, comprising a multi-layer memory array in which plural layers of the memory array are stacked together.

24. The nonvolatile memory element according to claim 21, wherein $V_1 - V_{Ta}$ which is a difference between a standard electrode potential $V_1$ of the material of the first electrode and a standard electrode potential $V_{Ta}$ of tantalum and $V_2 - V_{Ta}$ which is a difference between a standard electrode potential $V_2$ of the material of the second electrode and the standard electrode potential $V_{Ta}$ of tantalum satisfy a relationship $0 < V_1 - V_{Ta} < V_2 - V_{Ta}$.

25. The nonvolatile memory element according to claim 21, wherein $V_1 - V_{Ta}$ which is a difference between a standard electrode potential $V_1$ of the material of the first electrode and a standard electrode potential $V_{Ta}$ of tantalum and $V_2 - V_{Ta}$ which is a difference between a standard electrode potential $V_2$ of the material of the second electrode and the standard electrode potential $V_{Ta}$ of tantalum satisfy a relationship $V_1 - V_{Ta} \leq 0 < V_2 - V_{Ta}$.

26. A nonvolatile semiconductor device comprising:
a semiconductor substrate;
plural word lines and plural bit lines which are provided on the semiconductor substrate such that the plural word lines and the plural bit lines cross each other;
plural transistors provided to respectively correspond to cross points between the plural word lines and the plural bit lines; and
plural nonvolatile memory elements provided to respectively correspond to the plural transistors;
wherein each of the nonvolatile memory elements includes a first electrode, a second electrode, and a resistance variable layer disposed between the first electrode and the second electrode, a resistance value of the resistance variable layer being changeable reversibly in response to electric signals applied between the first electrode and the second electrode via an associated transistor;

and wherein the resistance variable layer comprises an oxygen-deficient tantalum oxide layer, the first electrode and the second electrode comprise materials which are made of different elements, and a standard electrode potential $V_1$ of the first electrode, a standard electrode potential $V_{Ta}$ of tantalum, and a standard electrode potential $V_2$ of the second electrode satisfy a relationship $V_1 < V_2$ and $V_{Ta} < V_2$.

27. The nonvolatile memory element according to claim 26, wherein $V_1 - V_{Ta}$ which is a difference between a standard electrode potential $V_1$ of the material of the first electrode and a standard electrode potential $V_{Ta}$ of tantalum and $V_2 - V_{Ta}$ which is a difference between a standard electrode potential $V_2$ of the material of the second electrode and the standard electrode potential $V_{Ta}$ of tantalum satisfy a relationship $0 < V_1 - V_{Ta} < V_2 - V_{Ta}$.

28. The nonvolatile memory element according to claim 26, wherein $V_1 - V_{Ta}$ which is a difference between a standard electrode potential $V_1$ of the material of the first electrode and a standard electrode potential $V_{Ta}$ of tantalum and $V_2 - V_{Ta}$ which is a difference between a standard electrode potential $V_2$ of the material of the second electrode and the standard electrode potential $V_{Ta}$ of tantalum satisfy a relationship $V_1 - V_{Ta} \leq 0 < V_2 - V_{Ta}$.

29. The nonvolatile semiconductor device according to claim 18, further comprising the nonvolatile semiconductor device according to claim 15.

30. The nonvolatile semiconductor device according to claim 29, further comprising the nonvolatile semiconductor device according to claim 21.

31. The nonvolatile semiconductor device according to claim 29, further comprising the nonvolatile semiconductor device according to claim 26.

32. The nonvolatile memory element according to claim 29, wherein $V_1 - V_{Ta}$ which is a difference between a standard electrode potential $V_1$ of the material of the first electrode and a standard electrode potential $V_{Ta}$ of tantalum and $V_2 - V_{Ta}$ which is a difference between a standard electrode potential $V_2$ of the material of the second electrode and the standard electrode potential $V_{Ta}$ of tantalum satisfy a relationship $0 < V_1 - V_{Ta} < V_2 - V_{Ta}$.

33. The nonvolatile memory element according to claim 29, wherein $V_1 - V_{Ta}$ which is a difference between a standard electrode potential $V_1$ of the material of the first electrode and a standard electrode potential $V_{Ta}$ of tantalum and $V_2 - V_{Ta}$ which is a difference between a standard electrode potential $V_2$ of the material of the second electrode and the standard electrode potential $V_{Ta}$ of tantalum satisfy a relationship $V_1 - V_{Ta} \leq 0 < V_2 - V_{Ta}$.

* * * * *

UNITED STATES PATENT AND TRADEMARK OFFICE
CERTIFICATE OF CORRECTION

PATENT NO. : 8,338,816 B2
APPLICATION NO. : 12/682676
DATED : December 25, 2012
INVENTOR(S) : Yoshihiko Kanzawa et al.

Page 1 of 1

It is certified that error appears in the above-identified patent and that said Letters Patent is hereby corrected as shown below:

In the Claims:

In Claim 30, Column 46, line 5, delete "claim 29" and substitute with -- claim 18 --

In Claim 31, Column 46, line 8, delete "claim 29" and substitute with -- claim 18 --

In Claim 32, Column 46, line 11, delete "claim 29" and substitute with -- claim 18 --

In Claim 33, Column 46, line 19, delete "claim 29" and substitute with -- claim 18 --

Signed and Sealed this
First Day of October, 2013

Teresa Stanek Rea
*Deputy Director of the United States Patent and Trademark Office*